(12) United States Patent
Maenishi et al.

(10) Patent No.: US 8,315,728 B2
(45) Date of Patent: Nov. 20, 2012

(54) COMPONENT MOUNTING CONDITION DETERMINATION METHOD

(75) Inventors: Yasuhiro Maenishi, Halstenbek (DE); Yoshiaki Awata, Fukuoka (JP)

(73) Assignee: Panasonic Corporation, Osaka (JP)

( * ) Notice: Subject to any disclaimer, the term of this patent is extended or adjusted under 35 U.S.C. 154(b) by 354 days.

(21) Appl. No.: 12/740,052

(22) PCT Filed: Jan. 21, 2009

(86) PCT No.: PCT/JP2009/000201
§ 371 (c)(1),
(2), (4) Date: Apr. 27, 2010

(87) PCT Pub. No.: WO2009/093446
PCT Pub. Date: Jul. 30, 2009

(65) Prior Publication Data
US 2010/0249971 A1    Sep. 30, 2010

(30) Foreign Application Priority Data

Jan. 23, 2008  (JP) .................... 2008-012899
Feb. 15, 2008  (JP) .................... 2008-035196
Feb. 25, 2008  (JP) .................... 2008-043245

(51) Int. Cl.
*G06F 19/00* (2011.01)
(52) U.S. Cl. .................... 700/102; 700/100; 700/117
(58) Field of Classification Search .................... 700/99, 700/100, 102, 117
See application file for complete search history.

(56) References Cited

U.S. PATENT DOCUMENTS

| 5,317,802 A | 6/1994 | Jyoko | 29/832 |
| 7,551,974 B2 * | 6/2009 | Wakazono | 700/96 |
| 7,603,193 B2 * | 10/2009 | Maenishi et al. | 700/100 |
| 7,885,718 B2 * | 2/2011 | Yano et al. | 700/65 |
| 2002/0107606 A1 | 8/2002 | Baumbusch et al. | 700/169 |
| 2004/0073322 A1 | 4/2004 | Maenishi et al. | 700/28 |
| 2006/0047353 A1 | 3/2006 | Maenishi et al. | 700/100 |
| 2006/0052893 A1 * | 3/2006 | Yamazaki et al. | 700/100 |
| 2008/0228304 A1 | 9/2008 | Maenishi et al. | 700/108 |

FOREIGN PATENT DOCUMENTS

| EP | 1 704 451 | 9/2006 |
| JP | 6-21690 | 1/1994 |
| JP | 7-60579 | 3/1995 |
| JP | 10-209697 | 8/1998 |
| JP | 2002-50900 | 2/2002 |

(Continued)

OTHER PUBLICATIONS

International Search Report issued Jun. 3, 2009 in International (PCT) Application No. PCT/JP2009/000201.

(Continued)

*Primary Examiner* — Ryan Jarrett
(74) *Attorney, Agent, or Firm* — Wenderoth, Lind & Ponack, L.L.P.

(57) ABSTRACT

Provided is a component mounting condition determination method of a component mounter (200) that can improve a throughput of a whole production line. The method determines a mounting condition of the component mounter (200) that mounts components on boards, for use in a production line including the component mounter (200) including transportation lanes aligned parallel to each other. The method includes determining the mounting condition so that a line tact ratio among the transportation lanes approximates a predetermined ratio (S204 to S210).

13 Claims, 25 Drawing Sheets

FOREIGN PATENT DOCUMENTS

| | | |
|---|---|---|
| JP | 2004-39818 | 2/2004 |
| JP | 2004-63940 | 2/2004 |
| JP | 2008-28262 | 2/2008 |
| JP | 2008-263138 | 10/2008 |
| WO | 2009/060705 | 5/2009 |

OTHER PUBLICATIONS

Written Opinion of the International Searching Authority issued Jun. 3, 2009 in International (PCT) Application No. PCT/JP2009/000201.

Ammons J.C. et al., "*Component allocation to balance workload in printed circuit card assembly systems*", IIE Transactions (Institute of Industrial Engineers) Apr. 1997 Chapman & Hall Ltd, vol. 29, No. 4, Apr. 1997, pp. 265-275, XP002523700 abstract figure 1 p. 265-p. 273.

Cheng T.C.E., et al., "*State-of-the-art review of parallel-machine scheduling research*", European Journal of Operational Research, [online] vol. 47, No. 3, Aug. 15, 1990, pp. 271-292, XP002523722 p. 271-p. 274 p. 276, col. 2—p. 289, col. 1.

Yu L. et al., "*Scheduling of unrelated parallel machines: An application to PWB manufacturing*", IIE Transactions, vol. 34, No. 11, Nov. 2002, pp. 921-931, XP002523721 p. 921-p. 927.

\* cited by examiner

Mounting points pi = (component type ci, X-coordinate xi, Y-coordinate yi, control data $\phi$i, mounting angle $\theta$i)

Fig. 7

| Component name | (Component external view) | Component size (mm) | | | Two-dimensional recognition method | Suction nozzle | Tact (seconds) | Accelation ratio |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | | | |
| 6TR | | 4.3 | 4.5 | 1.5 | | | | |
| 1TIP | | 2.0 | φ1.0 | - | | Cylindrical chip | 0.11 | |
| 2TIP | | 3.6 | φ1.4 | - | | | | |
| 1CAP | | 3.8 | 1.9 | 1.6 | Reflection | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | M | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

| Transportation lane | Board type | Lane count | Target tact | Target production time |
|---|---|---|---|---|
| R | A | 1 | 100s | A:100s |
| M | B | 2 | 200s | B:100s |
| F | B | 2 | 200s | |

Fig. 16

| Transportation lane | Board type | Lane count | First target tact | Ratio | Second target tact | Target production time |
|---|---|---|---|---|---|---|
| R | A | 1 | 100s | 1 | 90s | A:100s |
| M | B | 2 | 200s | 2 | 180s | B:100s |
| F | B | 2 | 200s | 2 | 180s | |

117c

| Workload information | | | |
|---|---|---|---|
| Board type | Count of mounting points | Production tact (sec) | ...... |
| A(1) | 760 | 28.1 | ...... |
| A(2) | 1044 | 32.5 | ...... |
| B | 1208 | 33.8 | ...... |
| C | 920 | 27.2 | ...... |
| ...... | ...... | ...... | ...... |

COMPONENT MOUNTING CONDITION DETERMINATION METHOD

TECHNICAL FIELD

The present invention relates to a component mounting condition determination method for use in a component mounter which mounts components on boards, in particular to a component mounting condition determination method for use in a production line including component mounters each including transportation lanes which are aligned parallel to each other and through which the boards are transported.

BACKGROUND ART

In component mounters that mount components on a board, a component mounting condition determination method is optimized for mounting components for a shorter tact. Here, the tact refers to a period of time necessary for mounting predetermined components per board.

Conventionally, methods for minimizing a tact for each component mounter have been suggested as such component mounting condition determination method (see Patent Citation 1). When the tact for each component mounter can be the shortest, a throughput (the count of component-mounted boards per unit time) obtained by each component mounter can be maximized.

Furthermore, when the production line includes component mounters, component mounting condition determination methods for minimizing the line tact of the production line by striking a balance between tacts of the component mounters have been suggested (see Patent Citation 2). Here, the line tact refers to the longest tact among tacts of component mounters included in the production line. In other words, the line tact refers to a time necessary for producing one board in the production line.

As such, when the line tact of the production line can be the shortest, a throughput of the production line can be maximized. In this method, each component mounter includes only one transportation lane through which a board is transported. This method aims at a production line in which boards are sequentially transported one by one through one transportation lane and components are mounted on the boards.

Patent Citation 1: Japanese Unexamined Patent Application Publication No. 2002-50900
Patent Citation 2: Japanese Unexamined Patent Application Publication No. 10-209697

DISCLOSURE OF INVENTION

Technical Problem

However, there is a problem that the throughput in a whole production line cannot be maximized in the aforementioned method, in the case where each component mounter includes transportation lanes. The following describes the reasons.

Some component mounters include transportation lanes that are aligned parallel to each other. Such component mounters transport boards for each transportation lane, and mount components on each board. In other words, using the component mounters including such transportation lanes, a throughput per unit area can be improved, compared to a component mounter including only one transportation lane.

Such component mounters set a line tact and a throughput for mounting components on a board for each transportation lane. Here, in the component mounting condition determination method, the line tact for each transportation lane can be minimized. However, when each component mounter includes transportation lanes each having a different line tact, a count of boards to be produced in each transportation lane becomes different.

For example, when components are mounted on both sides of a board, first, components are mounted on a front side of the board on the first transportation lane, and then, components are mounted on a back side of the board on the second transportation lane. When the first and second transportation lanes have the same line tact, throughputs of these transportation lanes are identical.

However, when the first and second transportation lanes have different line tacts, the throughputs of the transportation lanes are different, and the count of boards to be produced in each of the transportation lanes becomes different. In other words, when the first transportation lane has a line tact shorter than the line tact of the second transportation lane, the first transportation lane produces the larger throughput and the larger count of boards than those of the second transportation lane.

Thus, as a result of this case, the count of boards each having components mounted on the front side becomes larger than the count of boards each having components mounted on the back side. Thereby, the intermediate inventory of the boards will increase due to increase in the boards having components mounted only on the front side. In other words, the count of boards having components mounted on both sides is equivalent to the count of boards to be produced through the second transportation lane. As such, even when the larger count of boards is produced through the first transportation lane, the count of boards to be produced in a whole production line is consequently the same as the count of boards to be produced through the second transportation lane.

As such, even when the first transportation lane has a line tact shorter than that of the second transportation lane, the line tact of the whole production line becomes consequently the same as that of the second transportation lane. Furthermore, even when the first transportation lane has a throughput larger than that of the second transportation lane, the throughput of the whole production line becomes consequently the same as that of the second transportation lane.

Thereby, there is a problem that the aforementioned component mounting condition determination method cannot maximize the throughput of the whole production line.

Technical Solution

Thus, the present invention has been conceived in view of such problem, and has an object of providing a component mounting condition determination method for improving the throughput to be the largest in the whole production line where each component mounter includes transportation lanes.

In order to achieve the aforementioned object, the component mounting condition determination method according to the present invention is a method for determining a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, the method including determining the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board.

Thereby, the throughput of the whole component mounting system can be improved by determining a mounting condition that approximates for each transportation lane a line tact at a line tact ratio to be set so that the throughput of the whole production line can be maximized. For example, when components are mounted on both sides of the boards, the intermediate inventory of boards occurring when components are mounted on only one side of the boards will not increase by setting a line tact ratio so that the components are mounted on boards of both sides having the identical count.

Furthermore, the line tact of each transportation lane can approximate the target tact without controlling: the timing when boards are charged into the component mounters while mounting components on a board; and the count of boards to be changed into the component mounters. Thereby, the throughput of the whole production line can be improved.

Furthermore, the determining the mounting condition preferably includes determining a configuration of the component mounter that intends to mount the components on the boards so that the line tact ratio approximates the predetermined ratio. Thus, the throughput of the whole component mounting system can be improved by determining the configuration of the component mounter such that a line tact of each transportation lane approximates a ratio to be set so that the throughput of the whole production line can be maximized.

Furthermore, the determining the configuration preferably includes determining a count of component mounters including the component mounter for each of the transportation lanes so that the line tact ratio approximates the predetermined ratio. Thereby, the throughput of the whole component mounting system can be improved by determining the count of component mounters such that a line tact of each transportation lane approximates a ratio to be set so that the throughput of the whole production line can be maximized.

Furthermore, the method for determining a mounting condition includes obtaining a target tact for each of the transportation lanes, the target tact being a target value of each of the line tacts of the transportation lanes and being determined according to the predetermined ratio, wherein the determining the count of the component mounters includes determining for each of the transportation lanes the count of the component mounters so that each of the line tacts approximates a corresponding one of the target tacts obtained in the obtaining the target tact.

Thereby, the throughput of the whole component mounting system can be improved by approximating a line tact of each transportation lane to a target tact to be set so that the throughput of the whole production line can be maximized.

Furthermore, the determining the count of the component mounters preferably includes determining the count of the component mounters for each of the transportation lanes by adding 1 to a predetermined initial count of the component mounters or subtracting 1 from the predetermined initial count of the component mounters.

Thereby, the count of component mounters can be determined such that the throughput of the whole production line can be maximized, and the throughput of the whole production line can be improved.

Furthermore, the method for determining a mounting condition further includes: calculating each of the line tacts according to the count of the component mounters determined in the determining the count of the component mounters; and determining a count of suction nozzles included in a mounting head of the component mounter by incrementing or decrementing a predetermined initial count of the suction nozzles so that each of the line tacts calculated in the calculating each of the line tacts approximates a corresponding one of the target tacts obtained in the obtaining the target tact.

Thereby, the count of suction nozzles of mounting heads included in the component mounter can be determined such that the throughput of the whole production line can be maximized, and the throughput of the whole production line can be improved.

Furthermore, the production line may include component mounters including the component mounter, the determining the mounting condition may include determining a configuration of the component mounters that intend to mount the components on the boards so that each line tact ratio among transportation lanes included in each of the component mounters approximates the predetermined ratio, the transportation lanes being connected through the component mounters so as to transport an identical type of boards, and the method may include determining allocation of components to be mounted by each of the component mounters, for each of the transportation lanes under the configuration that is determined in the determining the configuration so that a mounting time of each of the component mounters approximates an identical value in each of the transportation lanes.

Thereby, for each transportation lane, the line tact can approximate a line tact ratio to be set so that the throughput of the whole production line can be maximized while reducing the line tact by determining the configuration of the component mounters and allocation of the components. Thus, the throughput of the whole production line can be improved to be maximized. For example, when components are mounted on both sides of the boards, the intermediate inventory of boards occurring when components are mounted on only one side of the boards will not increase by setting a line tact ratio so that the components are mounted on boards of both sides having the identical count.

Furthermore, for each transportation lane, the line tact can approximate the line tact ratio without controlling: the timing when boards are charged into the component mounters while mounting components on boards; and the count of boards to be changed into the component mounters. Thereby, the throughput of the whole production line can be improved.

Furthermore, the method for determining a mounting condition may include obtaining a target tact for each of the transportation lanes, the target tact being a target value of each of the line tacts of the transportation lanes and being determined according to the predetermined ratio, wherein the determining the mounting condition may include determining a count of the component mounters for each of the transportation lanes so that each of the line tacts approximates a corresponding one of first target tacts that are the target tacts initially obtained in the obtaining the target tact, and the determining the allocation of the components may include: calculating a mounting time necessary for mounting the predetermined components per board by each of the component mounters for each of the transportation lanes, the component mounters having the count determined in the determining the count and including a first component mounter and a second component mounter; judging whether or not a difference between the calculated mounting time of the first component mounter and the calculated mounting time of the second component mounter is equal to or larger than a first threshold for each of the transportation lanes, each of the mounting times being calculated in the calculating the mounting time, and the calculated mounting time of the first component mounter being larger than the calculated mounting time of the second component mounter; and reallocating a part of the predetermined components from the first component mounter to the second component mounter for each of the transportation lanes as a condition for calculating each of the mounting times when the difference is judged to be equal to or larger than the first threshold in the judging.

Thereby, the count of component mounters can be determined such that the line tact approximates for each transportation lane the first target tact to be set so that the throughput of the whole production line can be maximized. Furthermore, the line tact for each transportation lane can be reduced. Thus, the throughput of the whole production line can be improved.

Furthermore, the obtaining the target tact may includes: calculating, for each of the transportation lanes, a changed line tact calculated when the part of the components are reallocated in the reallocating; and calculating a second target tact for each of the transportation lanes by: (i) setting one of the second target tacts of one of the transportation lanes having the changed line tacts, to a value of a corresponding one of the changed line tacts; and (ii) setting a ratio among the second target tacts to a ratio among the first target tacts, and the determining the mounting condition may further include: judging whether or not the changed line tact is equal to or shorter than the second target tact for each of the transportation lanes; and re-determining, for each of the transportation lanes, a count of the component mounters to be changed from the count of the component mounters determined in the determining the count so that each of the line tacts is equal to or shorter than a corresponding one of the second target tacts, when each of the line tacts is judged not to be equal to or shorter than the corresponding one of the second target tacts in the judging.

Thereby, the throughput of the whole production line can be improved by setting the second target tact that is shorter than the first target tact to the target tact.

Furthermore, the transportation lanes may be equal to or larger than 3 in each of the component mounters, and the determining the mounting condition may include: obtaining workload information per board type, the workload information indicating a workload necessary for mounting the components on the boards; comparing the workload information between the board types, the workload information being obtained in the obtaining the workload information; and determining a count of the transportation lanes to be allocated to each board type according to a result of the comparison in the comparing the workload information so that a larger count of the transportation lanes can be allocated to a board type having a higher workload.

As such, when components are mounted on the boards of board types by the component mounter including the equal to or larger than 3 transportation lanes, the larger count of transportation lanes are allocated to the boards of the board type having the higher workload. Thereby, a line tact of each transportation lane can approximate a ratio so that the throughput of the whole production line can be maximized, and the throughput of the whole production line can be improved. For example, when components are mounted on both sides of the boards, the intermediate inventory of boards occurring when components are mounted on only one side of the boards will not increase by allocating the transportation lanes so that the components are mounted on boards of both sides having the identical count.

Furthermore, the line tact of each transportation lane can approximate the ratio without controlling: the timing when boards are charged into the component mounters while mounting components on boards; and the count of boards to be changed into the component mounters. Thereby, the throughput of the whole production line can be improved.

Furthermore, the workload information may include information indicating a count of mounting points that is a count of the components to be mounted per board, for each of the board types, the comparing includes comparing the count of mounting points per board between the board types, and the determining the count of the transportation lanes may include determining the count of the transportation lanes to be allocated to each of the board types according to a result of the comparison in the comparing the count of mounting points so that the larger count of the transportation lanes can be allocated to a board type having a larger count of the mounting points that corresponds to the higher workload. Furthermore, the workload information may include information indicating a production tact that is a mounting time necessary for mounting the predetermined components per board, for each of the board types, the comparing may include comparing the production tact between the board types, and the determining the count of the transportation lanes may include determining the count of the transportation lanes to be allocated to each of the board types according to a result of the comparison in the comparing the production tact so that a larger count of the transportation lanes can be allocated to a board type having a longer production tact that corresponds to the higher workload.

As such, information indicating the count of mounting points and the production tact can be used as workload information. Furthermore, in many cases, these information exist already as data for mounting components. In such case, the existing data can be effectively used.

Furthermore, the count of transportation lanes to be allocated to each board type can be determined with combination of workload information of board types, such as the count of mounting points and the production tact.

The method for determining a mounting condition may further include determining a combination of board types to be allocated to each of the transportation lanes according to the count of the transportation lanes to be allocated so that: (i) a mounting time necessary for mounting the components on boards of board types each transported through the equal to or larger than 3 transportation lanes; or (ii) a total distance traveled by a mounting head that mounts the components on the boards of board types can be the shortest, the transportation lanes having the count determined in the determining the count.

Thereby, the production tact when components are mounted on boards of the plurality of board types to be transported through the transportation lanes can be the shortest, and thus, the throughput of the whole production line can be improved.

Here, the present invention may be implemented not only as such a component mounting condition determining method but also as a component mounting condition determining apparatus that determines a mounting condition according to the component mounting condition determining method or alternatively as a program and a recording medium on which such program is stored. Furthermore, the present invention can be implemented as a component mounter that determines a mounting condition according to the method and mounts components on a board.

ADVANTAGEOUS EFFECTS

The present invention can provide a component mounting condition determination method for improving the throughput so that the throughput of the whole production line including the component mounters each including transportation lanes can be maximized. Thus, the present invention is highly suitable for practical use.

BRIEF DESCRIPTION OF THE DRAWINGS

FIG. 7 is a diagram showing an example of a component library according to the first and second embodiments.

FIG. 8 shows an example of target tact data according to the first embodiment.

FIG. 16 shows an example of target tact data according to the second embodiment.

EXPLANATION OF REFERENCE

Figure 1:
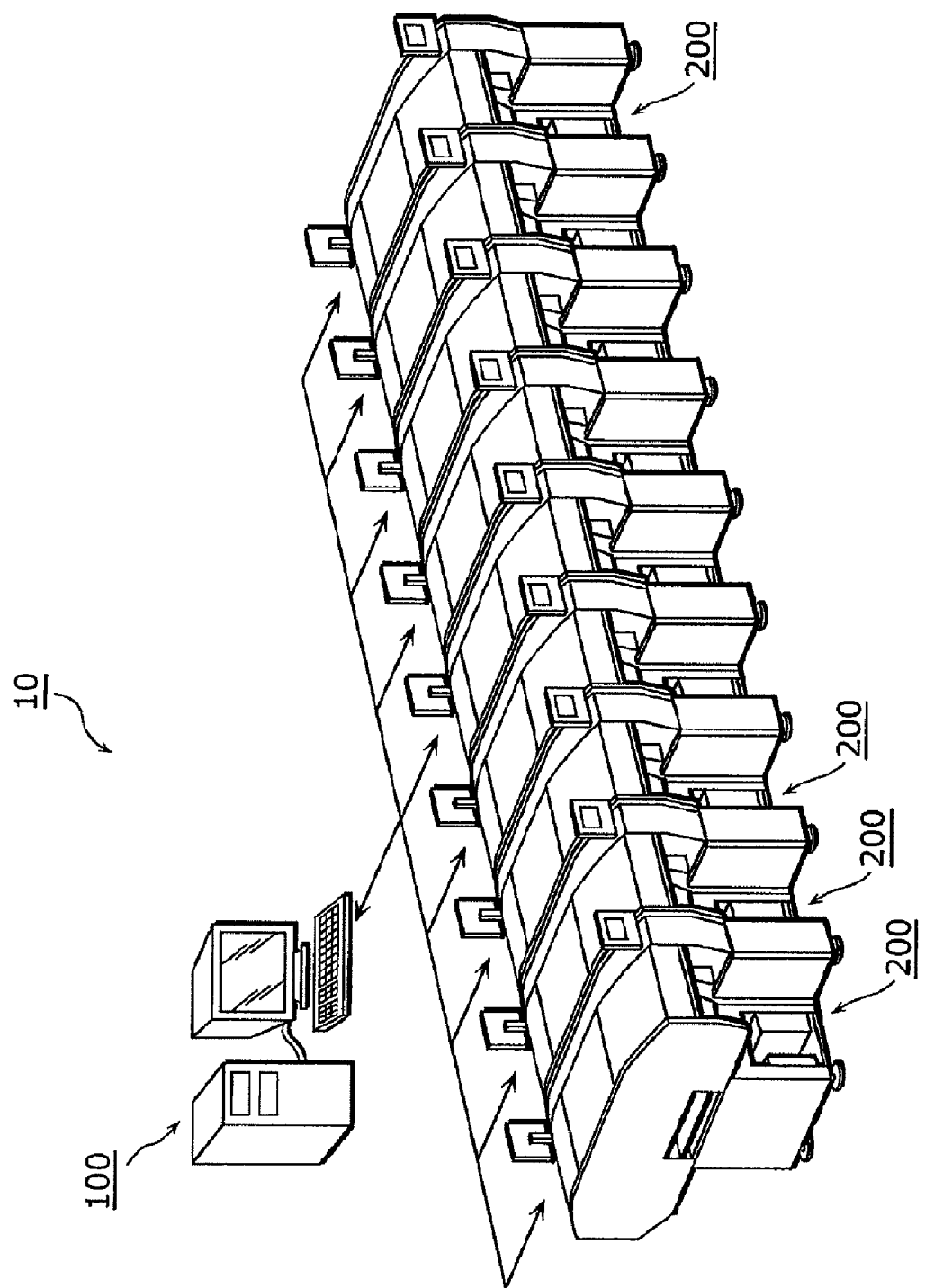
FIG. 1 illustrates a configuration of a component mounting system according to the first and second embodiments of the present invention.

10 Component mounting system
21, 22, 23 Board
100 Mounting condition determination apparatus
101 Arithmetic control unit
102 Display unit
103 Input unit
104 Memory unit
105 Program storing unit
105a Target tact obtaining unit
105b Lane-to-lane balance unit
105c Facility tact balance unit
105d Array condition determining unit
105e Transport condition determining unit
106 Communication UF unit 107 Database unit
107a NC data
107b Component library
107c Target tact data
115 Program storing unit
115a Target tact obtaining unit
115b Lane-to-lane balance unit
115c Facility-to-facility balance unit
117 Database unit
117c Target tact data
200 Component mounter
210a, 210b Mounting unit
211a, 211b Component supply unit
212a, 212b Component feeder
213a, 213b Mounting head
215, 216, 217 Transportation lane
1010 Production line
1100, 1200, 1300 Component mounter
1101 First conveyer
1102 Second conveyer
1103 Third conveyer
1104, 1107 Mounting head
1105, 1108 Beam
1106, 1109 Component supply unit
1120 Mounting condition determination apparatus
1121 Communicating unit
1122 Obtaining unit
1123 Comparing unit
1124 Determining unit
1130 Workload information storage unit
1140 Mechanism controlling unit
1150 Mechanism unit

BEST MODE FOR CARRYING OUT THE INVENTION

First Embodiment

Hereinafter, a first embodiment according to the present invention will be described in details with reference to drawings.

FIG. 1 is an external view of a configuration of a component mounting system 10 that implements a component mounting condition determination method according to the present invention.

The component mounting system 10 is a production line for mounting components on boards so as to produce circuit boards, and includes a mounting condition determination apparatus 100 and component mounters 200 (9 component mounters 200 in an example of FIG. 1).

The mounting condition determination apparatus 100 executes the component mounting condition determination method according to the present invention. This mounting condition determination apparatus 100 determines a mounting condition to improve a throughput of the whole production line.

Each of the component mounters 200 included in the component mounting system 10 mounts components, such as electronic components, under the condition determined by the mounting condition determination apparatus 100.

More specifically, the component mounters 200 mount components while transporting boards from an upstream to a downstream. In other words, the component mounters 200 at the upstream first receive the boards, and mount components on each of the boards. Then, the boards on which the components are mounted are transported to the component mounters 200 at the downstream. As such, the boards are sequentially transported to each of the component mounters 200 and the components are mounted on the boards.

Figure 2:
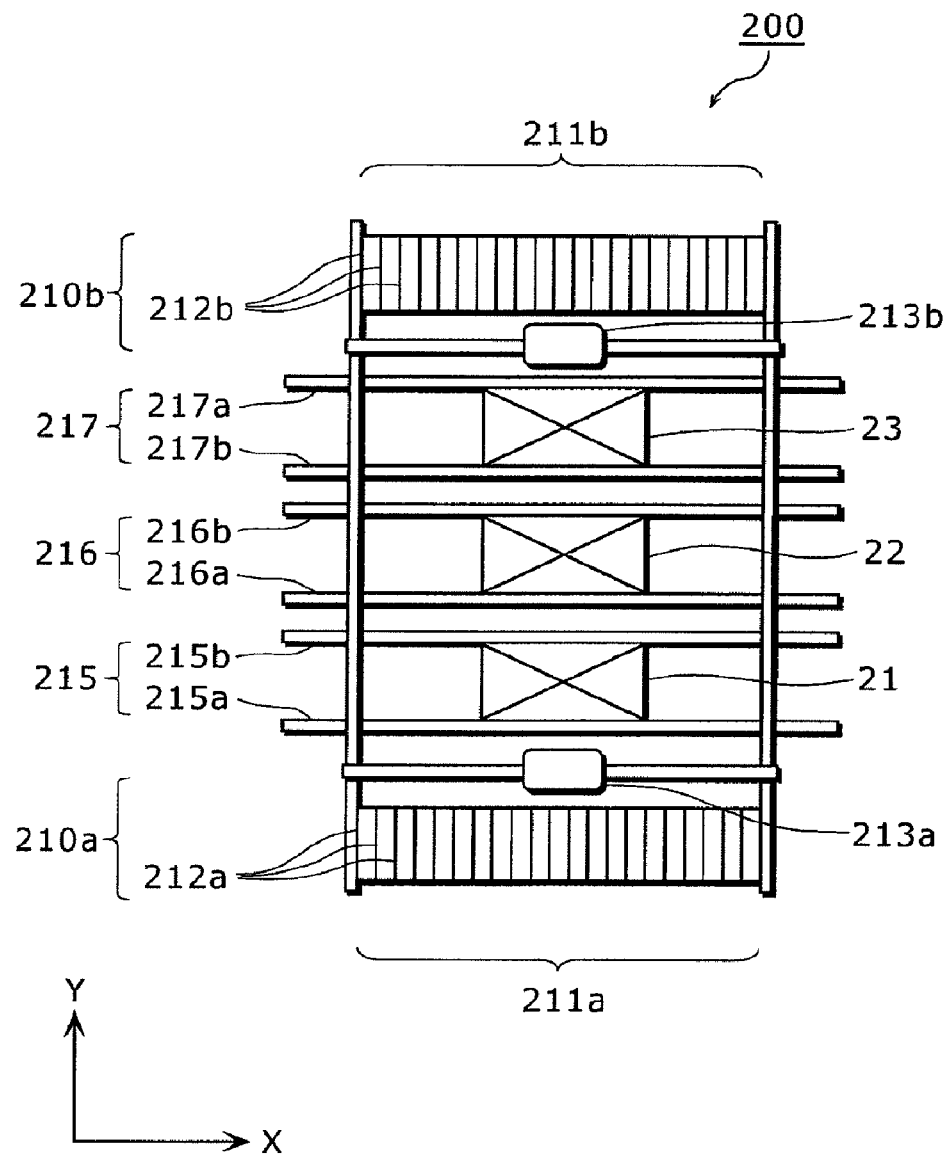
FIG. 2 is a plan view of a component mounter showing a major inner configuration thereof according to the first and second embodiments.

FIG. 2 is a plane view showing main constituent elements included in each of the component mounters 200. Here, the boards are transported in an X-axis direction, and a direction perpendicular to the X-axis direction on a horizontal plane and vertical to the component mounters 200 is defined as a Y-axis direction.

Each of the component mounters 200 includes: transportation lanes 215, 216, and 217 that transport boards 21, 22, and 23, respectively; and mounting units 210a and 210b each mounting components on the boards 21, 22, and 23.

The transportation lane 215 is closer to the mounting unit 210a, the transportation lane 217 is closer to the mounting unit 210b, and the transportation lane 216 is between the transportation lanes 215 and 217. Each of the transportation lanes are placed parallel to the X-axis direction.

The transportation lane 215 includes a fixed rail 215a and a movable rail 215b that are parallel to the X-axis direction. The position of the fixed rail 215a is fixed in advance, whereas the movable rail 215b can be moved in the Y-axis direction, according to the length in the Y-axis direction.

Furthermore, the transportation lane 216 includes a fixed rail 216a and a movable rail 216b as in the transportation lane 215, and the transportation lane 217 includes a fixed rail 217a and a movable rail 217b. The position of the fixed rails 216a and 217a are fixed in advance, whereas the movable rails 216b and 217b can be moved in the Y-axis direction according to the length of the boards 22 and 23 in the Y-axis direction.

Furthermore, the boards 21, 22, and 23 are carried in the transportation lanes 215, 216, and 217, respectively.

The mounting units 210a and 210b mount components on the boards 21, 22, and 23 by working together.

Furthermore, the mounting units 210a and 210b include the same constituent elements. In other words, the mounting unit 210a includes a component supply unit 211a, a mounting head 213a, and a component recognition camera (not illustrated). In the same manner, the mounting unit 210b includes a component supply unit 211b, a mounting head 213b, and a component recognition camera (not illustrated).

Hereinafter, the constituent elements of the mounting unit 210a will be described in details. Since the constituent elements of the mounting unit 210b are the same as those of the mounting unit 210a, the description is omitted.

The component supply unit 211a includes an array of component feeders 212a each storing a component carrier tape. Here, the component carrier tape refers to, for example, a tape (carrier tape) which is supplied with being taken up by a reel and on which components of the same component type are arranged. Furthermore, the components arranged on the component carrier tape are chips, and more specifically, 0402 chip components measuring 4 mm×2 mm, and 1005 chip components measuring 10 mm×5 mm, for example.

The mounting head 213a includes, for example, up to 10 suction nozzles. Each of the suction nozzles can pick up, up to 10 components from the component supply unit 211a, and mounts them on the boards 21, 22, and 23.

The component recognition cameras capture an image of components picked up by the mounting head 213a, and inspects a pickup state of the components two-dimensionally or three-dimensionally.

Figure 3:
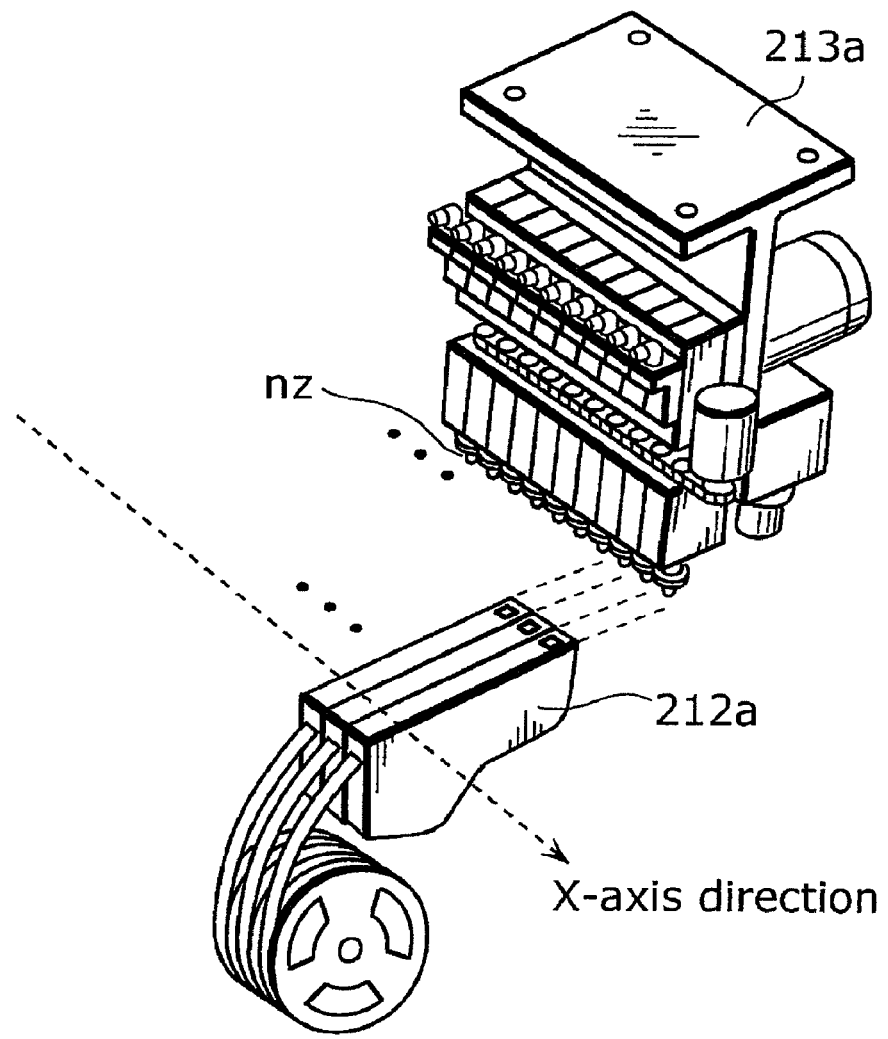
FIG. 3 is a schematic diagram which illustrates a positional relationship between the mounting head and component feeders according to the first and second embodiments.

FIG. 3 is a schematic diagram which illustrates a positional relationship between the mounting head 213a and the component feeders 212a.

As described above, the mounting head 213a may be equipped with, for example, up to 10 suction nozzles nz. The mounting head 213a can pick up, up to 10 components simultaneously from the component feeders 212a (with up-and-down movement of the mounting head 213a at one time).

Figure 4:
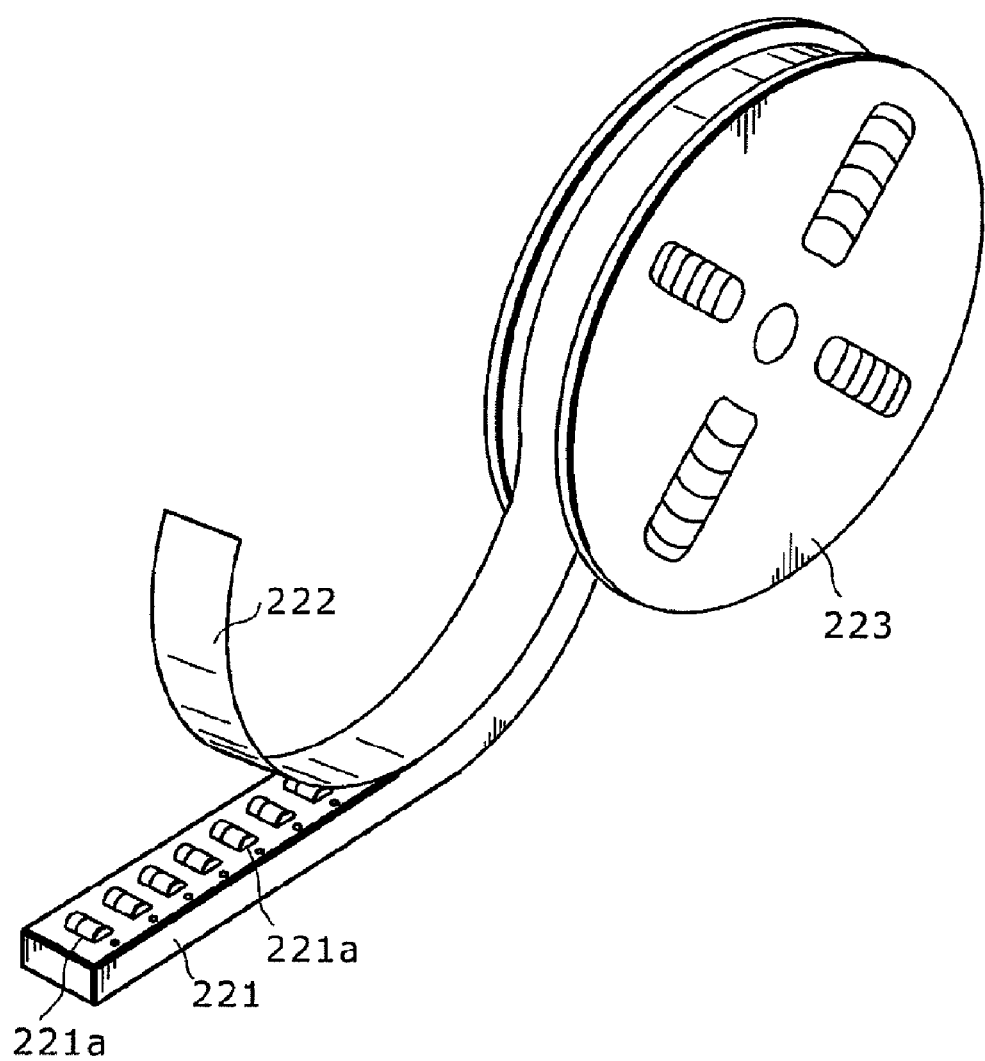
FIG. 4 illustrates an example of a component carrier tape encasing components and a supply reel.

FIG. 4 illustrates an example of a component carrier tape encasing components and a supply reel.

Various electronic components (chips) are encased in depressed parts 221a that are formed at regular intervals in a carrier tape 221 as illustrated in FIG. 4, and the carrier tape 221 with the chips is bonded by a cover tape 222 that is adhesive. The carrier tape 221 including a predetermined count of the electronic components is wound around a supply reel 223 and is supplied to users. Furthermore, a component carrier tape is composed of the carrier tape 221 and the cover tape 222. The component carrier tape may be composed of any constituent element other than those in FIG. 4.

In the mounting unit 210a of the component mounter 200, the mounting head 213a moves to the component supply unit 211a and picks up a component supplied from the component supply unit 211a. Then, the mounting head 213a moves on the component recognition camera at a fixed velocity, and the component recognition camera captures images of all components picked up by the mounting head 213a and precisely detects positions where the components are picked up. Furthermore, the mounting head 213a moves, for example, to the board 21 and mounts all the picked up components on mounting points on the board 21 sequentially. The mounting head 213a in the mounting unit 210a repeatedly performs operations of picking up, moving, and mounting to mount all predetermined components on the board 21. At the same time, the mounting head 213a mounts all of the predetermined components on the boards 22 and 23.

Furthermore, the mounting head 213b in the mounting unit 210b repeatedly performs operations of picking up, moving, and mounting to mount all predetermined components on the boards 21, 22, and 23 as in the mounting unit 210a.

The mounting unit 210a and 210b alternately mount components. That is, while the mounting unit 210a or 210b mounts components, the other mounting unit 210a or 210b picks up the components from the corresponding component supply unit. Conversely, while the mounting unit 210a or 210b picks up components from the corresponding component supply unit, the other mounting unit 210a or 210b mounts components on the boards 21, 22, and 23. In other words, the component mounter 200 is a component mounter including 2 mounting units that alternately mount components on boards.

The two mounting units 210a and 210b mount components only on boards that are set in advance for mounting components thereon. Thus, the boards that are not set in advance for mounting components thereon out of the boards 21, 22, and 23 are transported to the next component mounter without any component mounted on the boards.

The methods for producing boards by the component mounters 200 may be divided into two types of methods, namely, a synchronous mode and an asynchronous mode.

In the synchronous mode, the component mounter 200 starts to mount components when boards are carried in 2 or more lanes. In other words, the component mounter 200 does not start to mount components when the boards are carried in only one of the lanes. In the synchronous mode, 2 mounting heads alternately mount components onto 2 or more boards. The order of mounting components using the 2 mounting heads is determined per unit board composed of 2 or more boards.

In the asynchronous mode, the component mounter 200 starts to mount components when boards are carried in one of lanes. In the asynchronous mode, 2 mounting heads alternately mount components onto one board. In other words, when the board 23 is first carried in the transportation lane 217, the 2 mounting heads work together to mount components on the board 23 of the transportation lane 217. When the board 22 is carried in the transportation lane 216, the 2 mounting heads work together to mount components on the board 22 of the transportation lane 216.

Here, the component mounters 200 may produce the boards in either the synchronous mode or the asynchronous mode.

Figure 5:
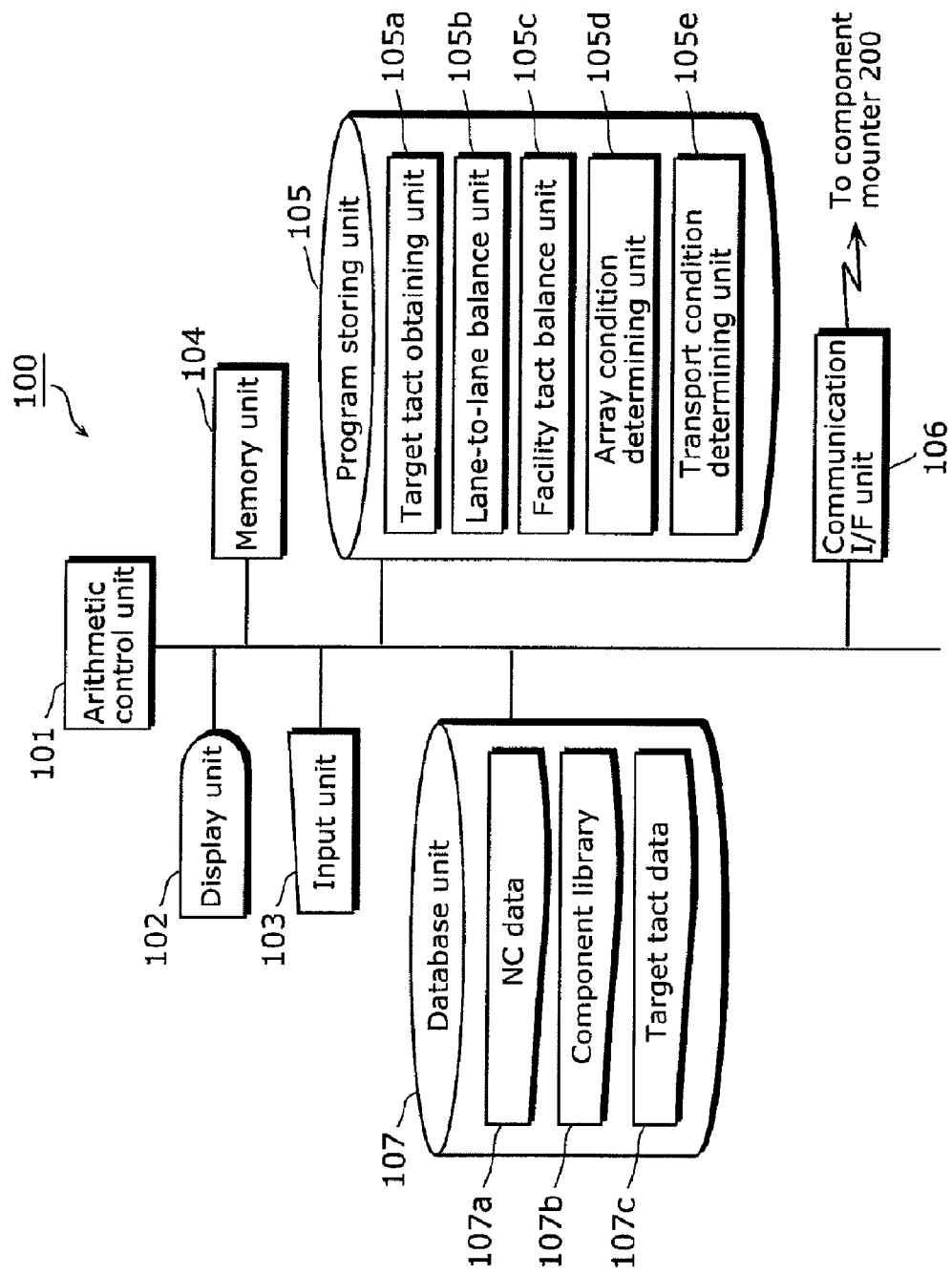
FIG. 5 is a block diagram showing a functional configuration of the component mounting condition determining apparatus according to the first embodiment.

FIG. 5 is a block diagram showing a functional configuration of the component mounting condition determining apparatus 100 according to the first embodiment.

The mounting condition determination apparatus 100 is a computer that performs processing, such as determining a mounting condition so that the throughput of the whole production line can be improved. The mounting condition determination apparatus 100 includes an arithmetic control unit 101, a display unit 102, an input unit 103, a memory unit 104, a program storing unit 105, a communication interface (I/F) unit 106, and a database unit 107.

The component mounting condition determining apparatus 100 is implemented by a general-purpose computer system such as a personal computer that executes a program according to the present invention. Without being connected to the component mounters 200, the component mounting condition determining apparatus 100 also serves as a stand-alone simulator (a tool for determining a component mounting condition). Here, functions of the component mounting condition determining apparatus 100 may be installed in the component mounters 200.

The arithmetic control unit 101 is a Central Processing Unit (CPU) or a numerical processor. In response to an instruction from an operator, the arithmetic control unit 101 loads a necessary program from the program storing unit 105 into the memory unit 104, and executes the program. Then, in accordance with the execution result, the arithmetic control unit 101 controls each of the constituent elements 102 to 107.

The display unit 102 is a Cathode-Ray Tube (CRT) or a Liquid Crystal Display (LCD), and the input unit 103 is a keyboard or a mouse. These units are used for interactive operations between the component mounting condition determining apparatus 100 and the operator under the control of the arithmetic control unit 101.

The communication I/F unit 106 is a Local Area Network (LAN) adapter, and is used for communication between the component mounting condition determining apparatus 100 and the component mounters 200, for example. The memory unit 104 is a Random Access Memory (RAM) that provides a working area for the arithmetic control unit 101.

The program storing unit 105 is a hard disk for storing various programs for implementing the functions of the component mounting condition determining apparatus 100. The program stored by the program storing unit 105 is a program for determining a component mounting condition of the component mounters 200. The program storing unit 105 functionally (as a processing unit that performs the functions when executed by the arithmetic control unit 101) includes a target tact obtaining unit 105a, a lane-to-lane balance unit 105b, a facility tact balance unit 105c, an array condition determining unit 105d, and a transport condition determining unit 105e.

The target tact obtaining unit 105a obtains a target tact that is a target value of a line tact for each transportation lane. Here, the target tact is a target value obtained according to a ratio among predetermined line tacts. Furthermore, "each transportation lane" refers to each transportation lane that transports an identical type of boards. Here, the target tact obtaining unit 105a calculates a target tact, and obtains the target tact by storing, in the database unit 107, the target tact as target tact data 107c to be described later.

The lane-to-lane balance unit 105b determines a mounting condition so that a line tact ratio approximates a predetermined ratio. Here, the mounting condition according to the first embodiment is a configuration of component mounters each mounting components on boards to be transported through a transportation lane, more specifically, the count of component mounters. In other words, the lane-to-lane balance unit 105b determines the count of the component mounters that intend to mount the components on the boards so that the line tact approximates the target tact obtained by the target tact obtaining unit 105a, for each transportation lane. Here, the configuration of component mounters is not limited to the count of component mounters. For example, the configuration of component mounters may include the count of suction nozzles nz of a mounting head included in a component mounter and the count of component feeders that store the identical type of components and that are included in one of the component mounters.

The facility tact balance unit 105c strikes a balance between the component mounters 200 so that each line tact approximates a corresponding one of target tacts. More specifically, the facility tact balance unit 105c balances each line tact of the component mounters 200 by changing the count of the suction nozzles nz of each of the mounting heads included in the component mounters 200 each having a difference between a line tact and the target tact, so that each line tact approximates the target tact. In other words, as the count of the suction nozzles nz is larger, the count of components transported by a mounting head becomes larger, thus reducing the tact. On the other hand, as the count of the suction nozzles nz is smaller, the count of components transported by the mounting head becomes smaller, thus increasing the tact.

The array condition determining unit 105d determines an array of the component mounters 200 so that the component mounter 200 including the larger count of the suction nozzles nz is placed closer to the upstream of the component mounters 200. In other words, the array condition determining unit 105d determines an array of the component mounters 200 depending on: the count of the component mounters 200 determined by the lane-to-lane balance unit 105b and the facility tact balance unit 105c; and the count of the suction nozzles nz included in each of the component mounters 200.

The transport condition determining unit 105e determines a mounting condition so that a board having no component mounted thereon is transported to the next component mounter 200 through a transportation lane.

The database unit 107 is, for example, a hard disk that stores, such as NC data 107a, a component library 107b, and target tact data 107c that are used for determining a component mounting condition by the component mounting condition determining apparatus 100.

Figure 6:
FIG. 6 is a diagram showing an example of NC data according to the first and second embodiments.

FIGS. 6 to 8 show examples of the NC data 107a, the component library 107b, and the target tact data 107c, respectively.

FIG. 6 shows the example of the NC data 107a.

The NC data 107a is a collection of information indicating mounting points for all components to be mounted. One mounting point pi includes a component type ci, an X-coordinate xi, a Y-coordinate yi, control data phi-i, and a mounting angle theta-i. Here, the "component type" corresponds to a component name in the component library 107b shown in FIG. 7. The "X-coordinate" and "Y-coordinate" are coordinates of mounting points (coordinates each indicating a particular position on a board). The "control data" represents constraint information concerning component mounting, such as a type of a usable suction nozzle and a maximum moving velocity of a mounting head. The "mounting angle" is an angle at which a nozzle that picks up a component of the component type ci is to be rotated. Here, the Numeric Control (NC) data to be eventually obtained is a sequence of mounting points that minimize a line tact.

FIG. 7 shows the example of the component library 107b.

The component library 107b is a collection of information unique to each of component types that can be processed by the component mounters 200. As shown in FIG. 7, the component library 107b contains for each component type (component name): a component size; a tact (tact unique to the component type under a particular condition); and other constraint information (such as a type of a usable suction nozzle, a recognition method used by a component recognition camera, and an acceleration ratio of a mounting head). Here, in FIG. 7, external views of components of each component type are also shown as reference. The component library 107 may include information, such as a color and a shape of the components.

FIG. 8 shows the example of the target tact data 107c.

The target tact data 107c is a collection of information for calculating a target tact for each transportation lane. The target tact data 107c includes "transportation lane", "board type", "lane count", "target tact", and "target production time".

The "transportation lane" is a transportation lane that is an object for calculating a target tact. More specifically, the transportation lanes identify a name of each of the transportation lanes 215, 216, and 217. Here, the names identified are, for example, an F lane for the transportation lane 215, an M lane for the transportation lane 216, and an R lane for the transportation lane 217.

The "board type" is a type of a board to be transported through an object transportation lane. For example, a type of a board to be transported through the R lane that is the transportation lane 217 is a board type A.

The "lane count" is a count of transportation lanes through which the same type of boards is transported through the object transportation lane. For example, a transportation lane that transports the board type A is only the R lane, and thus the lane count of the R lane is 1. Similarly, a transportation lane that transports the board type B is the M and F lanes, and thus the lane count of the M lane is 2.

The "target production time" indicates a target value of a production time necessary for each board type. The production time is a period of time necessary for producing boards having predetermined components mounted. For example, when targeting to produce boards of the board type A in 100 seconds per board, the target production time of the board type A is specified as "100s".

The "target tact" is a target value of a line tact for an object transportation lane. For example, when a target value of a line tact for the R lane is 100 seconds, the target tact of the R lane is specified as "100s".

Figure 9:
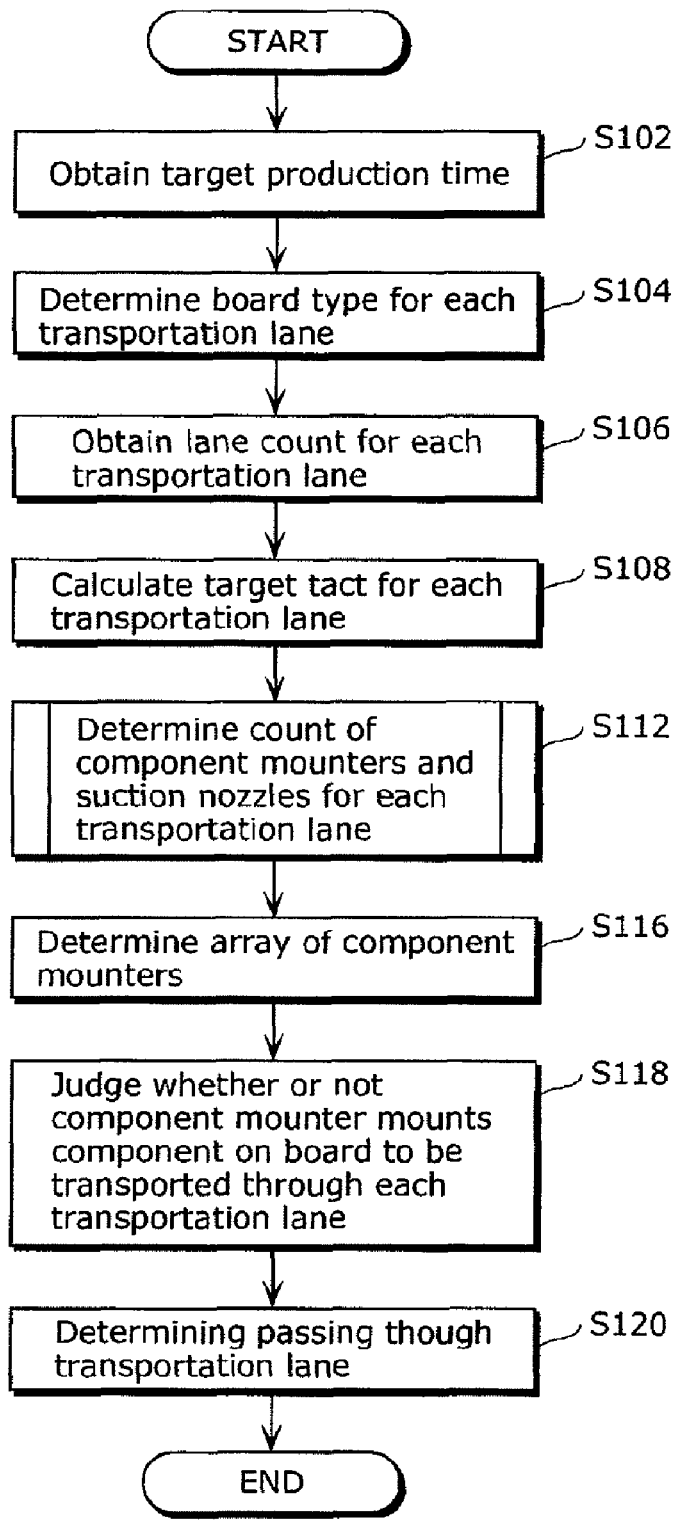
FIG. 9 is a flow chart showing an example of operations of the component mounting condition determining apparatus according to the first embodiment.
Figure 10:
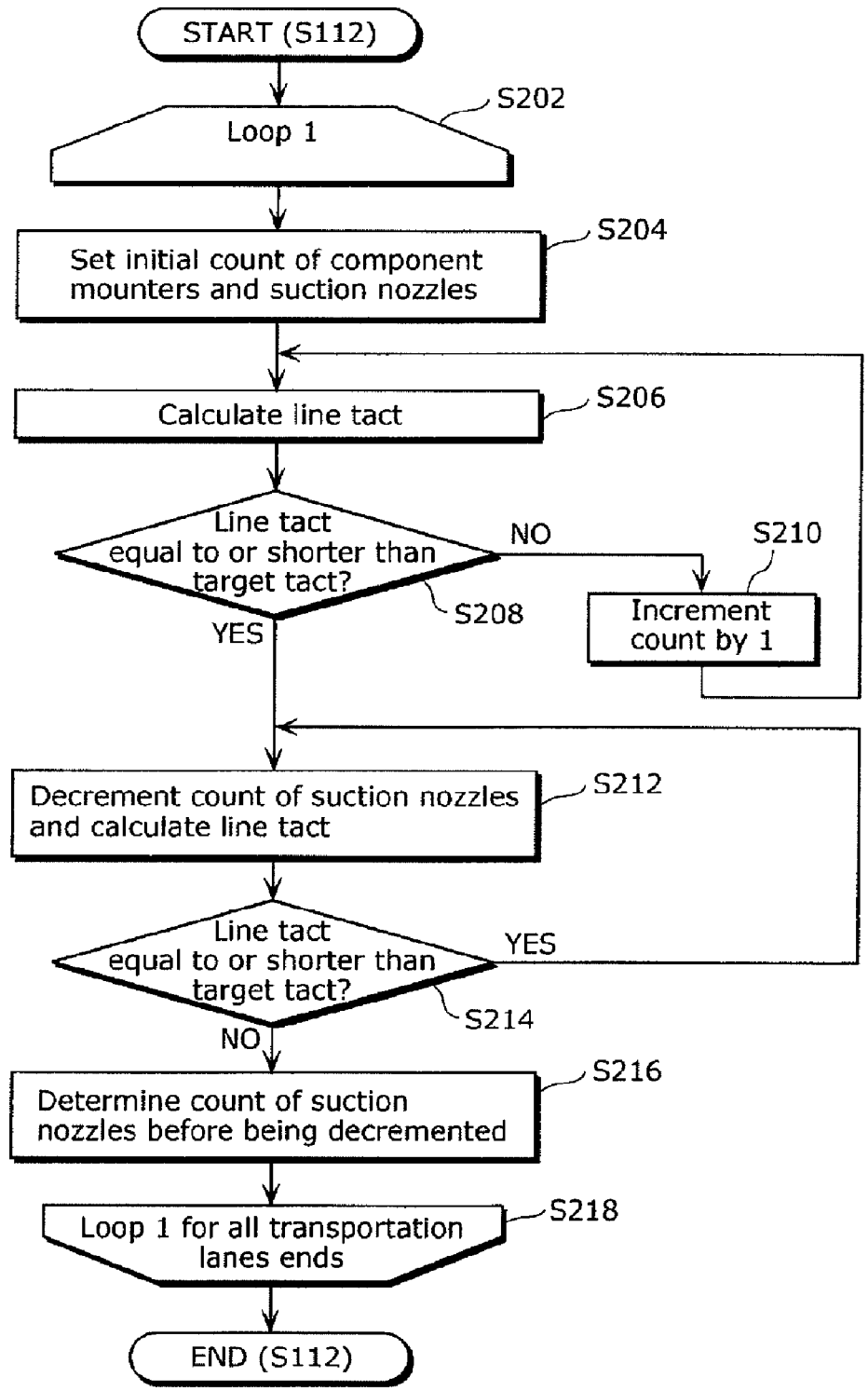
FIG. 10 is a flow chart showing an example of operations of the component mounting condition determining apparatus according to the first embodiment.

FIGS. 9 and 10 are flow charts each showing an example of operations of the component mounting condition determining apparatus 100 according to the first embodiment.

First, the target tact obtaining unit 105a obtains a target tact for each transportation lane as follows.

More specifically, the target tact obtaining unit 105a obtains a target production time for each board type through an input by the input unit 103 (S102). Then, the target tact obtaining unit 105a sets the target production time included in the target tact data 107c in FIG. 8 to the obtained target production time.

Then, the target tact obtaining unit 105a determines a board type of boards to be transported, for each transportation lane (S104). Moreover, the target tact obtaining unit 105a sets the board type included in the target tact data 107c to the obtained board type.

Next, the target tact obtaining unit 105a obtains, for each transportation lane, a lane count that is a count of transportation lanes through which boards of the determined board type are transported (S106). Then, the target tact obtaining unit 105a sets the lane count included in the target tact data 107c to the obtained lane count.

Then, the target tact obtaining unit 105a calculates, for each transportation lane, a target tact by multiplying the obtained target production time of the board type to be transported through the obtained transportation lanes, by the obtained lane count (S108). Then, the target tact obtaining unit 105a sets the target production time included in the target tact data 107c to the calculated target tact.

Thereby, the target tact obtaining unit 105a obtains a target tact for each transportation lane.

The lane-to-lane balance unit 105b determines, for each transportation lane, a count of the component mounters that intends to mount components on the boards to be transported through each transportation lane so that each of the line tacts approximates the target tact obtained by the target tact obtaining unit 105a (S112). Furthermore, the facility tact balance unit 105c determines the count of suction nozzles nz of a mounting head included in each of the component mounters 200 having the determined count (S112). The details are described later in description for FIG. 10.

Then, the array condition determining unit 105d determines an array of the component mounters 200 so that the component mounter 200 including the larger count of the suction nozzles nz is placed closer to the upstream of the component mounters 200 (S116).

Furthermore, the transport condition determining unit 105e judges for each transportation lane whether or not the component mounter 200 mounts components on boards transported through a transportation lane (S118). Then, the transport condition determining unit 105e determines for each transportation lane a mounting condition so that the boards judged not to mount components thereon are transported to the next component mounter 200 through a transportation lane without mounting any components on the boards (determining passing through a transportation lane in S120).

FIG. 10 is a flow chart showing an example of changing the count of the component mounters 200 using the lane-to-lane balance unit 105b. Furthermore, FIG. 10 also shows an example of changing the count of the suction nozzles nz of the mounting head included in the component mounter 200, using the facility tact balance unit 105c.

After the target tact obtaining unit 105a calculates and obtains a target tact (S108 in FIG. 9), processing of a loop 1 is started as follows (S202).

First, the lane-to-lane balance unit 105b sets the count of the component mounters 200 to a predetermined initial count of the component mounters 200 (S204). Furthermore, the facility tact balance unit 105c sets the count of the suction nozzles nz of the mounting head included in the component mounter 200 to a predetermined initial count of the suction nozzles nz (S204). Here, the count of the initial component mounters 200 may be 1, 2, or more than 3. Furthermore, the count of the initial suction nozzles nz may be 12, 8, or other counts.

Then, the lane-to-lane balance unit 105b calculates a line tact (S206). Furthermore, the lane-to-lane balance unit 105b judges whether or not the calculated line tact is equal to or shorter than the target tact (S208).

When judging that the calculated line tact is not equal to or shorter than the target tact (No in S208), the lane-to-lane balance unit 105b increments the predetermined initial count of the component mounters 200 by 1, as a condition for calculating a line tact (S210). Then, the lane-to-lane balance unit 105b calculates a line tact corresponding to the resulting count of the component mounters 200 (S206), and judges whether or not the calculated line tact is equal to or shorter than the target tact (S208).

When the lane-to-lane balance unit 105b judges that the calculated line tact is equal to or shorter than the target tact (Yes in S208), the facility tact balance unit 105c decrements the count of the suction nozzles nz of a mounting head and calculates a line tact when the component mounter 200 including the mounting head mounts components on boards (S212).

Furthermore, the facility tact balance unit 105c judges whether or not the calculated line tact is equal to or shorter than the target tact (S214). Then, when determining that the calculated line tact is equal to or shorter than the target tact (Yes in S214), the facility tact balance unit 105c decrements the count of suction nozzles nz and judges again whether or not the line tact is equal to or shorter than the target tact.

When judging that the calculated line tact is not equal to or shorter than the target tact (No in S214), the facility tact balance unit 105c determines that the count of suction nozzles nz before being decremented as the count of the suction nozzles nz of the mounting head (S216) and ends the processing (S218).

Then, the processing ends when the count of component mounters 200 and the count of the suction nozzles nz are determined for all transportation lanes.

Thereby, the throughput of the whole component mounting system 10 including the component mounters 200 each having the transportation lanes can be improved.

Here, more specific examples of the operations of the mounting condition determination apparatus 100 described in the flow charts in FIGS. 9 and 10 will be described hereinafter.

Here, the component mounting system 10 has a target of producing one board having both sides on which components are mounted, every 100 seconds. In other words, components are mounted in the target production time of every 100 seconds on both sides of a board where the front side is of the board type A and the back side is of the board type B. Furthermore, it is assumed that the count of components to be mounted on the board type B is larger than that of the board type A.

First, the target tact obtaining unit 105a obtains a target tact that is a target value of a line tact for each transportation lane (S102 to S108 in FIG. 9).

More specifically, the target tact obtaining unit 105a obtains a target production time for each board type (S102 in FIG. 9).

In other words, the target tact obtaining unit 105a obtains a target production time from the operator through the input unit 103. Here, the target production time for both the board types A and B is 100 seconds. As such, the production for the board types A and B ends simultaneously by matching the target production times of the board types A and B. Thus, for example, the intermediate inventory of boards can be reduced when the boards are composed of the board types A and B where the front side is of the board type A and the back side is of the board type B. Similarly, when the board types A and B are paired as both being constituent elements of a control device, the produced boards of the board types A and B can be simultaneously shipped or assembled, and the intermediate inventory of boards can be reduced in the processes. Here, the relationship between the board types A and B is not limited. As long as the board types A and B are shipped during a certain period of time, the intermediate inventory of boards can be reduced.

Here, the target tact obtaining unit 105a obtains 100 seconds as the target production time for both the board types A and B. Then, the target tact obtaining unit 105a sets the target production time included in the target tact data 107c in FIG. 8 to the obtained target production time.

Then, the target tact obtaining unit 105a determines boards of a board type to be transported, for each transportation lane (S104 in FIG. 9).

More specifically, the target tact obtaining unit 105a obtains a count of mounting points on the board types A and B from the NC data 107a, and allocates the larger count of transportation lanes to a board type having the larger count of the mounting points. In other words, since the board type B has the count of mounting points larger than that of the board type A, two transportation lanes, namely, the transportation lanes 215 and 216 are allocated to the board type B, while one transportation lane, namely, the transportation lane 217 is allocated to the board type A. Thus, the target tact obtaining unit 105a determines that the board type B is transported through the transportation lanes 215 and 216, while the board type A is transported through the transportation lanes 217. Then, the target tact obtaining unit 105a sets the board type included in the target tact data 107c to the determined board type.

Next, the target tact obtaining unit 105a obtains, for each transportation lane, a lane count that is the count of transportation lanes through which boards of the determined board type are transported (S106 in FIG. 9).

More specifically, the transportation lane that transports the board type A is only the transportation lane 217, and thus the lane count is 1. Similarly, the transportation lane that transports the board type B is the transportation lanes 215 and 216, and thus the lane count is 2. Thus, the target tact obtaining unit 105a obtains 1 as the lane count of the transportation lane 217, and 2 as the lane count of the transportation lanes 215 and 216. Then, the target tact obtaining unit 105a sets the lane count included in the target tact data 107c to the obtained lane count.

Next, the target tact obtaining unit 105a obtains a target tact for each transportation lane by multiplying the target production time by the lane count (S108 in FIG. 9).

More specifically, the target tact of the transportation lane 217 is 100 seconds obtained by multiplying 100 seconds that is the target production time of the board type A, by the lane count 1. More specifically, each of the target tacts of the transportation lanes 215 and 216 is 200 seconds obtained by multiplying 100 seconds that is the target production time of the board type B, by the lane count 2. In other words, producing the boards of the board type B in a target tact of 200 seconds every two boards through the transportation lanes 215 and 216 corresponds to producing them in a target tact of 100 seconds per board. Thus, the target tact obtaining unit 105a calculates 100 seconds for the transportation lane 217, and 200 seconds for the transportation lanes 215 and 216, as each target tact. Then, the target tact obtaining unit 105a sets the target production time included in the target tact data 107c to each of the calculated target tacts.

As such, the target tact obtaining unit 105a obtains the target tact from the target tact data 107c. In other words, the target tact obtaining unit 105a determines a lane count that is the count of transportation lanes to be allocated to each board type, by determining a board type of boards to be transported for each transportation lane. Then, the target tact obtaining unit 105a calculates and obtains a target tact by determining a line tact ratio among the transportation lanes having the lane count.

Then, the lane-to-lane balance unit 105b determines the count of the component mounters so that the line tact approximates the target tact obtained by the target tact obtaining unit 105a, for each transportation lane (S112 in FIG. 9). Furthermore, the facility tact balance unit 105c determines the count of suction nozzles nz of the mounting head included in each of the component mounters 200 having the determined count (S112 in FIG. 9).

More specifically, the initial count of the component mounters 200 is predetermined for each transportation lane. Then, the lane-to-lane balance unit 105b sets the count of the component mounters 200 to the predetermined initial count (S204 in FIG. 10). Furthermore, the facility tact balance unit 105c sets the count of the suction nozzles nz of the mounting head included in the component mounter 200 to the initial count (S204 in FIG. 10).

Here, the initial count of the component mounters 200 that mount components on the board 23 of the board type A to be transported through the transportation lane 217 is 1. Furthermore, the initial count of the component mounters 200 that mount components on the boards 21 and 23 of the board type B to be transported through the transportation lanes 215 and 216 is 2. In other words, the lane-to-lane balance unit 105b sets, as the initial count of the component mounters 200, 1 for the transportation lane 217, and 2 for the transportation lanes 215 and 216. Thereby, the component mounting system 10 includes the total 3 component mounters 200.

Furthermore, the facility tact balance unit 105c sets the initial count of the suction nozzles nz of the mounting head included in each of the component mounters 200 to 12.

Figure 11:
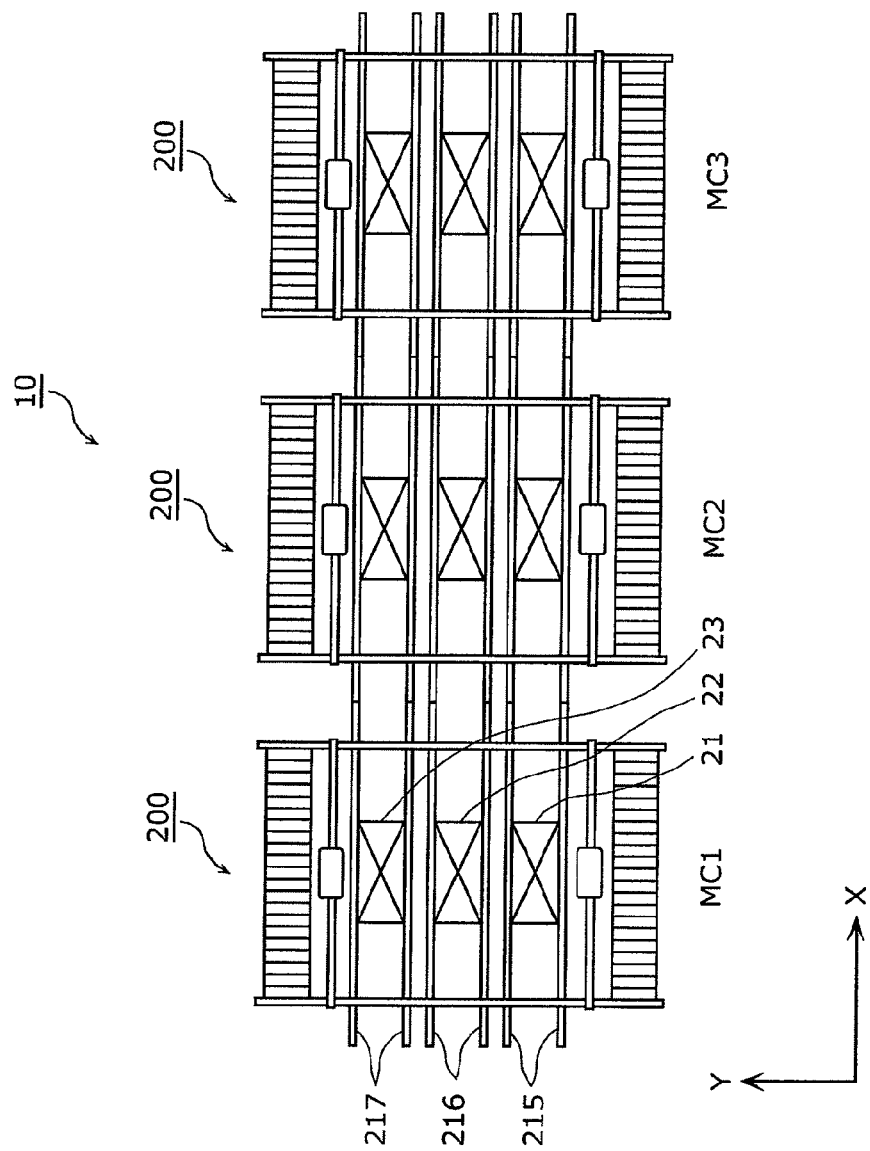
FIG. 11 illustrates the component mounting system including 3 component mounters according to the first and second embodiments.

FIG. 11 illustrates the component mounting system 10 including the total 3 component mounters 200.

The component mounting system 10 initially includes the total 3 component mounters 200. More specifically, the component mounting system 10 includes component mounters MC1, MC2, and MC3 that are the total 3 component mounters 200 and that include the 3 transportation lanes 215, 216, and 217.

The 3 component mounters 200 mount components while transporting the boards from the upstream to the downstream for each of the transportation lanes. In other words, the component mounter MC1 at the upstream receives the board 21 transported through the transportation lane 215, and mounts components on the boards 21. Then, the board 21 having the components mounted is transported to the component mounter MC2 at the downstream through the transportation lane 215. Then, the board 21 is transported from the component mounter MC2 to the component mounter MC3 through the transportation lane 215 to mount other components on the boards 21.

Furthermore, the boards 22 and 23 are transported from the component mourners MC1 to MC2 and MC3 through the transportation lanes 216 and 217, respectively to mount components by each of the component mounters MC1, MC2, and MC3.

Here, the component mounters 200 mount components only on a board that is set for mounting components in advance. Thus, any board that is not set for mounting components out of the boards 21, 22, and 23 is transported to the next component mounter without any component being mounted thereon.

Furthermore, the component mounters 200 that mount components are predetermined for each transportation lane. Here, the component mounter MC1 mounts components on the board 23 of the board type A to be transported through the transportation lane 217. Furthermore, the component mounters MC2 and MC3 mount components on the boards 21 and 22 of the board type B to be transported through the transportation lanes 215 and 216.

Figure 12A:
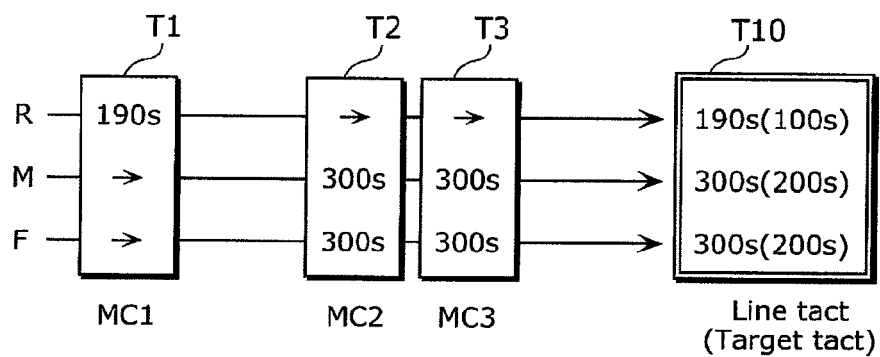
FIG. 12A illustrates an example of approximating a line tact to a target tact for each transportation lane according to the first embodiment.
Figure 12B:
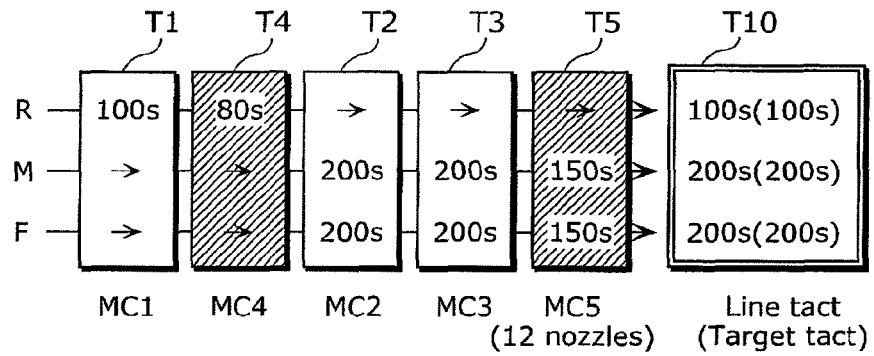
FIG. 12B illustrates an example of approximating a line tact to a target tact for each transportation lane according to the first embodiment.
Figure 12C:
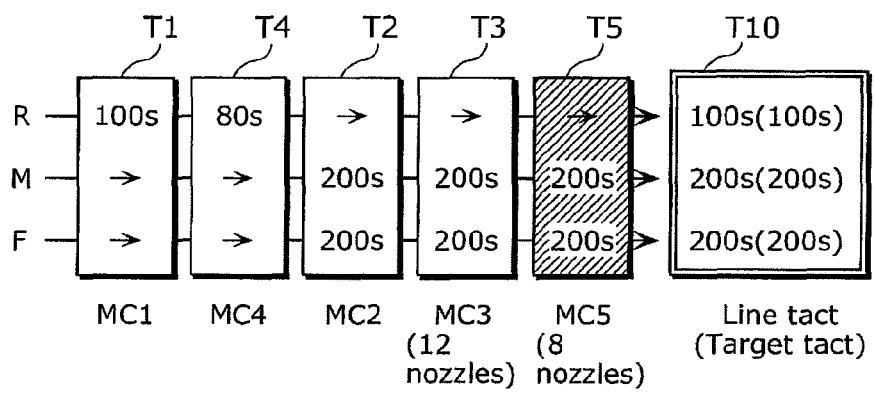
FIG. 12C illustrates an example of approximating a line tact to a target tact for each transportation lane according to the first embodiment.

FIGS. 12A to 12C illustrate examples of approximating a line tact ratio among transportation lanes, in other words, approximating a line tact for each transportation lane to a target tact. FIGS. 12A to 12C illustrates the F lane as the transportation lane 215, the M lane as the transportation lane 216, and the R lane as the transportation lane 217.

FIG. 12A illustrates tacts, line tacts, and target tacts of the transportation lanes included in the component mounters MC1, MC2, and MC3 illustrated in FIG. 11.

First, the lane-to-lane balance unit 105b calculates a line tact for each transportation lane (S206 in FIG. 10). More specifically, the lane-to-lane balance unit 105b calculates a line tact for each transportation lane by calculating tacts in each of the component mounters 200 (S206 in FIG. 10). Here, as an example of calculating tacts, the component feeders 212a are aligned in a descending order of the count of components included in each of the component feeders 212a, and the components are mounted on boards in an order from a board type having the smallest count of components. Thereby, the total period of time for picking up, moving, and mounting by the mounting head can be reduced, and the shorter tact is calculated.

For example, since it takes 190 seconds to mount components by the component mounter MC1 through the transportation lane 217 (R lane in T1), the line tact becomes 190 seconds with respect to the target tact 100 seconds (R lane in T10). After the component mounter MC1 mounts components on the board, the component mounters MC2 and MC3 transport the board having the components mounted thereon without mounting other components (R lane in T2 and T3). Similarly, the line tact of the transportation lanes 215 and 216 is 300 seconds with respect to the target tact 200 seconds.

The component mounter 200 that is predetermined for mounting components on the board 23 transported through the transportation lane 217 is, for example, the component mounter MC1 alone. Then, the lane-to-lane balance unit 105b changes the count of the component mounters 200 from the one component mounter MC1 so that the line tact 190 seconds of the transportation lane 217 approximates the target tact 100 seconds. Similarly, the lane-to-lane balance unit 105b changes the count of the component mounters 200 from two of the component mounters MC2 and MC3 so that the line tact 300 seconds of the transportation lanes 215 and 216 approximates the target tact 200 seconds.

First, the lane-to-lane balance unit 105b judges whether or not the calculated line tact is equal to or shorter than the target tact for each transportation lane (S208 in FIG. 10). In other words, the lane-to-lane balance unit 105b judges that the line tact 190 seconds is not equal to or shorter than the target tact 100 seconds at the transportation lane 217. Similarly, the lane-to-lane balance unit 105b judges that the line tact 300 seconds is not equal to or shorter than the target tact 200 seconds at the transportation lanes 215 and 216.

Then, the lane-to-lane balance unit 105b increments the predetermined count of the component mounters 200 by 1 until judging that the calculated line tact is equal to or shorter than the target tact for each transportation lane as illustrated in FIG. 12B (S210 in FIG. 10).

More specifically, the lane-to-lane balance unit 105b adds a component mounter MC4. Thereby, the line tact of the component mounter MC1 at the transportation lane 217 becomes 100 seconds (R lane in T1), and the line tact of the component mounter MC4 becomes 80 seconds (R lane in T4). In other words, since the line tact is 100 seconds with respect to the target tact 100 seconds, the line tact becomes equal to or shorter than the target tact. As such, the lane-to-lane balance unit 105b judges that the line tact of the transportation lane 217 becomes equal to or shorter than the target tact by adding the component mounter MC4.

Similarly, the lane-to-lane balance unit 105b adds a component mounter MC5 to the transportation lanes 215 and 216. Thus, the line tact of the transportation lanes 215 and 216 becomes 200 seconds (M and F lanes in T2, T3, and T5) that is equal to or shorter than the target tact 200 seconds (M and F lanes in T10). As such, the lane-to-lane balance unit 105b judges that line tact of the transportation lanes 215 and 216 becomes equal to or shorter than the target tact by adding the component mounter MC5.

Then, when the lane-to-lane balance unit 105b judges that the calculated line tact is equal to or shorter than the target tact, the facility tact balance unit 105c decrements the count of suction nozzles nz and calculates, for each transportation lane, a line tact to be used when components are mounted on boards (S212 in FIG. 10). In the component mounters 200 including the decremented count of the suction nozzles nz, each of the line tacts becomes shorter than a corresponding target tact by a predetermined value. The predetermined value is set to 30 seconds herein.

Here, the line tact of the transportation lanes 215 and 216 is equal to or shorter than the target tact. Furthermore, since the line tact of the component mounter MC5 at the transportation lanes 215 and 216 is 150 seconds (M and F lanes in T5), the value is shorter than the target tact 200 seconds by equal to or larger than 30 seconds (M and F lanes in T10). Thus, the facility tact balance unit 105c decrements the count of the suction nozzles nz of the component mounter MC5. For example, the facility tact balance unit 105c decrements the count of the suction nozzles nz of the component mounter MC5 from 12 to 8. Then, the facility tact balance unit 105c calculates each of the line tacts.

As illustrated in FIG. 12C, the line tact of the component mounter MC5 at the transportation lanes 215 and 216 is set to 200 seconds (M and F lanes in T5). In other words, the line tact of the transportation lanes 215 and 216 is calculated as equal to or shorter than 200 seconds (M and F lanes in T5).

Then, the facility tact balance unit 105c judges whether or not the calculated line tact is equal to or shorter than the target tact (S214 in FIG. 10). When judging that the calculated line tact is equal to or shorter than the target tact (Yes in S214), the facility tact balance unit 105c decrements the count of suction nozzles nz (S212 in FIG. 10), and judges whether or not the line tact is equal to or shorter than the target tact (S214 in FIG. 10). When judging that the calculated line tact is not equal to or shorter than the target tact (No in S214), the facility tact balance unit 105c determines the count of suction nozzles nz before being decremented as the count of the suction nozzles nz of the mounting head (S216 in FIG. 10).

More specifically, the line tact of the transportation lanes 215 and 216 is equal to or shorter than the target tact 200 seconds (M and F lanes in T10). Then, the facility tact balance unit 105c judges that the line tact is equal to or shorter than the target tact. When the count of the suction nozzles nz is further decremented, the line tact becomes not equal to or shorter than the target tact. Thus, the facility tact balance unit 105c determines the count of the suction nozzles nz of the mounting head of the component mounter MC5 as 8 that is the count before being decremented. In other words, the component mounter MC5 can be changed to the component mounter 200 that is more inexpensive because of the smaller count of the suction nozzles nz, thus enabling the component mounting system 10 to be configured of inexpensive facilities.

Then, the array condition determining unit 105d determines an array of the component mounters 200 so that the component mounter 200 including the larger count of the suction nozzles nz is placed closer to the upstream of the component mounters 200 (S116 in FIG. 9).

More specifically, the component mounter MC3 is placed closer to the upstream than the component mounter MC5, because the component mounter MC3 includes 12 suction nozzles nz while the component mounter MC5 includes 8 suction nozzles nz. The size of components picked up by the 12 suction nozzles nz is smaller than the size of components picked up by the 8 suction nozzles nz. Since the component mounter MC3 closer to the upstream mounts smaller components, the component mounter MC5 can mount components more easily by avoiding contact with the smaller components that have already been mounted.

Furthermore, the transport condition determining unit 105e judges for each transportation lane whether or not the component mounter 200 mounts components on boards transported through a transportation lane (S118 in FIG. 9). Then, the transport condition determining unit 105e determines a mounting condition for each transportation lane so that the board judged not to mount components thereon is transported to the next component mounter 200 through the transportation lane, without mounting any component on the board (S120 in FIG. 9).

For example, the component mounters MC1 and MC4 do not mount components on the board 21 through the transportation lane 215. Thus, the transport condition determining unit 105e transports the board 21 to the component mounter MC2 through the transportation lane 215, without mounting components using the component mounters MC1 and MC4. In other words, the board 21 is transported to the component mounter MC2 through the transportation lane 215 without waiting for the component mounters MC1 and MC4 mounting components. Thus, the loss caused by waiting for a board to be transported through a transportation lane may be reduced.

Thus, the throughput of the whole component mounting system 10 can be improved by approximating a line tact of each transportation lane at a corresponding target tact to be set so that the throughput of the whole component mounting system 10 can be maximized. Furthermore, components can be mounted every 100 seconds that is the target production time, on both sides of a board where the front side is of the board type A and the back side is of the board type B. Thus, components can be mounted on the back side of the board simultaneously during a time period when components are mounted on the front side of the board. In other words, the intermediate inventory of boards will not increase because components will not be mounted only on the front side of a board.

Furthermore, the line tact of each transportation lane can approximate a corresponding target tact without controlling: the timing when boards are charged into the component mounters 200 while mounting components on boards; and the count of boards to be changed into the component mounters 200. Thereby, the throughput of the whole component mounting system 10 can be improved.

(Variation 1)

Here, a first variation of the first embodiment will be described. In the first embodiment, the target tact obtaining unit 105a calculates a target tact by assuming a transporting time during when a board is transported between the component mounters 200 to be 0 second. However, the target tact obtaining unit 105a may calculate a target tact in consideration of the transporting time. More specifically, a target tact can be calculated in consideration of a transporting time by subtracting the transporting time from the target tact calculated in the first embodiment, when it takes time to transport the boards.

Figure 13:
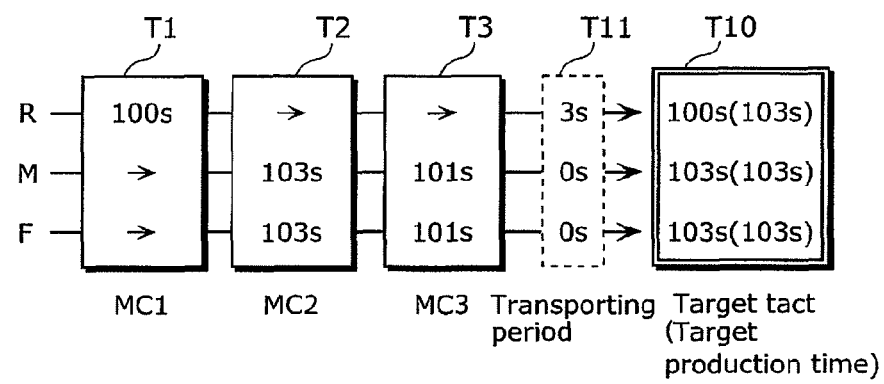
FIG. 13 illustrates the first variation of the first embodiment.

FIG. 13 illustrates the first variation of the first embodiment. FIG. 13 illustrates the F lane as the transportation lane 215, the M lane as the transportation lane 216, and the R lane as the transportation lane 217.

In the transportation lane 217, the transporting time is 3 seconds (R lane in T11). Thus, the target tact obtaining unit 105a calculates the target tact of the transportation lane 217 as 100 seconds by subtracting 3 seconds of the transporting time from 103 seconds of the target production time of the transportation lane 217 (R lane in T10).

Here, when the component mounters MC2 and MC3 mount components on boards in an asynchronous mode, components can be transported through the transportation lane 216 while components are mounted at the transportation lane 215. In other words, while the component mounter MC3 mounts components on the board 21 through the transportation lane 215, the board 22 having components mounted at the transportation lane 216 by the component mounter MC2 is transported to the component mounter MC3 through the transportation lane 216. As such, while the component mounter MC3 mounts components on the board 21, the board 22 can be transported to the next component mounter. Thus, the transporting time necessary for transporting the board 22 does not have to be considered. This is because the mounting time by the component mounter MC3 (M lane in T3) includes the transporting time of the board 22.

Thus, the target tact obtaining unit 105a calculates the target tact of the transportation lane 216 as 103 seconds (M lane in T10) because the target production time of the transportation lane 216 is 103 seconds and the transporting time is set to 0 second (M lane in T11). Similarly, the target tact obtaining unit 105a calculates the target tact of the transportation lane 215 as 103 seconds (F lane in T10).

Thereby, boards of a board type having a larger tact due to the larger count of mounting points are transported through the transportation lanes 215 and 216, and components are mounted on the boards in the asynchronous mode. Thus, the transporting time can be 0 second, and the throughput of the whole component mounting system 10 can be improved.

(Variation 2)

Next, a second variation of the first embodiment will be described. Although in the first embodiment, each of the component mounters 200 mounts components on boards of a single board type, the component mounters 200 may mount components on boards of board types.

Figure 14:
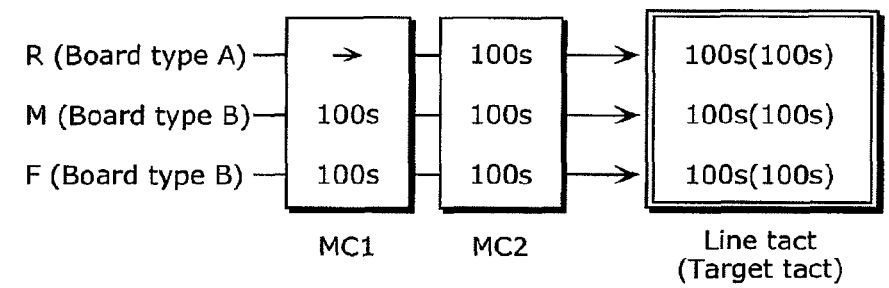
FIG. 14 illustrates the second variation of the first embodiment.

FIG. 14 illustrates the second variation of the first embodiment. FIG. 14 illustrates the F lane as the transportation lane 215, the M lane as the transportation lane 216, and the R lane as the transportation lane 217.

Boards of the board type A are transported through the transportation lane 217, and boards of the board type B are transported through the transportation lanes 215 and 216. In other words, the component mounter MC2 can mount components on boards of both of the board types A and B. In this manner, the count of the component mounters 200 and the cost of the whole component mounting system 10 can be reduced.

Here, when the component mounter MC2 mounts components on boards in the synchronous mode, as long as two boards of the board types A and B are paired, the component mounting can be started. Here, the board 23 is of the board type A, and the boards 21 and 22 are of the board type B. Thus, when the boards 23 and 21 are carried in the component mounter MC2 through the transportation lanes 217 and 215, the component mounter MC2 can start to mount components on the boards 23 and 21 without waiting for the board 22 to be transported through the transportation lane 216. As such, since the component mounters 200 can start to mount components on boards without waiting for all boards to be set for mounting components thereon, the throughput of the whole component mounting system 10 can be improved.

Although the component mounting condition determination method according to the present invention is described with the first and second variations, the present invention is not limited to such method.

Although each of the component mounters 200 includes 3 transportation lanes in the first embodiment and the variations, for example, the count of transportation lanes is not limited to 3 but may be 2 or more than 4. Even when each of the component mounters 200 includes 3 transportation lanes, components may be mounted only on the boards to be transported through 2 out of the 3 transportation lanes.

Furthermore, although the target tact obtaining unit 105a obtains a target production time from the operator through the input unit 103 in the first embodiment and the variations, the target tact obtaining unit 105a may calculate and obtain the target production time from preset data or by obtaining the count of boards to be targeted per unit time.

Furthermore, the target tact obtaining unit 105a obtains the count of mounting points from the NC data 107a, so that the larger count of transportation lanes are allocated to boards of a board type having the larger count of mounting points in the first embodiment and the variations. However, the target tact obtaining unit 105a may obtain the count of mounting points from the operator through the input unit 103. Furthermore, the target tact obtaining unit 105a may allocate the larger count of transportation lanes to boards of a board type having the larger tact. Furthermore, the target tact obtaining unit 105a may allocate a predetermined count of transportation lanes, independent of the count of mounting points or the length of a tact.

Furthermore, the target tact obtaining unit 105a obtains a target tact for each transportation lane when components are mounted on two types of boards A and B in the first embodiment and the variations. However, the board types may have equal to or more than 3 types, and the target tact obtaining unit 105a may determine a type out of the more than 3 types, and calculate and obtain a target tact of the type. Here, when determining the board types for each transportation lane, the larger the boards have the mounting points or have the necessary count of board types, the larger count of transportation lanes may be allocated to the boards, or alternatively, a predetermined count of transportation lanes may be allocated to the boards.

Furthermore, the lane-to-lane balance unit 105b sets the initial count of the component mounters 200 and determines the count of the component mounters 200 by incrementing the count to approximate a line tact at a target tact. However, the lane-to-lane balance unit 105b may determine the count of the component mounters 200 by decrementing the count to approximate a line tact at a target tact, when the line tact for the initial count of the component mounters 200 is shorter than the target tact. Furthermore, the lane-to-lane balance unit 105b may determine the count of the component mounters 200 so that a line tact approximates a target tact without setting the initial count of the component mounters 200.

Furthermore, the facility tact balance unit 105c decrements the count of the suction nozzles nz of the mounting head each included in the component mounters 200 so that a line tact approximates a target tact in the first embodiment and the variations. However, the facility tact balance unit 105c may increment the count of the suction nozzles nz of the mounting head so that a line tact approximates a target tact, when the line tact is larger than the target tact.

Furthermore, the facility tact balance unit 105c decrements the count of the suction nozzles nz of the mounting head each included in the component mounters 200 so that a line tact approximates a target tact in the first embodiment and the variations. However, as long as a line tact can approximate a target tact, any method may be used. For example, the facility tact balance unit 105c may decrement the count of the component feeders 212a of the component supply unit 211a and the component feeders 212b of the component supply unit 211b so that a line tact approximates a target tact. When the component mounter 200 includes the component feeders 212a and 212b in each of which the same types of components are stored, the tact increases by decrementing the count of the component feeders 212a and 212b. Thus, the line tact can approximate the target tact. Thereby, since the count of the component feeders decrements, the cost can be reduced.

Furthermore, the facility tact balance unit 105c changes the count of the suction nozzles nz of the mounting heads included in the component mounters 200 so that a line tact approximates a target tact in the first embodiment and the variations. However, the facility tact balance unit 105c may increment the count of the component feeders 212a of the component supply unit 211a and the component feeders 212b of the component supply unit 211b so that a line tact approximates a target tact, when the line tact is larger than the target tact. Here, there are cases where the count of component feeders cannot be incremented when component mounters belongs to a mounter type that can include only the smaller count of component feeders, such as 20 component feeders. In this case, in order to increment the count of component feeders, the component mounters need to be changed to a type of component mounters that can include the larger count of component feeders, such as 34 component feeders.

Furthermore, the facility tact balance unit 105c changes the count of the suction nozzles nz of the mounting head each included in the component mounters 200 so that a line tact approximates a target tact in the first embodiment and the variations. However, the facility tact balance unit 105c may change a type of the component mounters 200 so that a line tact approximates a target tact. In other words, even when each of the component mounters includes mounting heads having the same count as that of the suction nozzles nz, in the case where the types of the component mounters are different, there are cases where the tacts are different. This is because the component mounters include a mounter that can mount components in a relatively faster tact, and a mounter that can mount components only in a relatively slower tact. As such, a difference between a target tact and a tact can be reduced by changing a type of a component mounter to a different type. A line tact of a transportation lane other than a transportation lane that is desired to reduce a difference between a target tact and a tact is changed according to the change of a type of a component mounter. Thus, the facility tact balance unit 105c needs to adjust a tact by striking a balance between the line tacts of the changed component mounter. However, there is no need to make such adjustment, when a component mounter subject to change does not mount components on boards to be transported through a transportation lane other than a transportation lane that is desired to reduce a difference between a target tact and a tact.

Furthermore, the lane-to-lane balance unit 105b determines the count of component mounters 200 and the count of suction nozzles nz so that a line tact approximates the target tact obtained by the target tact obtaining unit 105a in the first embodiment and the variations. However, the following processing may be repeated without setting a target tact when a line tact for each transportation lane is desired to approximate the same value. The processing includes: calculating a line tact for each transportation lane while changing the count of the component mounters 200 and the suction nozzles nz for each transportation lane; and changing the count of the component mounters 200 and the suction nozzles nz for each transportation lane so that a difference between the line tacts becomes equal to or smaller than a predetermined value.

Although the component mounters 200 can perform alternate mounting in the first embodiment and the variations, the component mounters 200 are not limited to such component mounters but may mount components on boards, using a single mounting head.

Second Embodiment

Next, a component mounting method according to a second embodiment will be described. Here, since main constituent elements of the component mounting system 10 and the component mounters 200 according to the second embodiment are the same as those of the first embodiment illustrated in FIGS. 1 to 4, the description is omitted.

Figure 15:
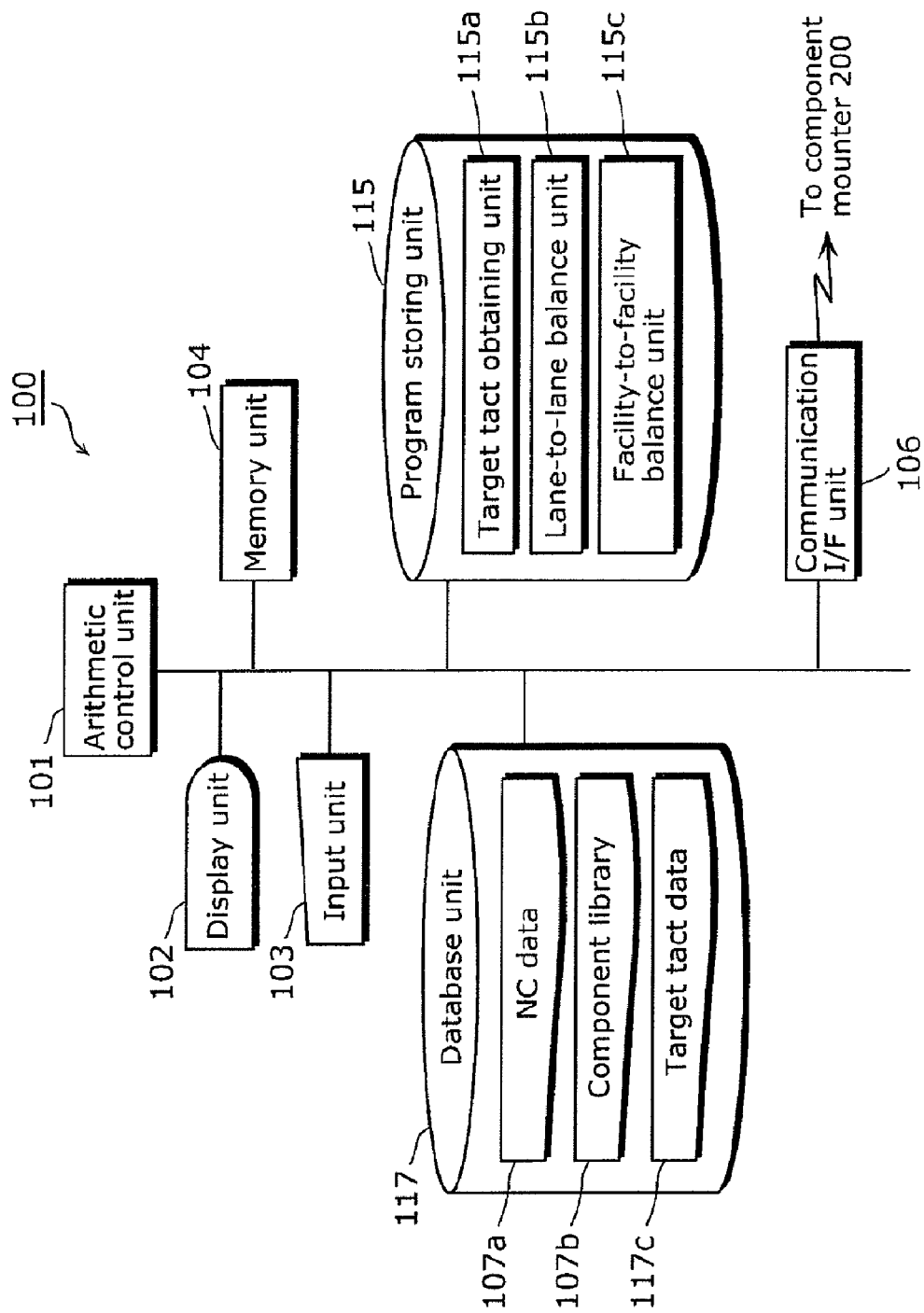
FIG. 15 is a block diagram showing a functional configuration of the component mounting condition determining apparatus according to the second embodiment.

FIG. 15 is a block diagram showing a functional configuration of the component mounting condition determining apparatus 100 according to the second embodiment.

The mounting condition determination apparatus 100 is a computer that performs processing, such as determining a mounting condition so that the throughput of the whole production line can be improved. The mounting condition determination apparatus 100 includes the arithmetic control unit 101, the display unit 102, the input unit 103, the memory unit 104, a program storing unit 115, the communication interface (I/F) unit 106, and a database unit 117.

The component mounting condition determining apparatus 100 is implemented by a general-purpose computer system such as a personal computer that executes a program according to the present invention. Without being connected to the component mounter 200, the component mounting condition determining apparatus 100 also serves as a stand-alone simulator (a tool for determining a component mounting condition). Here, functions of the component mounting condition determining apparatus 100 may be installed in each of the component mounters 200.

Since the arithmetic control unit 101, the display unit 102, the input unit 103, the memory unit 104, and the communication interface (I/F) unit 106 included in the mounting condition determination apparatus 100 function as described in the first embodiment, the description is omitted.

The program storing unit 115 is a hard disk for storing various programs for implementing the functions of the component mounting condition determining apparatus 100. The program stored by the program storing unit 105 determines a component mounting condition for the component mounters 200. The program storing unit 115 functionally (as a processing unit that performs the functions when executed by the arithmetic control unit 101) includes a target tact obtaining unit 115a, a lane-to-lane balance unit 115b, and a facility-to-facility balance unit 115c.

The target tact obtaining unit 115a obtains a target tact that is a target value of a line tact for each transportation lane. Here, the target tact is a target value obtained according to a ratio among predetermined line tacts. Furthermore, "each transportation lane" refers to each of the transportation lanes connected so that an identical type of boards can be transported. Here, the target tact obtaining unit 115a calculates a target tact for each of the transportation lanes, and obtains the target tact by storing, in the database unit 107, the target tact as target tact data 117c to be described later.

The lane-to-lane balance unit 115b determines a configuration of component mounters that intends to mount components on boards to be transported through transportation lanes so that a line tact ratio approximates a predetermined ratio. More specifically, the lane-to-lane balance unit 115b determines the count of the component mounters 200 so that a line tact approximates a corresponding target tact obtained by the target tact obtaining unit 115a, for each transportation lane. Here, the configuration of component mounters is not limited to the count of component mounters. For example, the configuration of component mounters includes the count of suction nozzles nz of a mounting head included in the component mounter and the count of component feeders that store the same type of components and that are included in each of the component mounters.

The facility-to-facility balance unit 115c strikes a balance between the component mounters 200. More specifically, the facility-to-facility balance unit 115c determines allocation of components to the component mounters 200 so that respective mounting times of the component mounters approximate the same value for each transportation lane under the configuration of component mounters determined by the lane-to-lane balance unit 115b.

The database unit 117 is a hard disk that stores, such as the NC data 107a, the component library 107b, and target tact data 117c that are used for determining a component mounting condition by the component mounting condition determining apparatus 100.

Since the NC data 107a and the component library 107b are described in FIGS. 6 and 7 in the first embodiment, the description is omitted herein.

FIG. 16 shows an example of the target tact data 117c.

The target tact data 117c is a collection of information for calculating a target tact for each transportation lane. The target tact data 117c includes "transportation lane", "board type", "lane count", "first target tact", "ratio", "second target tact", and "target production time".

The "transportation lane" is a transportation lane that is an object for calculating a target tact. More specifically, the transportation lanes identify a name of each of the transportation lanes 215, 216, and 217. Here, the names identified are, for example, an F lane for the transportation lane 215, an M lane for the transportation lane 216, and an R lane for the transportation lane 217.

The "board type" is a type of a board to be transported through an object transportation lane. For example, a type of a board to be transported through the R lane that is the transportation lane 217 is a board type A.

The "lane count" is the count of transportation lanes through which the same type of boards is transported through the object transportation lane. For example, the transportation lane that transports the board type A is only the R lane, and thus the lane count of the R lane is 1. Similarly, the transportation lane that transports the board type B is the M and F lanes, and thus the lane count of the M lane is 2.

The target production time is a target value of a production time for each board type. The production time is a period of time necessary for producing boards having predetermined components mounted. For example, when targeting to produce boards of the board type A in 100 seconds per board, the target production time of the board type A is specified as "100s".

The first target tact is a target value of a line tact for an object transportation lane. For example, when a target value of a line tact for the R lane is 100 seconds, the first target tact of the R lane is specified as "100s".

The "ratio" is a ratio of the first target tact for each transportation lane. For example, when the ratio of the first target tact is defined as the R lane:M lane:F lane=1:2:2, the ratio is 1 in the R lane, and 2 in the M and F lanes.

The "second target tact" is a target value when the first target tact is changed in an object transportation lane. For example, when the "first target tact" in the R lane is changed to 90 seconds, the second target tact is specified as "90s".

FIGS. 17 to 20 are flow charts showing examples of operations of the component mounting condition determining apparatus 100 according to the second embodiment.

First, the target tact obtaining unit 115a obtains a first target tact that is an initial target tact, for each transportation lane as follows.

Figure 17:
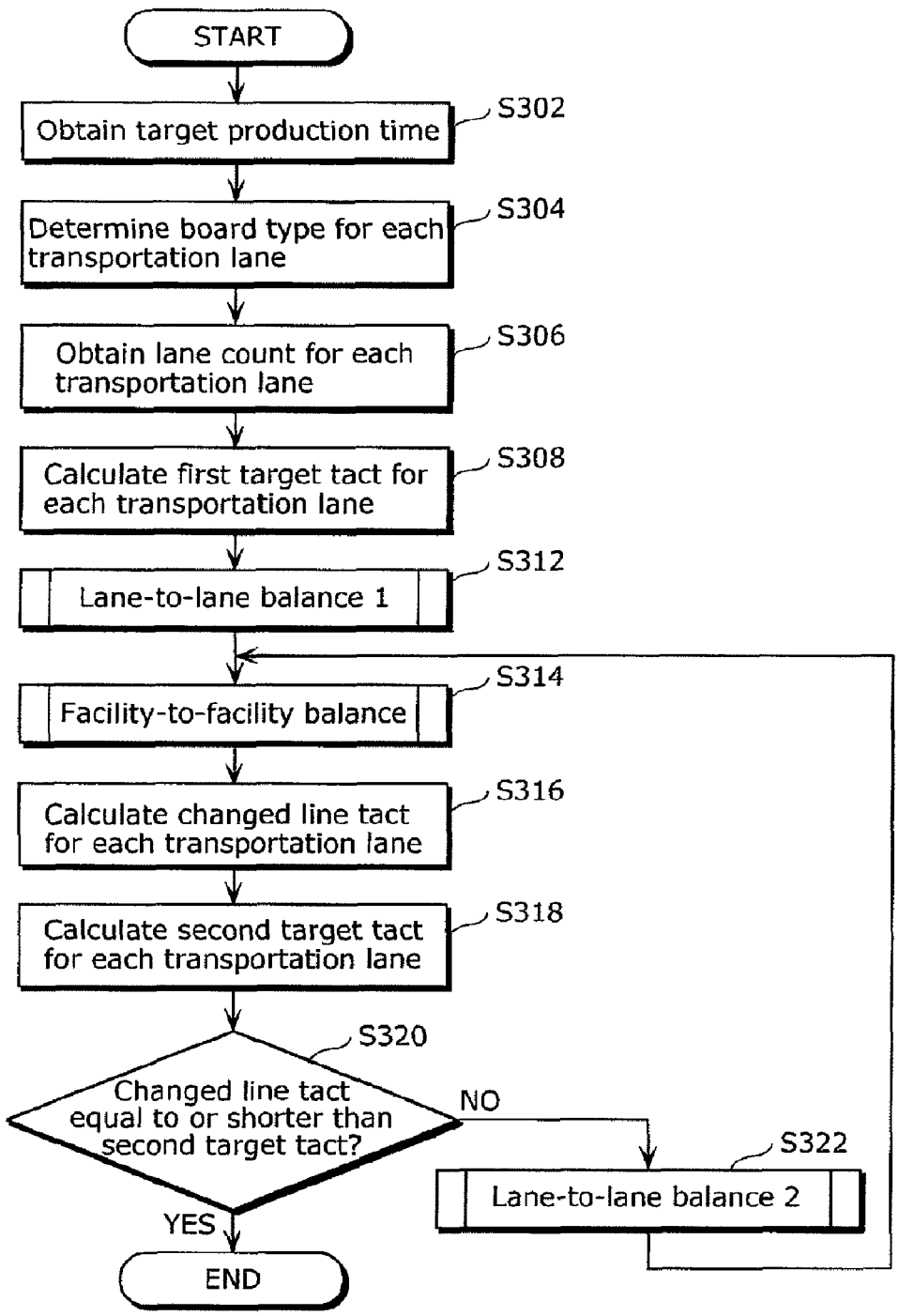
FIG. 17 is a flow chart showing an example of operations of the component mounting condition determining apparatus according to the second embodiment.

More specifically, as shown in FIG. 17, the target tact obtaining unit 115a obtains a target production time for each board type through an input by the input unit 103 (S302). Then, the target tact obtaining unit 115a sets the target production time included in the target tact data 117c in FIG. 16 to the obtained target production time.

Then, the target tact obtaining unit 115a determines a board type of boards to be transported, for each transportation lane (S304). Next, the target tact obtaining unit 115a sets the board type included in the target tact data 117c to the determined board type.

Next, the target tact obtaining unit 115a obtains, for each transportation lane, a lane count that is the count of transportation lanes through which boards of the determined board type are transported (S306). Then, the target tact obtaining unit 115a sets the lane count included in the target tact data 117c to the obtained lane count.

Next, the target tact obtaining unit 115a calculates, for each transportation lane, the first target tact by multiplying the obtained target production time of the board type to be transported through the obtained transportation lane, by the obtained lane count (S308). Then, the target tact obtaining unit 115a sets the first target tact included in the target tact data 117c to the calculated first target tact.

Accordingly, the target tact obtaining unit 115a obtains the first target tact that is an initial target tact, for each transportation lane.

Then, the lane-to-lane balance unit 115b approximates the line tact at the target tact obtained by the target tact obtaining unit 115a, for each transportation lane (S312). More specifically, the lane-to-lane balance unit 115b determines the count of the component mounters 200 so that the line tact approximates the first target tact, for each transportation lane. The count of the component mounters 200 determined by the lane-to-lane balance unit 115b is referred to as "determined count" hereinafter. The details are described later in description for FIG. 18.

The facility-to-facility balance unit 115c determines allocation of components to the component mounters 200 so that respective tacts of the component mounters 200 approximate the same value, for each transportation lane (S314). The details are described later in description for FIG. 19.

Then, the target tact obtaining unit 115a calculates a line tact that is changed after the facility-to-facility balance unit 115c allocates components to the component mounters 200, for each transportation lane (S316).

Furthermore, the target tact obtaining unit 115a calculates the second target tact that is a changed target tact for each transportation lane (S318). More specifically, the target tact obtaining unit 115a calculates a ratio among the first target tacts for each transportation lane, and sets the ratio of the target tact data 117c to each of the calculated ratios. When determining a ratio among the changed line tacts of the transportation lanes, the target tact obtaining unit 115a determines a value of the second target tact according to the ratio in the calculated target tact data 117. In other words, the target tact obtaining unit 115a calculates the second target tact for each transportation lane by: (i) setting one of the second target tacts of one of the transportation lanes having the changed line tacts, to a value of a corresponding one of the changed line tacts; and (ii) setting a ratio among the second target tacts to a ratio among the first target tacts. Then, the target tact obtaining unit 115a sets the second target tact included in the target tact data 117c to the calculated second target tact.

Accordingly, the target tact obtaining unit 115a obtains the second target tact that is a target tact, for each transportation lane.

Then, the lane-to-lane balance unit 115b judges whether or not the changed line tact is equal to or shorter than the second target tact, for each transportation lane (S320).

When judging whether or not the changed line tact is not equal to or shorter than the second target tact, for each transportation lane (No in S320), the lane-to-lane balance unit 115b approximates the line tact at the second target tact (S322). More specifically, the lane-to-lane balance unit 115b re-determines the count of the component mounters 200 to the changed count so that each of the line tacts becomes equal to or shorter than the second target tact, for each transportation lane. The details are described later in description for FIG. 20.

Furthermore, when the lane-to-lane balance unit 115b judges that the changed line tact is equal to or shorter than the second target tact (Yes in S320), the processing ends.

Figure 18:
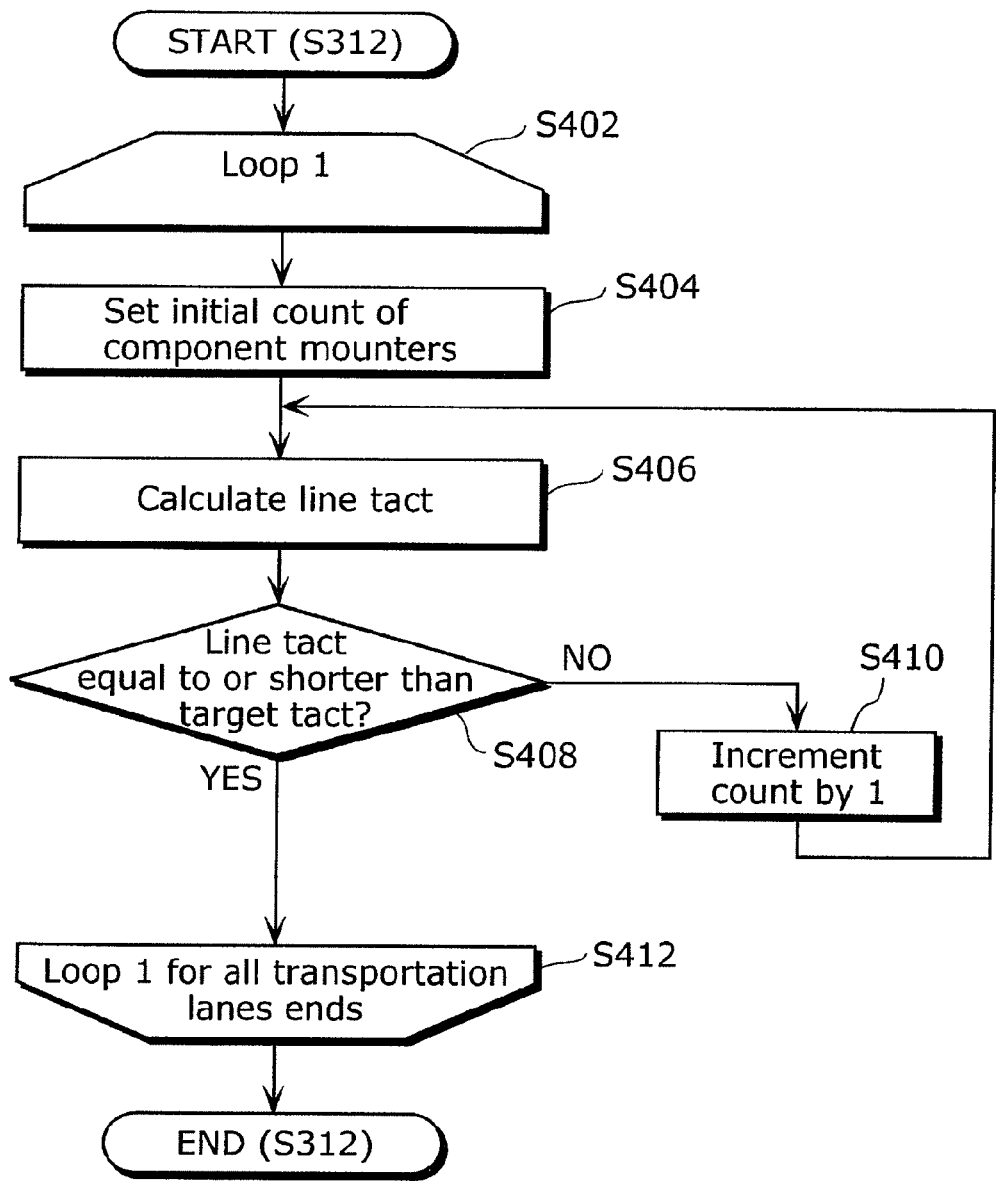
FIG. 18 is a flow chart showing an example of operations of the component mounting condition determining apparatus according to the second embodiment.

FIG. 18 is a flow chart showing an example of approximating a line tact ratio among transportation lanes to a predetermined ratio, in other words, an example that the lane-to-lane balance unit 115b approximates a line tact to the first target tact (S312).

After the target tact obtaining unit 115a calculates and obtains the first target tact (S308 in FIG. 17), processing of the loop 1 is started as follows (S402).

First, the lane-to-lane balance unit 115b sets the count of the component mounters 200 to a predetermined initial count (S404). Here, the count of the initial component mounters 200 may be 1, 2, or more than 3.

Then, the lane-to-lane balance unit 115b calculates a line tact (S406). Furthermore, the lane-to-lane balance unit 115b judges whether or not the calculated line tact is equal to or shorter than the target tact (S408).

When judging that the calculated line tact is not equal to or shorter than the target tact (No in S408), the lane-to-lane balance unit 115b increments the predetermined initial count of the component mounters 200 by 1 as a condition for calculating a line tact (S410). Then, the lane-to-lane balance unit 115b calculates a line tact corresponding to the incremented count of the component mounters 200 (S406), and judges whether or not the calculated line tact is equal to or shorter than the target tact (S408).

When the lane-to-lane balance unit 115b judges that the calculated line tact is equal to or shorter than the target tact (Yes in S408), processing for the next transportation lane is started (S412, S402).

When the count of component mounters 200 is determined for each of the transportation lanes, the processing ends (S412).

Figure 19:
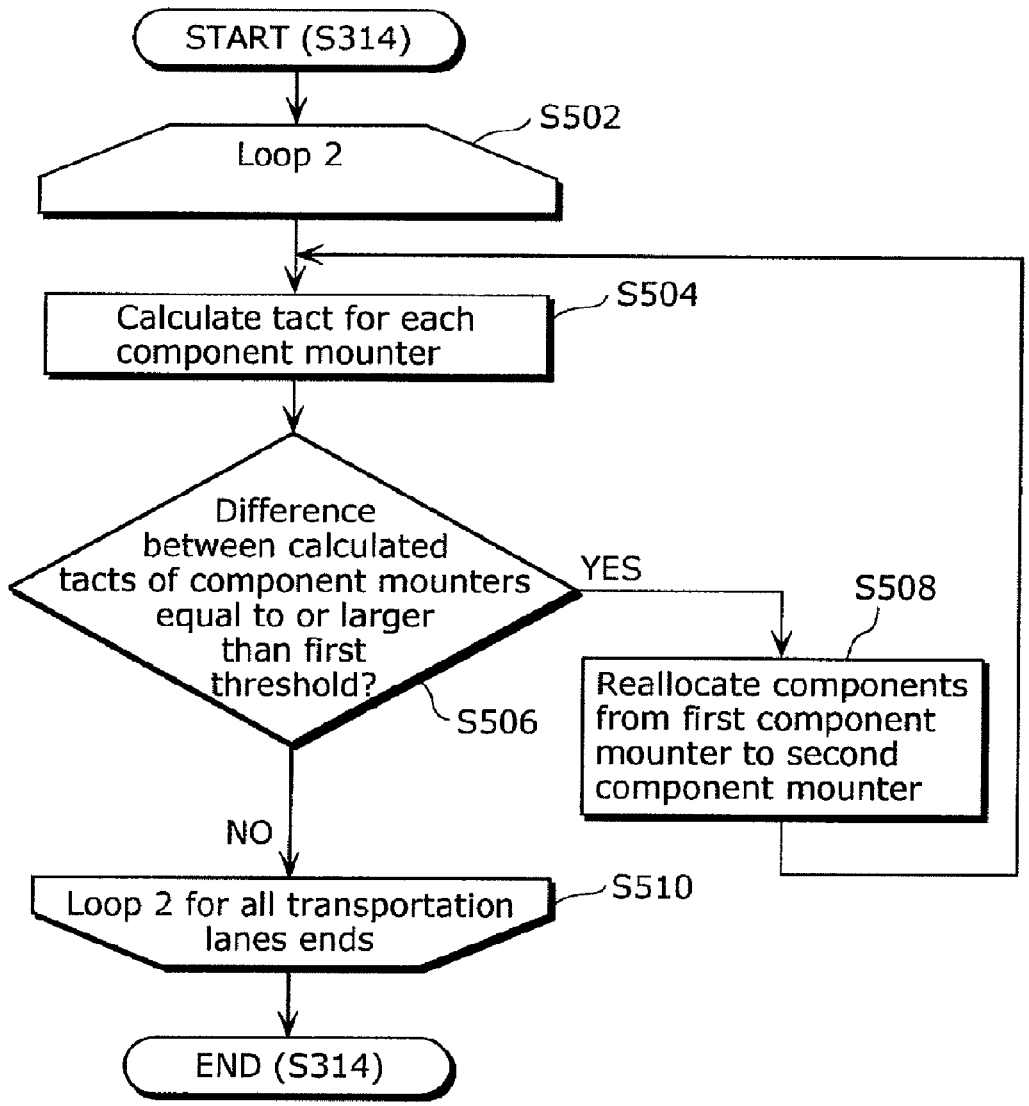
FIG. 19 is a flow chart showing an example of operations of the component mounting condition determining apparatus according to the second embodiment.

FIG. 19 is a flow chart showing an example of processing (S314) by the facility-to-facility balance unit 115c.

After the lane-to-lane balance unit 115b determines the count of the component mounters 200 so that the line tact approximates the first target tact, for each transportation lane, processing of a loop 2 is started as follows (S502).

First, the facility-to-facility balance unit 115c calculates a tact for each of the component mounters 200 having the count determined by the lane-to-lane balance unit 115b, for each transportation lane (S504).

Then, the facility-to-facility balance unit 115c judges whether or not the calculated tact of one of the component mounters 200 (first component mounter 200) is equal to or longer than one of the calculated tacts of an other component mounter 200 (second component mounter 200) by equal to or larger than a predetermined first threshold (S506).

Furthermore, when the facility-to-facility balance unit 115c judges that a difference between the calculated tacts of the first component mounter 200 and the second component mounter 200 is equal to or larger by the first threshold for each transportation lane (Yes in S506), a part of components out of the predetermined count of components are reallocated from the first component mounter 200 to the second component mounter 200 (S508).

Then, the facility-to-facility balance unit 115c calculates a tact for each of the component mounters 200 after reallocation of the components (S504), and judges whether or not a difference between the tacts of the component mounters 200 is equal to or larger than the first threshold (S506).

Furthermore, when the facility-to-facility balance unit 115c judges that the difference between the tacts of the component mounters 200 is not equal to or larger than the first threshold (No in S506), processing for the next transportation lane is started (S510, S502).

When components of the component mounters 200 are reallocated to all of the transportation lanes, the processing ends (S510).

Figure 20:
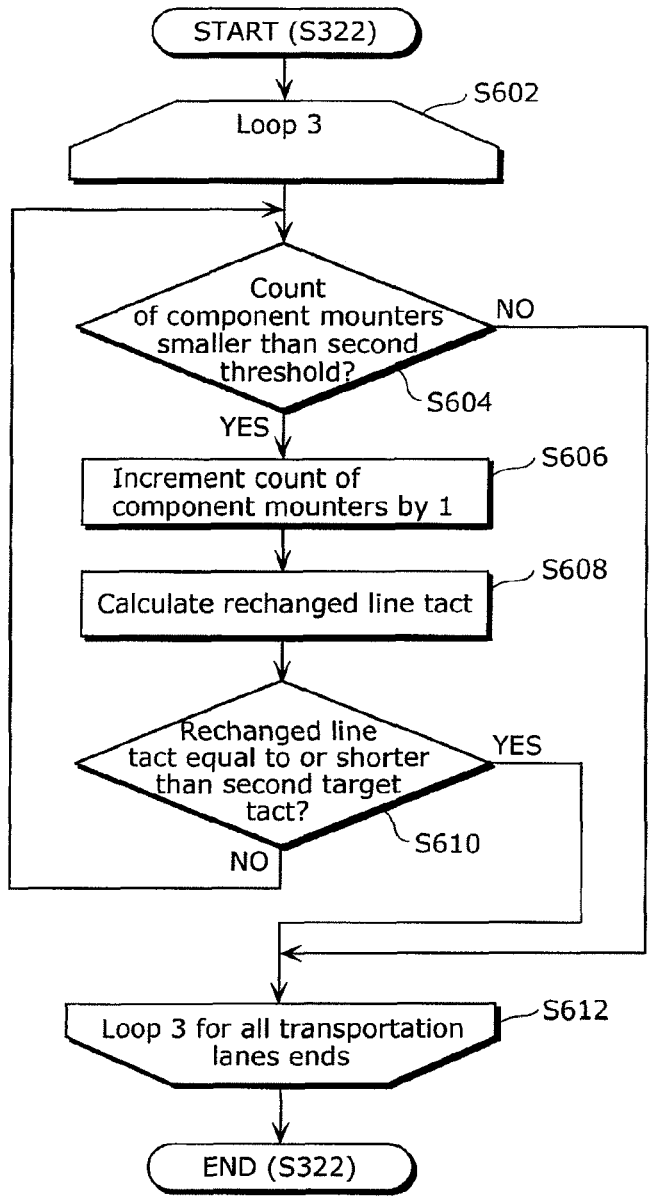
FIG. 20 is a flow chart showing an example of operations of the component mounting condition determining apparatus according to the second embodiment.

FIG. 20 is a flow chart showing an example that the lane-to-lane balance unit 115b approximates a line tact to the second target tact (S322).

When the lane-to-lane balance unit 115b judges that the changed line tact is not equal to or shorter than the second target tact for each transportation lane (No in S320 of FIG. 17), processing of a loop 3 is started as follows (S602).

First, the lane-to-lane balance unit 115b judges whether or not the count of the component mounters 200 is smaller than the predetermined second threshold for each transportation lane (S604). Here, the second threshold represents for each transportation lane an upper limit of the count of component mounters 200 that mounts components on boards to be transported through a transportation lane.

When judging that the count of the component mounters 200 is smaller than the second threshold for each transportation lane (Yes in S604), the lane-to-lane balance unit 115b increments the count of the component mounters 200 from the determined count by 1 as a condition for calculating a line tact (S606).

Furthermore, the lane-to-lane balance unit 115b calculates a rechanged line tact that is a line tact obtained by changing from the determined count, for each transportation lane (S608).

Then, the lane-to-lane balance unit 115b judges whether or not the rechanged line tact is equal to or shorter than the second target tact, for each transportation lane (S610).

When judging that the rechanged line tact is not equal to or shorter than the second target tact for each transportation lane (No in S610), the lane-to-lane balance unit 115b repeats the steps from S604 of determining whether or not the count of the component mounters 200 is equal to or larger than the second threshold (S604 to S610).

When judging that the count of the component mounters 200 is equal to or larger than the second threshold (No in S604), processing for the next transportation lane is started (S612, S602).

Furthermore, when the lane-to-lane balance unit 115b judges that the rechanged line tact is equal to or shorter than the second target tact, processing for the next transportation lane is started (S612, S602).

When the count of component mounters 200 is re-determined for each of the transportation lanes, the processing ends (S612).

As such, the throughput of the whole component mounting system 10 can be improved in the component mounting system 10 including the component mounters 200 each having the transportation lanes.

Here, more specific examples of the operations of the mounting condition determination apparatus 100 will be described with reference to the flow charts in FIGS. 17 to 20.

Here, the component mounting system 10 has a target of producing one board having both sides on which components are mounted every 100 seconds. In other words, components are mounted every 100 seconds on both sides of a board where the front side is of the board type A and the back side is of the board type B. Furthermore, the count of components to be mounted on the board type B is assumed to be larger than that of the board type A.

First, the target tact obtaining unit 115a obtains the first target tact that is an initial target value of a line tact, for each transportation lane (S302 to 308 in FIG. 17).

More specifically, the target tact obtaining unit 115a obtains a target production time for each board type (S302 in FIG. 17).

In other words, the target tact obtaining unit 115a obtains a target production time from the operator through the input unit 103. Here, the target production time for both the board types A and B is 100 seconds. Thus, the production for the board types A and B ends simultaneously by matching the target production times of the board types A and B. Thus, for example, the intermediate inventory of boards can be reduced when both sides of a board are composed of the board types A and B. Similarly, when the board types A and B are paired as both being constituent elements of a control device, the produced boards of the board types A and B can be simultaneously shipped or assembled, and the intermediate inventory of boards can be reduced in the processes. Here, the relationship between the board types A and B is not limited. As long as the board types A and B are shipped during a certain period of time, the intermediate inventory of boards can be reduced.

Thus, the target tact obtaining unit 115a obtains 100 seconds as the target production time for both the board types A and B. Then, the target tact obtaining unit 115a sets the target production time included in the target tact data 117c in FIG. 16 to the obtained target production time.

Then, the target tact obtaining unit 115a determines a board type of boards to be transported, for each transportation lane (S304 in FIG. 17).

More specifically, the target tact obtaining unit 115a obtains the count of mounting points of the board types A and B from the NC data 107a in FIG. 6, and allocates the larger count of transportation lanes to a board type having the larger count of the mounting points. In other words, since the board type B has the count of mounting points larger than that of the board type A, two transportation lanes, namely, the transportation lanes 215 and 216 are allocated to the board type B, while one transportation lane, namely, the transportation lane 217 is allocated to the board type A. Thus, the target tact obtaining unit 115a determines that the board type B is transported through the transportation lanes 215 and 216, while the board type A is transported through the transportation lane 217. Next, the target tact obtaining unit 115a sets the board type included in the target tact data 117c to the obtained board type.

Next, the target tact obtaining unit 115a obtains, for each transportation lane, a lane count that is the count of transportation lanes through which boards of the determined board type are transported (S306 in FIG. 17).

More specifically, the transportation lane that transports the board type A is only the transportation lane 217, and thus the lane count is 1. Similarly, the transportation lane that transports the board type B is the transportation lanes 215 and 216, and thus the lane count is 2. Thus, the target tact obtaining unit 115a obtains 1 as the lane count of the transportation lane 217, and 2 as the lane count of the transportation lanes 215 and 216. Then, the target tact obtaining unit 115a sets the lane count included in the target tact data 117c to the obtained lane counts.

Next, the target tact obtaining unit 115a obtains a first target tact for each transportation lane by multiplying the target production time by the lane count (S308 in FIG. 17).

More specifically, the first target tact of the transportation lane 217 is 100 seconds obtained by multiplying 100 seconds that is the target production time of the board type A, by the lane count 1. Similarly, the first target tact of the transportation lanes 215 and 216 is 200 seconds obtained by multiplying 100 seconds that is the target production time of the board type B, by the lane count 2. In other words, the boards of the board type B to be produced by a target tact, namely two boards every 200 seconds through the transportation lanes 215 and 216 corresponds to producing one board every 100 seconds. Thus, the target tact obtaining unit 115a calculates 100 seconds for the transportation lane 217, and 200 seconds for the transportation lanes 215 and 216 as the first target tact. Then, the target tact obtaining unit 115a sets the first target tact included in the target tact data 117c to the calculated first target tact.

As such, the target tact obtaining unit 115a obtains the first target tact that is the initial target tact from the target tact data 117c. In other words, the target tact obtaining unit 115a determines a lane count that is the count of transportation lanes to be allocated to each board type by determining the board type of a board to be transported for each transportation lane. Then, the target tact obtaining unit 115a calculates and obtains a target tact from the lane count by determining a target tact ratio among the transportation lanes.

Then, the lane-to-lane balance unit 115b determines the count of the component mounters 200 so that the line tact approximates the target tact obtained by the target tact obtaining unit 115a, for each transportation lane (S312 in FIG. 17).

More specifically, the initial count of the component mounters 200 is predetermined for each transportation lane.

Then, the lane-to-lane balance unit 115b sets the count of the component mounters 200 to the predetermined initial count (S404 in FIG. 18).

Here, the initial count of the component mounters 200 that mount components on the board 23 of the board type A to be transported through the transportation lane 217 is 1. Furthermore, the initial count of the component mounters 200 that mount components on the boards 21 and 23 of the board type B to be transported through the transportation lanes 215 and 216 is 2. In other words, the lane-to-lane balance unit 115b sets, as the initial count of the component mounters 200, 1 for the transportation lane 217, and 2 for the transportation lanes 215 and 216. Thereby, the component mounting system 10 includes the total 3 component mounters 200.

In other words, the component mounting system 10 includes the total 3 component mounters 200 as illustrated in FIG. 11 of the first embodiment.

The component mounting system 10 initially includes the total 3 component mounters 200. More specifically, the component mounting system 10 includes the component mounters MC1, MC2, and MC3 that are the total 3 component mounters 200 and that include the 3 transportation lanes 215, 216, and 217.

The 3 component mounters 200 mount components while transporting the boards from the upstream to the downstream for each of the transportation lanes. In other words, the component mounter MC1 at the upstream receives the board 21 that is transported through the transportation lane 215, and mounts components on the board 21. Then, the board 21 having the components mounted is transported to the component mounter MC2 at the downstream through the transportation lane 215. Then, the board 21 is transported from the component mounter MC2 to the component mounter MC3 through the transportation lane 215 to mount other components on the board 21.

Furthermore, the boards 22 and 23 are respectively transported through the transportation lanes 216 and 217 of the component mounters MC1 to MC3 to mount components by each of the component mounters MC1 and MC2, as the board 21 through the transportation lane 215 by the component mounter MC3.

Here, the component mounters 200 mount components only on a board that is set for mounting components in advance. Thus, any board that is not set for mounting components out of the boards 21, 22, and 23 are transported to the next component mounter without any component being mounted thereon.

Furthermore, the component mounters 200 that mount components are predetermined for each transportation lane. Here, the component mounter MC1 mounts components on the board 23 of the board type A to be transported through the transportation lane 217. Furthermore, the component mounters MC2 and MC3 mount components on the boards 21 and 22 of the board type B to be transported through the transportation lanes 215 and 216.

Figure 21A:
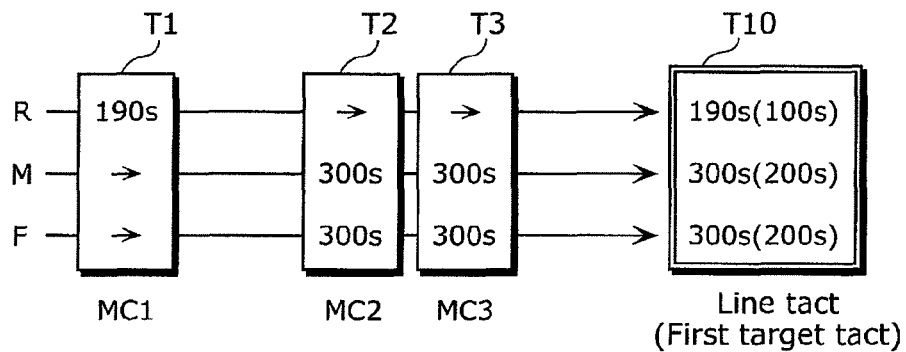
FIG. 21A illustrates an example of approximating a line tact to the first target tact for each transportation lane according to the second embodiment.
Figure 21B:
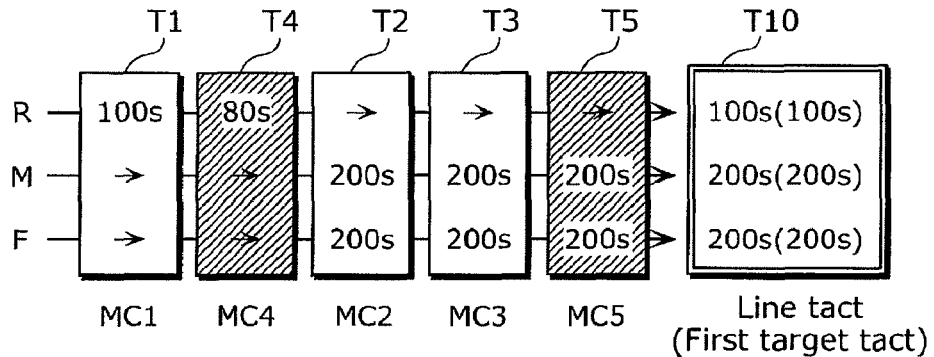
FIG. 21B illustrates an example of approximating a line tact to the first target tact for each transportation lane according to the second embodiment.

FIGS. 21A and 21B illustrate examples of approximating a line tact of each transportation lane to the first target tact. FIGS. 21A and 21B illustrate the F lane as the transportation lane 215, the M lane as the transportation lane 216, and the R lane as the transportation lane 217.

FIG. 21A illustrates tacts, a line tact, and the first target tact of the transportation lanes included in each of the component mounters MC1, MC2, and MC3 illustrated in FIG. 11.

First, the lane-to-lane balance unit 115b calculates a line tact for each transportation lane (S406 in FIG. 18). More specifically, the lane-to-lane balance unit 115b calculates a line tact for each transportation lane by calculating tacts in each of the component mounters 200. Here, as an example of calculating tacts, component feeders 212a and 212b are aligned in a descending order of the count of components included in each of the component feeders 212a and 212b, and the components are mounted on boards in an order from a board type having the smallest count of components. Thereby, the total period of time for picking up, moving, and mounting by the mounting heads 213a and 213b can be reduced, and thus the shorter tact is calculated.

For example, since it takes 190 seconds to mount components by the component mounter MC1 through the transportation lane 217 (R lane in T1), the line tact becomes 190 seconds (R lane in T10). When the component mounter MC1 mounts components on the board 23, the component mounters MC2 and MC3 transport the board 23 without mounting any component thereon (R lane in T2 and T3). Similarly, the line tact of the transportation lanes 215 and 216 is 300 seconds with respect to the target tact 200 seconds.

The component mounter 200 that is predetermined for mounting components on the board 23 transported through the transportation lane 217 is, for example, the component mounter MC1 alone. Then, the lane-to-lane balance unit 115b changes the count of the component mounters 200 from the one component mounter MC1 so that the line tact 190 seconds of the transportation lane 217 approximates the target tact 100 seconds. Similarly, the lane-to-lane balance unit 115b changes the count of the component mounters 200 from two component mounters MC2 and MC3 so that the line tact 300 seconds of the transportation lanes 215 and 216 approximates the target tact 200 seconds.

First, the lane-to-lane balance unit 115b judges whether or not the calculated line tact is equal to or shorter than the target tact for each transportation lane (S408 in FIG. 18). In other words, the lane-to-lane balance unit 115b judges that the line tact 190 seconds is not equal to or shorter than the target tact 100 seconds at the transportation lane 217. Similarly, the lane-to-lane balance unit 115b judges that the line tact 300 seconds is not equal to or shorter than the target tact 200 seconds at the transportation lanes 215 and 216.

As illustrated in FIG. 21B, the lane-to-lane balance unit 115b increments the predetermined count of the component mounters 200 by 1 until judging that the calculated line tact is equal to or shorter than the first target tact for each transportation lane (S410, S406, and S408 in FIG. 18).

More specifically, the lane-to-lane balance unit 115b adds a component mounter MC4. Then, components are mounted using the two component mounters 200, MC1 and MC2 on the board 23 to be transported through the transportation lane 217 so that the line tact of the transportation lane 217 is equal to or shorter than the first target tact.

Thereby, the line tact of the component mounter MC1 at the transportation lane 217 becomes 100 seconds (R lane in T1), and the line tact of the component mounter MC4 becomes 80 seconds (R lane in T4). In other words, since the line tact is 100 seconds with respect to the first target tact 100 seconds (R lane in T10), the line tact becomes equal to or shorter than the first target tact. As such, the lane-to-lane balance unit 115b judges that line tact becomes equal to or shorter than the first target tact at the transportation lane 217 by adding the component mounter MC4.

Similarly, the lane-to-lane balance unit 115b adds a component mounter MC5. Thus, the line tact of the transportation lanes 215 and 216 becomes 200 seconds that is equal to or shorter than the target tact 200 seconds (M and F lanes in T10). As such, the lane-to-lane balance unit 115b judges that the line tact of the transportation lanes 215 and 216 becomes equal to or shorter than the first target tact by adding the component mounter MC5.

As such, the lane-to-lane balance unit 115b determines the count of the component mounters 200, 2 for the transportation lane 217 and 3 for the transportation lanes 215 and 216.

The facility-to-facility balance unit 115c determines allocation of components to the component mounters 200 so that each of the tacts of the component mounters approximates the same value, for each transportation lane (S314 in FIG. 17).

More specifically, the facility-to-facility balance unit 115c calculates a tact for each of the component mounters 200 having the determined count (S504 in FIG. 19). For example, the facility-to-facility balance unit 115c calculates the tact of the component mounter MC1 that mounts components on the board 23 to be transported through the transportation lane 217 as 100 seconds (T1 in the R lane) and the tact for the component mounter MC4 as 80 seconds (T4 in the R lane). When the lane-to-lane balance unit 115b calculates a line tact for each transportation lane (S406 in FIG. 18), the facility-to-facility balance unit 115c calculates the tact for each of the component mounters 200. Thus, the facility-to-facility balance unit 115c may calculate a tact calculated by the lane-to-lane balance unit 115b as a tact of each of the component mounters 200.

Then, the facility-to-facility balance unit 115c judges whether or not the calculated tact of one of the component mounters 200 (first component mounter 200) is equal to or longer than one of the calculated tacts of an other component mounter 200 (second component mounter 200) by equal to or larger than a predetermined first threshold (S506 in FIG. 19). Here, the first threshold is 1 second. In other words, the facility-to-facility balance unit 115c judges that 100 seconds that is the tact of the component mounter MC1 is larger than 80 seconds that is the tact of the component mounter MC4 by more than 1 second.

When the facility-to-facility balance unit 115c judges that a difference between the calculated tacts of the first component mounter 200 and the second component mounter 200 is equal to or larger by the first threshold for each transportation lane (Yes in S506 of FIG. 19), a part of components out of the predetermined count of components are reallocated from the first component mounter 200 to the second component mounter 200 (S508 in FIG. 19). In other words, since the facility-to-facility balance unit 115c judges that the tact of the component mounter MC1 is larger than the tact of the component mounter MC4 by equal to or larger than 1 second, the part of the components are reallocated from the component mounter MC1 to the component mounter MC4. More specifically, the facility-to-facility balance unit 115c reallocates the part of the components that are allocated to the component supply units 211a and 211b of the component mounter MC1 for mounting the components on the board 23, to the component supply units 211a and 211b of the component mounter MC4.

Thus, the count of components to be mounted on the board 23 by the component mounter MC1 and the tact of the component mounter MC1 can be reduced. Thus, the count of components to be mounted on the board 23 by the component mounter MC4 and the tact of the component mounter MC4 can be increased. Thus, the tacts of the component mounters MC1 and MC4 can be equalized.

Then, the facility-to-facility balance unit 115c calculates a tact for each of the component mounters 200 after reallocation of the components (S504 in FIG. 19), and judges whether or not a difference between the tacts of the component mounters 200 is equal to or larger than the first threshold (S506 in FIG. 19). Here, the facility-to-facility balance unit 115c calculates the tact of both the component mounters MC1 and MC4 as 90 seconds. Then, the facility-to-facility balance unit 115c judges that the difference between the tacts of the component mounters MC1 and MC4 is equal to or larger than 1 second that is the first threshold.

Furthermore, when the facility-to-facility balance unit 115c judges that the difference between the tacts of the component mounters 200 is not equal to or larger than the first threshold (No in S506 of FIG. 19), processing for the next transportation lane is started (S510 and S502 in FIG. 19). In other words, since the facility-to-facility balance unit 115c judges that the tact of the component mounter MC1 is not larger than the tact of the component mounter MC4 by equal to or larger than 1 second, processing in the next transportation lanes 215 and 216 is started. Moreover, since the tact of the component mounter MC1 is not larger than the tacts of the component mounters MC2, MC3, and MC5 by equal to or larger than 1 second, the processing in the next transportation lanes 215 and 216 ends.

Figure 22A:
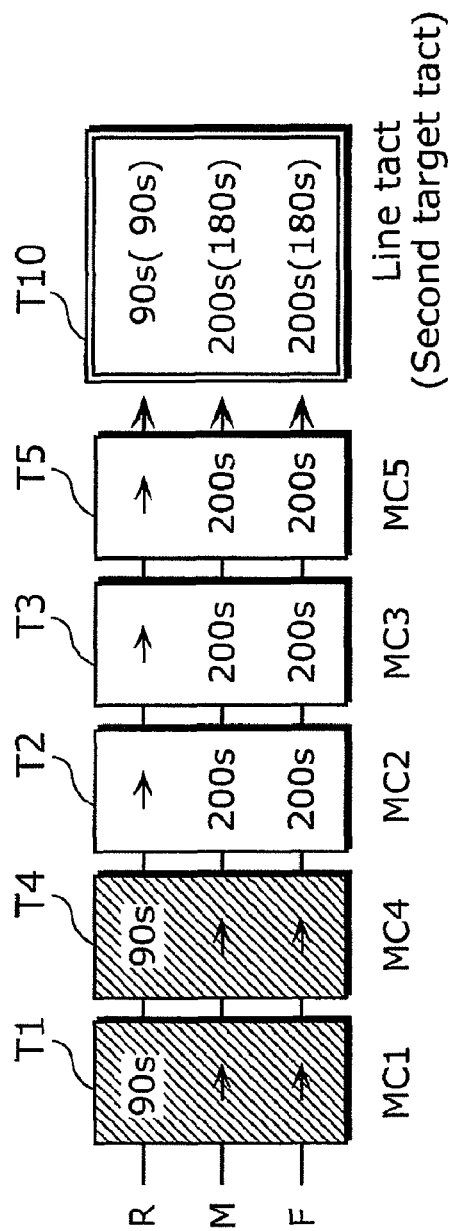
FIG. 22A illustrates an example of approximating a line tact to the second target tact for each transportation lane according to the second embodiment.
Figure 22B:
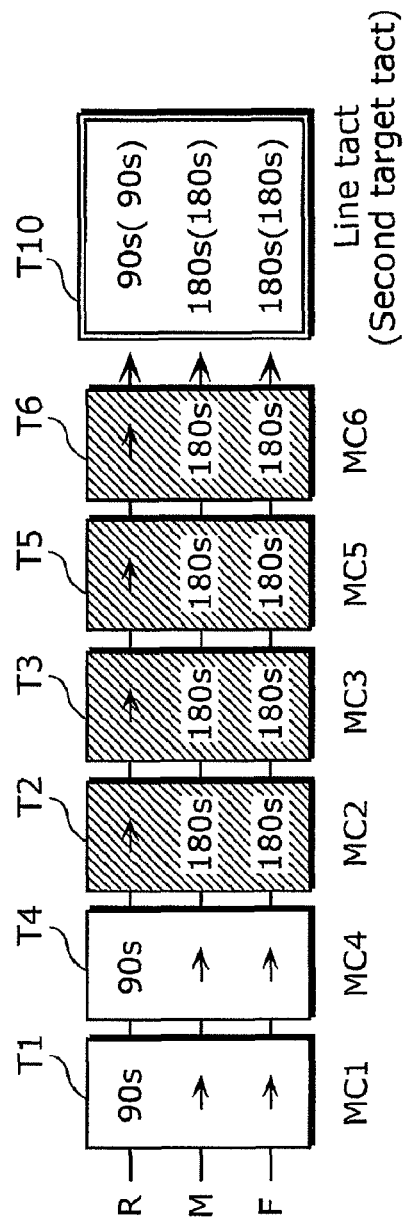
FIG. 22B illustrates an example of approximating a line tact to the second target tact for each transportation lane according to the second embodiment.

FIGS. 22A and 22B illustrate an example of approximating a line tact of each transportation lane to a second target tact. FIGS. 22A and 22B illustrate the F lane as the transportation lane 215, the M lane as the transportation lane 216, and the R lane as the transportation lane 217.

FIG. 22A illustrates tacts, line tacts, and the second target tacts of the transportation lanes included in the five component mounters 200 illustrated in FIG. 21B.

Then, the target tact obtaining unit 115a calculates, for each transportation lane, a changed line tact obtained after the facility-to-facility balance unit 115c reallocates the part of components from the first component mounter 200 to the second component mounter 200 (S316 in FIG. 17). In other words, since the tacts of the component mounters MC1 and MC4 are 90 seconds (T1 and T4 in the R lane), the changed line tact is calculated as 90 seconds (T10 in the R lane). Similarly, the line tact of the transportation lanes 215 and 216 is both calculated as 200 seconds.

Furthermore, the target tact obtaining unit 115a obtains the second target tact that is the changed target tact, for each transportation lane (S318 in FIG. 17). More specifically, the target tact obtaining unit 115a calculates a ratio among the first target tacts for each transportation lane, and sets the ratio of the target tact data 117c to the calculated ratio. In other words, the target tact obtaining unit 115a calculates 100 seconds for the transportation lane 217, and 200 seconds for the transportation lanes 215 and 216 as the first target tact. Assuming that the first target tact of the transportation lane 217 is 1 and the first target tact of the transportation lanes 215 and 216 is 2, the target tact obtaining unit 115a sets as the ratio of the target tact data 117c in FIG. 16, 1 for the transportation lane 217, and 2 for the transportation lanes 215 and 216.

The target tact obtaining unit 115a calculates for each of the transportation lanes a second target tact that is a target tact after reallocation in each of the transportation lanes by: (i) setting one of the second target tacts of one of the transportation lanes having the changed line tacts, to a value of a corresponding one of the changed line tacts; and (ii) setting a ratio among the second target tacts to a ratio among the first target tacts. In other words, the changed target tact of the transportation lane 217 becomes 90 seconds that is the same value as the changed line tact. Here, the ratio of the target tact data 117c is 1 for the transportation lane 217, and 2 for the transportation lanes 215 and 216. Thus, the changed target tact of the transportation lanes 215 and 216 is both calculated as 180 seconds according to this ratio. Thus, the target tact obtaining unit 115a calculates 90 seconds for the transportation lane 217, and 180 seconds for the transportation lanes 215 and 216 as the second target tact. Then, the target tact obtaining unit 115a sets the second target tact included in the target tact data 117c to the calculated second target tact.

Accordingly, the target tact obtaining unit 115a obtains the second target tact that is a target tact for each transportation lane.

Then, the lane-to-lane balance unit 115b judges whether or not the changed line tact is equal to or shorter than the second target tact, for each transportation lane (S320). The changed target tact of the transportation lane 217 is 90 seconds that is the same value as the second target tact (T10 in the R lane). However, the changed line tact of the transportation lanes 215 and 216 is 200 seconds that is larger than 180 seconds that is the second target tact (M and F lanes in T10). Thus, the lane-to-lane balance unit 115b judges that the changed line tact of the transportation lanes 215 and 216 is not equal to or shorter than the second target tact for each transportation lane.

Then, when determining whether or not the changed line tact is not equal to or shorter than the second target tact, for each transportation lane (No in S320), the lane-to-lane balance unit 115b approximates the line tact at the second target tact (S322 in FIG. 17).

First, the lane-to-lane balance unit 115b judges whether or not the count of the component mounters 200 is smaller than the predetermined second threshold for each transportation lane (S604 in FIG. 20). Here, the lane-to-lane balance unit 115b sets as the second threshold, 2 for the transportation lane 217, and 4 for the transportation lanes 215 and 216. In other words, the component mounters 200 may be increased up to 6. Furthermore, since the count of the component mounters 200 that mount components on the boards 21 and 22 to be transported through the transportation lanes 215 and 216 is 3, the lane-to-lane balance unit 115b judges that the count of the component mounters 200 is smaller than 4 that is the second threshold.

When judging that the count of the component mounters 200 is smaller than the second threshold for each transportation lane (Yes in S604 of FIG. 20), the lane-to-lane balance unit 115b increments the count of the component mounters 200 from the determined count by 1 (S606 in FIG. 20). In other words, the component mounter MC6 is added as the component mounter 200 that mounts components on the boards 21 and 22 to be transported through the transportation lanes 215 and 216 as illustrated in FIG. 22B.

Furthermore, the lane-to-lane balance unit 115b calculates a rechanged line tact that is a line tact obtained by changing from the determined count, for each transportation lane (S608 in FIG. 20). Furthermore, the component mounters 200 that mount components on the boards 21 and 22 to be transported through the transportation lanes 215 and 216 are the component mounters MC2, MC3, MC5, and MC6. Then, the rechanged line tact of the four component mounters including the component mounter MC6 is calculated as 180 seconds as the rechanged line tact of the transportation lanes 215 and 216.

Then, the lane-to-lane balance unit 115b judges whether or not the rechanged line tact is equal to or shorter than the second target tact, for each transportation lane (S610 in FIG. 20). Then, when the lane-to-lane balance unit 115b judges that the changed line tact is equal to or shorter than the second target tact (Yes in S320 of FIG. 17), the processing ends. Here, the rechanged line tact of the transportation lanes 215 and 216 is both 180 seconds that is equal to or shorter than 180 seconds that is the second target tact. Furthermore, the rechanged line tact of the transportation lane 217 is 90 seconds that is equal to or shorter than 90 seconds that is the second target tact.

As such, the count of the component mounters 200 is re-determined as 2 for the transportation lane 217, and 4 for the transportation lanes 215 and 216.

Thus, the throughput of the whole component mounting system 10 can be improved by approximating a line tact of each transportation lane at the target tact to be set so that the throughput of the whole component mounting system 10 can be maximized. Furthermore, components can be mounted every 90 seconds that is the target production time, on both sides of a board where the front side is of the board type A and the back side is of the board type B. Thus, components can be mounted on the back side of the board during a time period when components are mounted on the front side of the board. In other words, the intermediate inventory of boards will not increase because components will not be mounted only on the front side of a board.

Furthermore, the line tact of each transportation lane can approximate the target tact without controlling: the timing when boards are charged into the component mounters 200 while mounting components on boards; and the count of boards to be changed into the component mounters 200. Thereby, the throughput of the whole component mounting system 10 can be improved.

Although the component mounting condition determination method according to the present invention is described with the second embodiment, the present invention is not limited to such method.

Although each of the component mounters 200 includes 3 transportation lanes in the second embodiment, for example, the count of transportation lanes is not limited to 3 but may be 2 or more than 4. Even when each of the component mounters 200 includes 3 transportation lanes, components may be mounted only on the boards to be transported through 2 out of the 3 transportation lanes.

Furthermore, although the target tact obtaining unit 115a obtains a target production time from the operator through the input unit 103 in the second embodiment, the target tact obtaining unit 115a may obtain and calculate the target production time from preset data or by obtaining the target count of boards to be produced per unit time and the target production time.

Furthermore, the target tact obtaining unit 115a obtains the count of mounting points from the NC data 107a illustrated in FIG. 6 in the second embodiment, so that the larger count of transportation lanes are allocated to boards of a board type having the larger count of mounting points. However, the target tact obtaining unit 115a may obtain the count of mounting points from the operator through the input unit 103. Furthermore, the target tact obtaining unit 115a may allocate the larger count of transportation lanes to boards of a board type having the larger tact. Furthermore, the target tact obtaining unit 115a may allocate the predetermined count of transportation lanes, independent of the count of mounting points or the size of a tact.

Furthermore, the target tact obtaining unit 115a obtains a target tact for each transportation lane when components are mounted on two types of boards A and B in the second embodiment. However, the board types may include equal to or more than 3 types, and the target tact obtaining unit 115a may determine a type out of the more than 3 types for each transportation lane, and calculate and obtain a target tact of the type. Here, when determining the board types for each transportation lane, the larger the boards have the mounting points or have the necessary count of board types, the larger count of transportation lanes may be allocated to the boards. Alternatively, a predetermined count of transportation lanes may be allocated to the boards.

In the second embodiment, the target tact obtaining unit 115a calculates a target tact by assuming a transporting time for transporting boards between the component mounters 200 to be 0 second. However, the target tact obtaining unit 115a may calculate a target tact in consideration of the transporting time. Here, for example, when the component mounters MC2 and MC3 mount components on boards in an asynchronous mode, components are transported-through the transportation lane 216 while components are mounted at the transportation lane 215. As such, while the component mounter MC3 mounts components on the board 21, the board 22 can be transported to the next component mounter. Thus, the transporting time necessary for transporting the board 22 can be 0 second. Thereby, boards of a board type having a larger tact due to the larger count of mounting points and other reasons are transported through the transportation lanes 215 and 216, and components are mounted on the boards in the asynchronous mode. Thus, the transporting time may be 0 second, and the throughput of the whole component mounting system 10 can be improved.

Furthermore, the lane-to-lane balance unit 115b determines the count of the component mounters 200 so that the line tact approximates the target tact obtained by the target tact obtaining unit 115a. However, the following processing may be repeated without setting a target tact when a line tact for each transportation lane is desired to approximate the same value. The processing includes: calculating a line tact for each transportation lane while changing the count of the component mounters 200 for each transportation lane; and changing the count of the component mounters 200 for each transportation lane so that a difference between the line tacts becomes equal to or smaller than a predetermined value.

Furthermore, the lane-to-lane balance unit 115b sets the initial count of the component mounters 200 and determines the count of the component mounters 200 by incrementing the count to approximate a line tact at the first target tact in the second embodiment. However, the lane-to-lane balance unit 115b may determine the count of the component mounters 200 by decrementing the count to approximate a line tact to the first target tact, when the line tact for the initial count of the component mounters 200 is shorter than the first target tact. Furthermore, the lane-to-lane balance unit 115b may determine the count of the component mounters 200 so that a line tact approximates the first target tact without setting the initial count of the component mounters 200.

Furthermore, the lane-to-lane balance unit 115b re-determines the count of the component mounters 200 by incrementing the count of component mounters 200 only when the changed line tact is larger than the second target tact in the second embodiment. However, the lane-to-lane balance unit 115b may re-determine the count of component mounters 200 by decrementing the count of component mounters 200 only when the changed line tact is equal to or shorter than the second target tact.

Furthermore, although the lane-to-lane balance unit 115b limits the count of the component mounters 200 to equal to or smaller than the second threshold in the second embodiment, the lane-to-lane balance unit 115b may increment the count of the component mounters 200 until the line tact becomes equal to or shorter than the second target tact without limiting the count.

Furthermore, the lane-to-lane balance unit 115b limits the count of the component mounters 200 to equal to or smaller than the second threshold in the second embodiment when the line tact is decremented to equal to or shorter than the second target tact in the second embodiment. However, the lane-to-lane balance unit 115b may limit the count of the component mounters 200 when the line tact for each transportation lane is decremented to equal to or shorter than the first target tact.

Furthermore, although the lane-to-lane balance unit 115b increments the count of the component mounters 200 so that the line tact approximates the target tact in the second embodiment, lane-to-lane balance unit 115b may approximate the line tact at the target tact by incrementing the count of the suction nozzle nz of the mounting heads 213a and 213b of the component mounters 200 and shortening the tacts of the component mounters 200 without incrementing the count of the component mounters 200. However, the lane-to-lane balance unit 115b may approximate the line tact at the target tact by decrementing the count of the suction nozzles nz, when the line tact is shorter than the target tact.

Furthermore, although the facility-to-facility balance unit 115c reduces the line tact by reallocating components between the component mounters 200 in the second embodiment, the facility-to-facility balance unit 115c may reduce the line tact by reducing the tact of the component mounters without reallocating the components. For example, the facility-to-facility balance unit 115c may reduce the tact of the component mounters by incrementing the count of the suction nozzles nz of the mounting heads 213a and 213b included in the component mounters 200. Furthermore, the facility-to-facility balance unit 115c may approximate the line tact at the target tact by decrementing the count of the suction nozzles nz, when the line tact is shorter than the target tact.

Furthermore, although the facility-to-facility balance unit 115c reduces the line tact by reallocating components between the component mounters 200 in the second embodiment, the facility-to-facility balance unit 115c may reduce the line tact by reducing the tact of the component mounters and allocating components of the same type to the component feeders 212a and 212b. Here, there are cases where the count of component feeders cannot be incremented when component mounters belong to a type that includes only the smaller count of component feeders, such as 20 component feeders. In this case, in order to increment the count of component feeders, the component mounters need to be changed to a type of component mounters that can include the larger count of component feeders, such as 34 component feeders. Furthermore, the facility-to-facility balance unit 115c may approximate the line tact at the target tact by decrementing the count of the component feeders, when the line tact is shorter than the target tact.

Furthermore, although the facility-to-facility balance unit 115c reduces the line tact by reallocating components between the component mounters 200 in the second embodiment, the facility-to-facility balance unit 115c may approximate the line tact at the target tact by changing the type of the component mounters 200. In other words, even when each of the component mounters 200 includes mounting heads each having the same count of the suction nozzles nz, in the case where the types of the component mounters are different, there are cases where the tacts are different. This is because the component mounters include various component mounters, such as a mounter that can mount components in a relatively faster tact, and a mounter that can mount components only in a relatively slower tact. As such, a difference between a target tact and a tact can be reduced by changing a type of a component mounter to a different type. According to change of a type of a component mounter, a transportation lane other than a transportation lane that is desired to reduce a difference between a target tact and a tact may also be changed. Thus, the facility-to-facility balance unit 115c needs to adjust a tact in consideration of change in all transportation lanes. However, there is no need to make such adjustment, when a component mounter subject to change does not mount components on boards to be transported through a transportation lane other than a transportation lane that is desired to reduce a difference between a target tact and a tact.

Furthermore, although the component mounters 200 perform alternate mounting in the second embodiment, the component mounters 200 are not limited to such component mounters but may mount components on boards, using a single mounting head.

Furthermore although each of the component mounters 200 mounts components on boards of a single board type in the second embodiment, the component mounters 200 may mount components on boards of board types. In this manner, the count of the component mounters 200 can be equal to or smaller than the second threshold by decrementing the count of the component mounters 200, even when the count of the component mounters 200 can be larger than the second threshold. Thereby, the cost of the whole component mounting system 10 can be reduced by decrementing the count of the component mounters 200.

Third Embodiment

Next, a component mounting method according to a third embodiment will be described with reference to drawings.

A configuration of a production line 1010 according to a third embodiment of the present invention will be described with reference to FIGS. 23 and 24.

Figure 23:
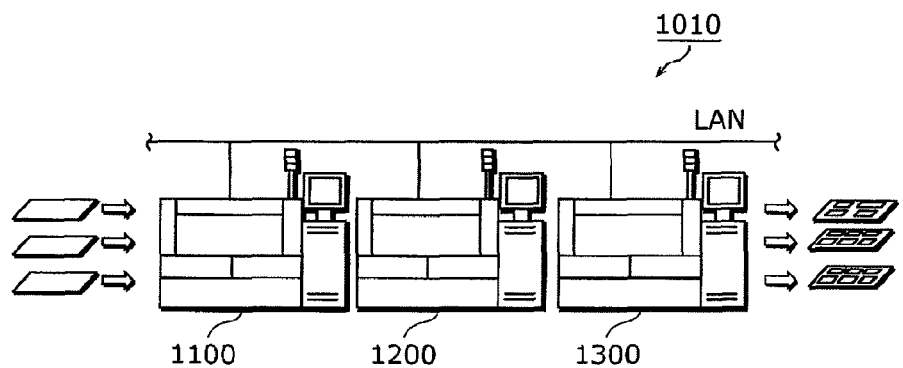
FIG. 23 illustrates an outline of a hardware configuration of the production line according to the third embodiment.

FIG. 23 illustrates an outline of a hardware configuration of the production line 1010 of the third embodiment.

As illustrated in FIG. 23, the production line 1010 includes component mounters 1100, 1200, and 1300 that are connected in this order.

The component mounters 1100 to 1300 are of the same type of component mounters, and include 3 transporting conveyers. In other words, the production line 1010 includes 3 transportation lanes that are transportation paths for mounting components on boards, and makes it possible to mount components on 3 types of boards at maximum and in parallel.

Figure 24:
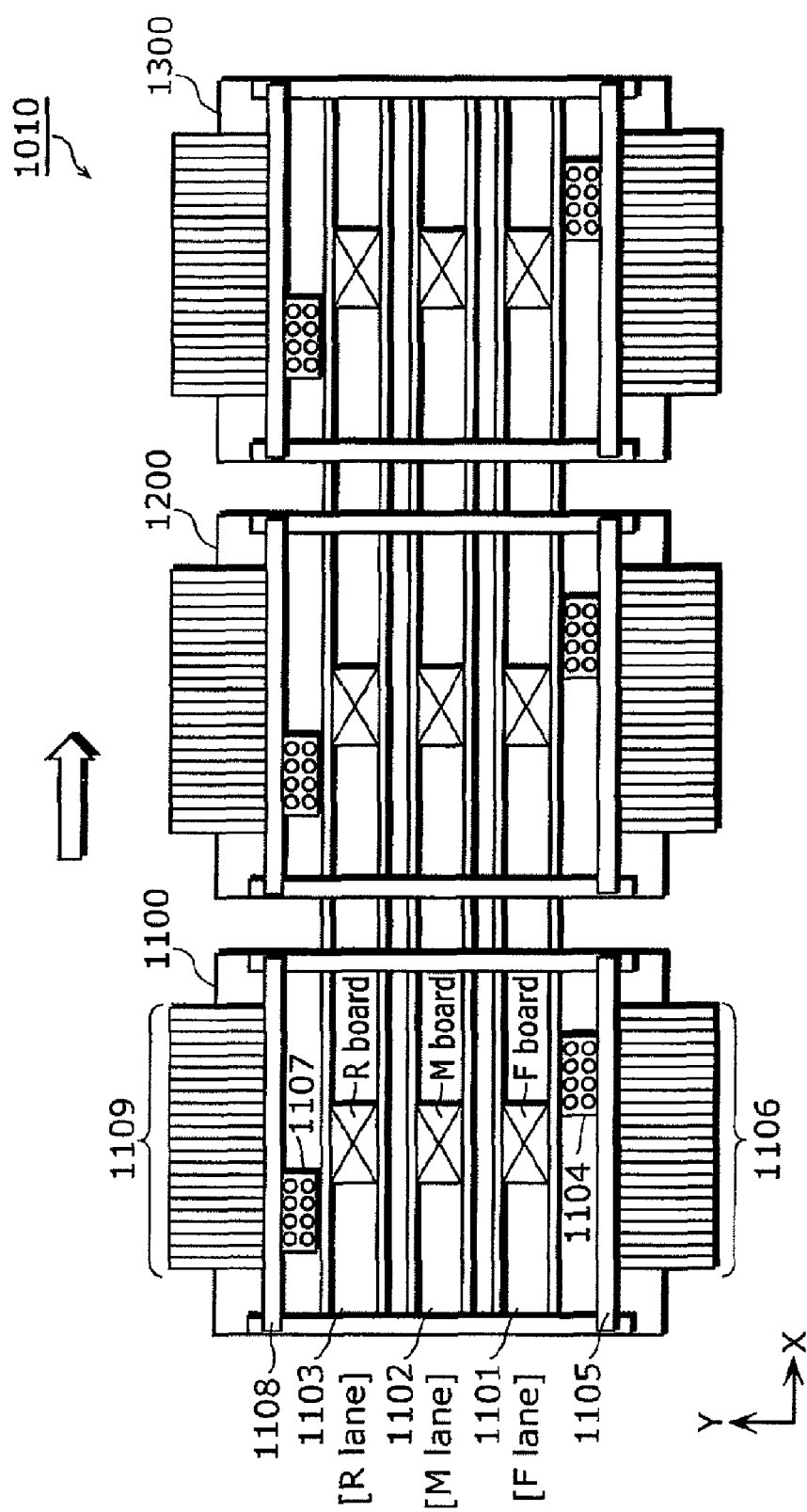
FIG. 24 illustrates a top view of an outline of a lane configuration of the production line according to the third embodiment.

FIG. 24 illustrates a top view of an outline of a lane configuration of the production line 1010 of the third embodiment.

As illustrated in FIG. 24, the production line 1010 includes 3 lanes, namely, a front (F) lane, a middle (M) lane, and a rear (R) lane from a front side (bottom part in FIG. 24) to a back side (upper part in FIG. 24).

Furthermore, the transporting conveyers of the component mounters 1100 to 1300 transport components through each of these lanes as illustrated in FIG. 24.

More specifically, the component mounter 1100 includes 3 conveyers, namely, a first conveyer 1101, a second conveyer 1102, and a third conveyer 1103 that are arranged in parallel. Furthermore, the component mounters 1200 and 1300 also include the 3 conveyers.

Boards are transported through each of the F, M, and R lanes from a left side of FIG. 24 that is an upstream to a right side of FIG. 24 that is a downstream.

Furthermore, each of the component mounters 1100 to 1300 mounts components on each of the boards while the boards are transported, and the boards are transported to the downstream.

The component mounter 1100 includes mounting heads 1104 and 1107 that face each other as a mechanism for mounting components on each of the boards to be transported.

Each of the mounting heads 1104 in the forward and the mounting heads 1107 in the rear has suction nozzles that can pick up components at one time.

More specifically, the mounting head 1104 mounts components picked up from the component supply unit 1106 on the boards. Furthermore, the mounting head 1107 mounts components picked up from the component supply unit 1109 on the boards.

The mounting head 1104 can be moved parallel in an X-axis direction along a beam 1105, and the mounting head 1107 can be moved parallel in the X-axis direction along a beam 1108. Furthermore, each of the beams 1105 and 1108 can be independently moved in a Y-axis direction.

In other words, each of the mounting heads 1104 and 1107 can be independently moved within a certain range of the XY plane.

With such movement, the mounting heads 1104 and 1107 can mount components on the 3 boards to be transported through the first conveyer 1101, the second conveyer 1102, and the third conveyer 1103 to a board placing region on which components are mounted.

The combinations of each of the mounting heads 1104 and 1107, and boards on which components picked up by the mounting heads 1104 and 1107 are to be mounted are not limited to a particular combination.

For example, the 3 boards to be transported through the F, M, and R lanes are defined as an F board, an M board, and an R board as illustrated in FIG. 24.

In this case, for example, the mounting head 1104 mounts components on the F board, and the mounting head 1107 mounts components on the R board. Furthermore, the mounting head 1104 and the mounting head 1107 can mount components on the M board by working together.

Furthermore, for example, the mounting head 1104 and the mounting head 1107 may mount components on any of the F, M, and R boards by working together.

The component mounters 1200 and 1300 also have the same function of mounting components as the component mounter 1100, and thus may mount components on boards to be transported through the F, M, and R lanes in the same manner.

As described above, the production line 1010 of the third embodiment can mount components on 3 types of boards at maximum and in parallel.

The type of boards can be identified by a position in which components are mounted (hereinafter referred to as mounting position) or by a type of components to be mounted. In other words, even when 2 boards are physically separate, they are of the same type as long as the type of components to be mounted and the mounting position are identical with each other.

Furthermore, depending on which sides of the board components are mounted in the production line 1010, a method for mounting components on a board differs. Thus, when a board is a double-sided board of one board on both sides of which components are mounted, in the case where different types of components are mounted on both sides of the board or the mounting positions on both the sides are different from each other, both sides of the board are handled as different types of boards.

Furthermore, the F, M, and R lanes are used as lanes that transport boards from upstream to downstream, and all the component mounters 1100 to 1300 operate to mount components on all boards in the third embodiment.

However, other methods also exist as methods for using the lanes and the component mounters. For example, the M lane may be used as a lane that returns the boards on which components have been mounted at the M and F lanes to the upstream. The boards returned to the upstream are transported through the R lane, and additional components are mounted on the boards.

Furthermore, for example, the F lane in the component mounter 1200 may be used as a bypass that passes the boards transported from the component mounter 1100 to the component mounter 1300.

Figure 27:
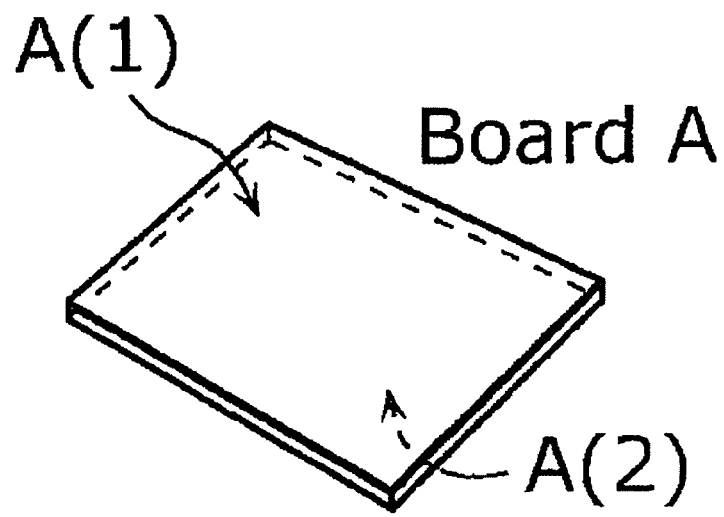
FIG. 27 explains that one board of a board type is used as 2 types of boards in the third embodiment.

Next, a functional configuration of the component mounter 1100 in the third embodiment will be described with reference to FIGS. 25 to 27.

Figures 25, 26:
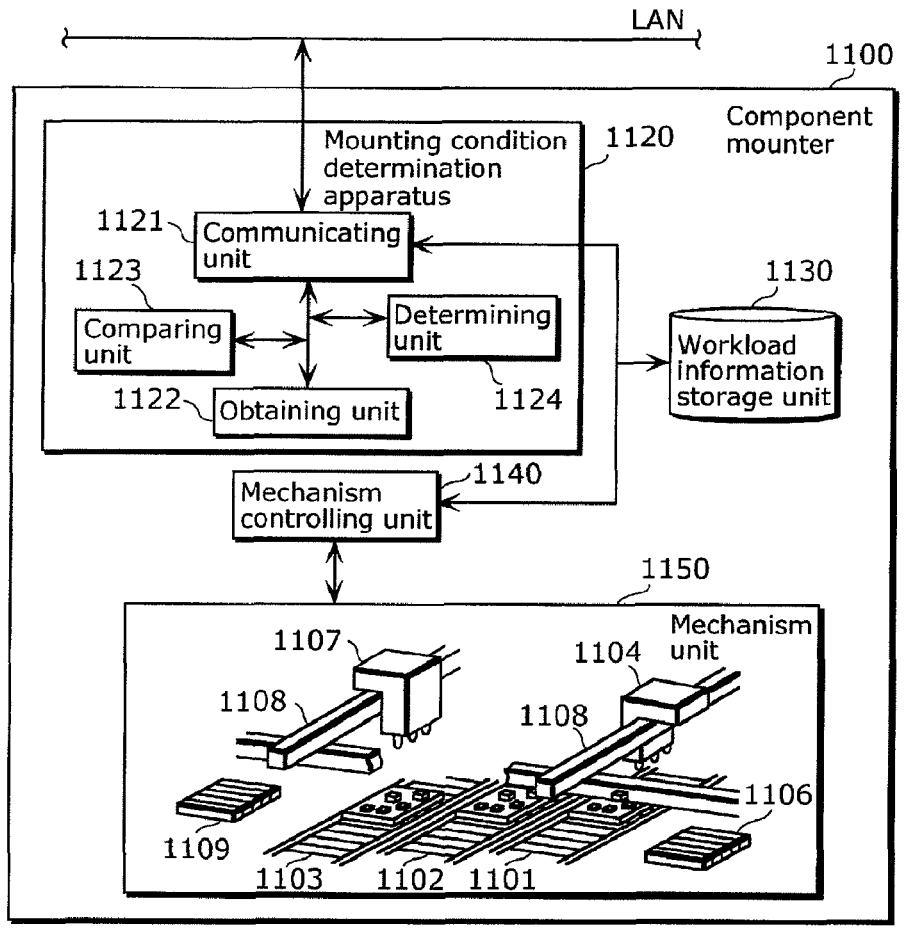
FIG. 25 is a functional block diagram illustrating a main configuration of the component mounter according to the third embodiment.
FIG. 26 illustrates an example of a data configuration of workload information according to the third embodiment.

FIG. 25 is a functional block diagram illustrating a main configuration of the component mounter 1100.

Each of the component mounters 1200 and 1300 has the same functional configuration as that of the component mounter 1100. Thus, the description is omitted herein.

As illustrated in FIG. 25, the component mounter 1100 includes a mounting condition determination apparatus 1120, a workload information storage unit 1130, and a mechanism controlling unit 1140 as well as a mechanism unit 1150 including the mounting head 1104.

The mounting condition determination apparatus 1120 determines a mounting condition of the component mounter 1100. In the third embodiment, the mounting condition determination apparatus 1120 determines the count of transporting conveyers to be allocated to each board type, as one of the mounting conditions.

The mounting condition determination apparatus 1120 includes a communicating unit 1121, an obtaining unit 1122, a comparing unit 1123, and a determining unit 1124 as illustrated in FIG. 25.

The communicating unit 1121 is a processing unit that exchanges information between the mounting condition determination apparatus 1120 and (i) other units included in the component mounter 1100 and (ii) other apparatuses such as the component mounter 1200.

The obtaining unit 1122 is a processing unit that obtains workload information indicating a workload necessary for mounting components per board type. The obtaining unit 1122 obtains the workload information stored in the workload information storage unit 1130 in the third embodiment. The workload information will be described later with reference to FIG. 26.

The comparing unit 1123 is a processing unit that compares workload information obtained by the obtaining unit 1122 between board types.

The determining unit 1124 is a processing unit that determines the count of transporting conveyers to be allocated to each board type, according to a result of the comparison by the comparing unit 1123.

More specifically, the determining unit 1124 determines the count of transporting conveyers to be allocated to each board type so that the higher workload necessary for mounting components on boards of a board type becomes, the larger count of transportation lanes may be allocated to the boards than other types of boards.

The determining unit 1124 further determines which board type of boards is transported through which transporting conveyer, in other words, determines combinations of each transporting conveyer and each board type.

A result of such determination is informed to, for example, a stocker (not illustrated) that charges stored boards of board types into the component mounter 1100 through the communicating unit 1121. The stocker charges boards of a corresponding one of the board types into each transporting conveyer of the component mounter 1100 according to the result.

The mechanism controlling unit 1140 is a control unit that controls the mechanism unit 1150. More specifically, the mechanism controlling unit 1140 controls the mechanism unit 1150 so that components are mounted appropriately on boards according to a board type transported through each transporting conveyer.

Processing in the communicating unit 1121, the obtaining unit 1122, the comparing unit 1123, and the determining unit 1124 included in the mounting condition determination apparatus 1120 of the third embodiment is carried out by a computer including, for example, a central processing unit (CPU), a memory device, and an interface that do input and output of information.

For example, the CPU obtains workload information through an interface. The CPU further compares a plurality of obtained workload information for each type of obtained boards, and determines the count of transporting conveyers to be allocated according to a result of the comparison. Such processing in the computer is implemented by causing the computer to execute the program according to the present invention.

FIG. 26 illustrates an example of a data configuration of workload information in the third embodiment.

As illustrated in FIG. 26, information indicating the count of mounting points on a board (the count of components to be mounted) and information indicating a production tact are stored in the workload information storage unit 1130 as workload information for each board type.

The production tact is information indicating the longest tact among the tacts of each of the component mounters 1100 to 1300 for each board type. In other words, the line tact for each board type is stored in the workload information storage unit 1130 as the production tact.

The line tact can be obtained through a simulation but may be obtained through measurement.

The reason why the information indicating the count of mounting points on a board is used as workload information is because there is almost a positive correlation between the count of mounting points and a workload necessary for mounting the count of the components on the board.

The count of mounting points per board type may be read from data which is generally used when mounting components on boards, and on which positions where the components are mounted and types of components are recorded.

The board type as one of data items of the workload information in FIG. 26 is information for identifying a board type. Furthermore, a board of a board type A(1) and a board of a board type A(2) are physically from one "board A" as in FIG. 27.

However, the board A is a double-sided board on both sides of which components of different types are mounted in different positions.

Thus, the board A is handled as the board type A(1) when a side of a board includes 760 mounting points each having a component mounted in the third embodiment. Furthermore, the board A is handled as the board type A(2) when a side of a board includes 1044 mounting points.

In other words, the board A is handled as a different type of a board depending on which side components are mounted, when mounting components on the board A. There are cases where a side having the smaller count of mounting points is assumed to be a front side of a board and a side having the larger count of mounting points is assumed to be a back side of a board, according to a result of comparison of the count of mounting points on both sides of the board.

The workload information including such information is referenced to when the mounting condition determination apparatus 1120 determines the count of transporting conveyers to be allocated to each board type.

Next, operations of the component mounter 1100 and the mounting condition determination apparatus 1120 will be described with reference to FIGS. 28A to 32.

First, the following describes production in a synchronous mode that is a basic production method (hereinafter referred to as synchronous production) and production in an asynchronous mode (hereinafter referred to as asynchronous production) of the component mounter 1100 with reference to FIGS. 28A and 28B.

Figure 28A:
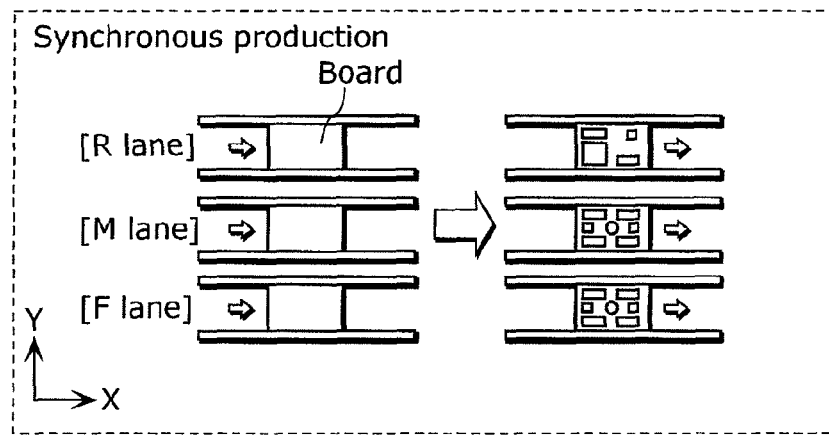
FIG. 28A illustrates an outline of the synchronous production according to the third embodiment.
Figure 28B:
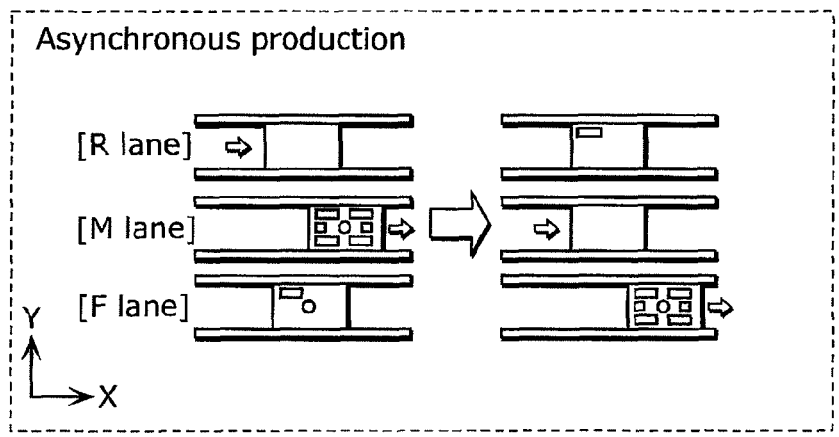
FIG. 28B illustrates an outline of the asynchronous production according to the third embodiment.

FIG. 28A illustrates an outline of the synchronous production. Furthermore, FIG. 28B illustrates an outline of the asynchronous production.

When the component mounter 1100 performs the synchronous production, as illustrated in FIG. 28A, boards are carried in each board placing region of the F, M, and R lanes simultaneously. Furthermore, when components have been mounted on each of the boards, the boards are carried out of the board placing regions. In other words, the 3 boards are handles as one board unit.

For example, when one board unit is composed of 3 types of boards, the intermediate inventory of boards can be reduced by performing the synchronous production of these 3 types of boards.

Furthermore, when the component mounter 1100 performs the asynchronous production, components are mounted in each lane independent from other lanes. Thus, each board is asynchronously carried in the board placing regions of the F, M, and R lanes as illustrated in FIG. 28B.

Furthermore, when components have been mounted on each of the boards, the boards are asynchronously carried out of the board placing regions.

Accordingly, in the case where components are mounted on boards in the asynchronous production, for example, during when components are mounted on the boards on the F lane, the boards on which components have been mounted can be carried out of the M and R lanes while components that have been yet mounted on the boards can be carried in the M and R lanes. In other words, a period of time consumed for transporting boards in the asynchronous production can be shorter than a period of time consumed for transporting boards in the synchronous production.

Furthermore, for example, even when operations on the F lane are suspended due to certain trouble, components can continue to be mounted on the boards using the M and R lanes. In other words, the asynchronous production is a production method having less influence of such trouble.

The component mounters 1100 to 1300 can perform the synchronous production and asynchronous production in the production line 1010 according to the third embodiment. In other words, the production line 1010 as a whole can perform the synchronous production and asynchronous production.

Furthermore, in both the synchronous production and asynchronous production, production efficiency can be improved by the mounting condition determination apparatus 1120 that determines the count of transporting conveyers to be allocated to each board type.

Figure 29:
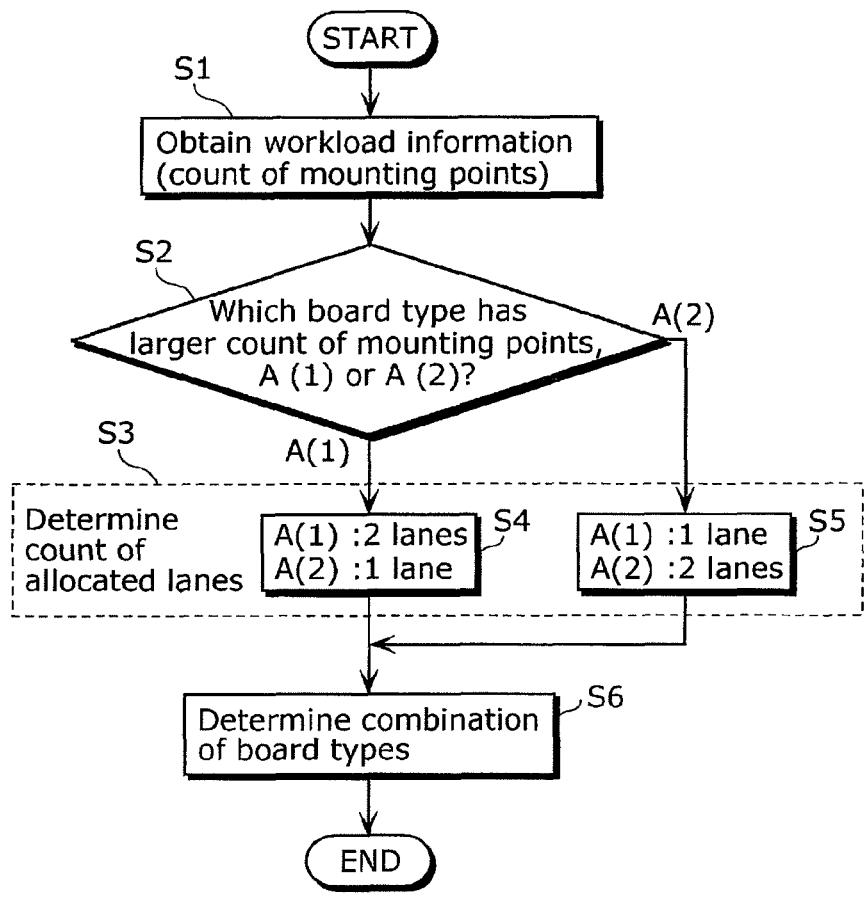
FIG. 29 is a flow chart showing the first example of the processing by the mounting condition determination apparatus according to the third embodiment.

FIG. 29 is a flow chart showing a first example of the processing by the mounting condition determination apparatus 1120 according to the third embodiment.

More specifically, FIG. 29 assumes a case where components are mounted on the board types A(1) and A(2) (refer to FIGS. 26 and 27) using the production line 1010. Furthermore, FIG. 29 shows a flow of the processing when the mounting condition determination apparatus 1120 determines the count of transporting conveyers to be allocated to each board type according to the count of mounting points.

Here, there is almost a positive correlation between the count of mounting points and a workload necessary for mounting the components on the board, regardless of whether production is performed in the synchronous mode or in the asynchronous mode.

Thus, the processing of allocating the count of transporting conveyers in FIG. 29 is applicable to both the synchronous production and asynchronous production, and contributes to improvement of production efficiency of mounting components on boards.

First, the obtaining unit 1122 of the mounting condition determination apparatus 1120 obtains workload information of the board types A(1) and A(2) from the workload information storage unit 1130 through the communicating unit 1121 (S1).

Thereby, the obtaining unit 1122 obtains information indicating the count of mounting points per board of the board types A(1) and A(2).

The comparing unit 1123 compares the count of mounting points on the board of the board type A(1) with the count of mounting points on the board of the board type A(2) to find out which has the larger count of mounting points (S2).

The determining unit 1124 determines the count of transporting conveyers to be allocated to each board type, according to a result of the comparison by the comparing unit 1123 (S3).

More specifically, when the result of the comparison by the comparing unit 1123 shows that the count of mounting points on the board type A(1) is larger than the count of mounting points on the board type A(2) (A(1) in S2), the determining unit 1124 determines to allocate 2 transporting conveyers to the board type A(1) and 1 transporting conveyer to the board type A(2) (S4).

Furthermore, when the result of the comparison by the comparing unit 1123 shows that the count of mounting points on the board type A(2) is larger than the count of mounting points on the board type A(1) (A(2) in S2), the determining unit 1124 determines to allocate 1 transporting conveyer to the board type A(1) and 2 transporting conveyers to the board type A(2) (S5).

As illustrated in FIG. 26, the count of mounting points of the board type A(1) is 760 and the count of mounting points of the board type A(2) is 1044 in the third embodiment. Accordingly, the determining unit 1124 determines to allocate 1 transporting conveyer to the board type A(1) and 2 transporting conveyers to the board type A(2).

Furthermore, the determining unit 1124 determines the combination of board types A(1) and A(2) to be allocated to each of the transporting conveyers (S6). In other words, the determining unit 1124 determines in which lane components are mounted on the boards of the board types A(1) and A(2).

More specifically, the determining unit 1124 determines a combination of the board types A(1) and A(2) to be allocated to each of the transporting conveyers according to the result of the allocated count of transporting conveyers so that a time period during when components are mounted on the boards of the board types A(1) and A(2) to be transported through the 3 transporting conveyers can be the shortest.

Here, "the time period during when components are mounted" may include the longest mounting time among mounting times for mounting components on boards to be carried in each transporting conveyer. In other words, the determining unit 1124 may maximize a throughput of the production line 1010 by determining the aforementioned combination so that the longest mounting time can be the shortest.

The following specifically describes a method for determining the combination of the board types to be allocated to each of the transporting conveyers by the determining unit 1124.

Figure 30A:
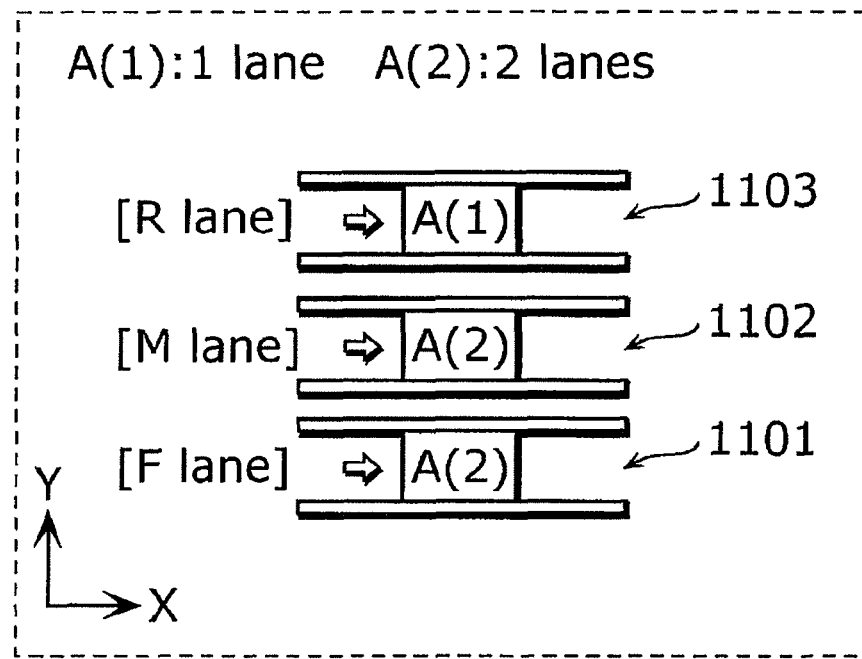
FIG. 30A illustrates an example of associating the boards with the transporting conveyers each having the allocated count determined by the mounting condition determination apparatus according to the third embodiment.
Figure 30B:
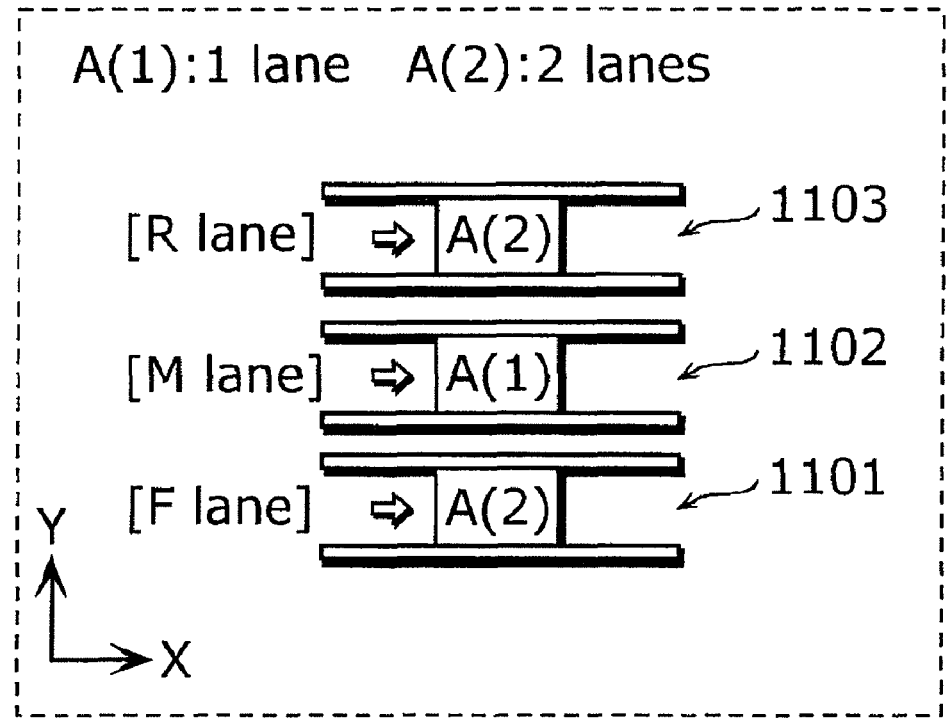
FIG. 30B illustrates an example of associating the boards with the transporting conveyers each having the allocated count determined by the mounting condition determination apparatus according to the third embodiment.
Figure 30C:
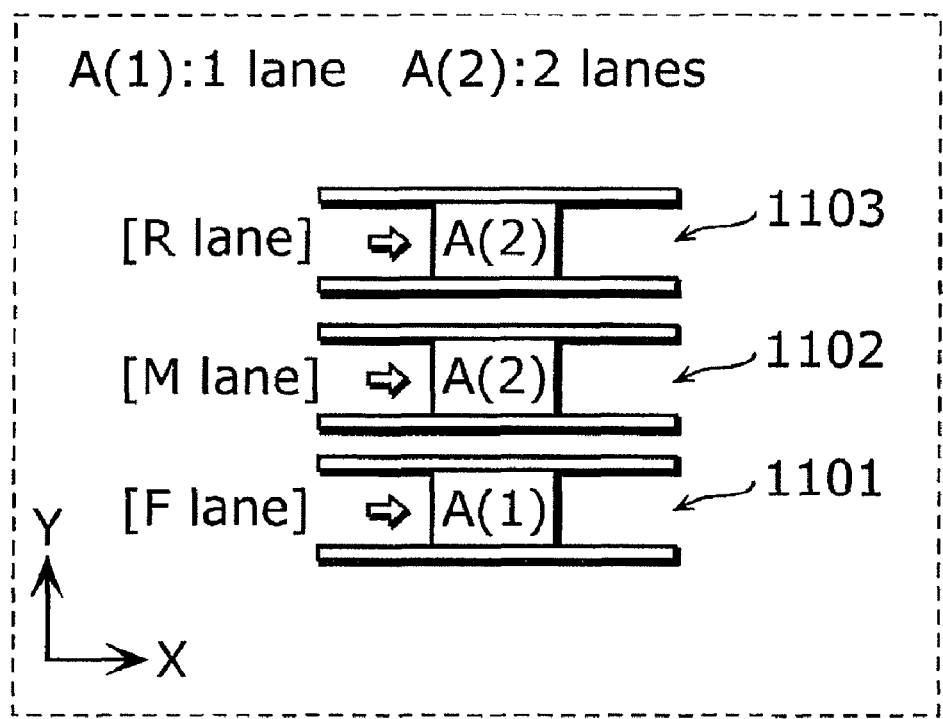
FIG. 30C illustrates an example of associating the boards with the transporting conveyers each having the allocated count determined by the mounting condition determination apparatus according to the third embodiment.

FIGS. 30A to 30C illustrate examples of associating the boards with the transporting conveyers each having the allocated count determined by the mounting condition determination apparatus 1120.

Since the determining unit 1124 determines to allocate 1 transporting conveyer to the board type A(1) and 2 transporting conveyers to the board type A(2), there are 3 possible combinations of the board types to be allocated to each of the transporting conveyers as illustrated in FIGS. 30A to 30C.

In FIG. 30A, the board type A(1) to which 1 is allocated as the lane count is associated with the third conveyer 1103. In other words, components are mounted on boards of the board type A(1) in the R lane. Furthermore, the board type A(2) to which 2 is allocated as the lane count is associated with the second conveyer 1102. In other words, components are mounted on boards of the board type A(2) in the F and M lanes.

As described above, each board is transported by the associated transporting conveyer as in FIG. 30A. Then, each board is transported up to the board placing region by the associated transporting conveyer, and component mounting is started.

Thus, FIG. 30A illustrates a case where a board of the board type A(1) is transported through the R lane, and boards of the board type A(2) are transported through the F and M lanes. Furthermore, FIG. 30B illustrates a case where a board of the board type A(1) is transported through the M lane, and boards of the board type A(2) are transported through the F and R lanes. Furthermore, FIG. 30C illustrates a case where a board of the board type A(1) is transported through the F lane, and boards of the board type A(2) are transported through the M and R lanes.

Therefore, the determining unit 1124 determines the combination of the board types A(1) and A(2) to be allocated to each of the transporting conveyers from among the 3 combinations so that a mounting time during when components are mounted on the boards of the board types A(1) and A(2) to be transported by the 3 transporting conveyers can be the shortest.

More specifically, the determining unit 1124 calculates a time for mounting components, for each of the 3 combinations. Then, the determining unit 1124 selects a combination in which the calculated mounting time is the shortest, and determines the selected combination as the combination of the board type to be allocated to each of the transporting conveyer. For example, when components to be mounted on the boards of the board type A(1) are set to the component supply unit at the R lane side and components to be mounted on the boards of the board type A(2) are set to the component supply unit at the F lane side, the combination illustrated in FIG. 30A is selected.

Furthermore, the determining unit 1124 may determine the combination of the board types to be allocated to each of the transporting conveyers according to the result of the allocated count of transporting conveyers so that the total distance moved by the mounting head that mounts components on the boards of the board types A(1) and A(2) that are transported by the 3 transporting conveyers can be the shortest.

In this case, the determining unit 1124 calculates the total moving distance for each of the 3 combinations in FIGS. 30A to 30C. Then, the determining unit 1124 selects a combination in which the calculated total moving distance is the shortest, and determines the selected combination as the combination of the board type to be allocated to each of the transporting conveyers. Also in this case, when components to be mounted on the boards of the board type A(1) are set to the component supply unit at the R lane side and components to be mounted on the boards of the board type A(2) are set to the component supply unit at the F lane side, the combination illustrated in FIG. 30A is selected.

Here, the determining unit 1124 may optionally determine the combination of the board type to be allocated to each of the transporting conveyers, regardless of the aforementioned method for determining the combination.

Furthermore, the mounting condition determination apparatus 1120 can determine the count of the transporting conveyers to be allocated, according to the production tact included in the workload information.

Figure 31:
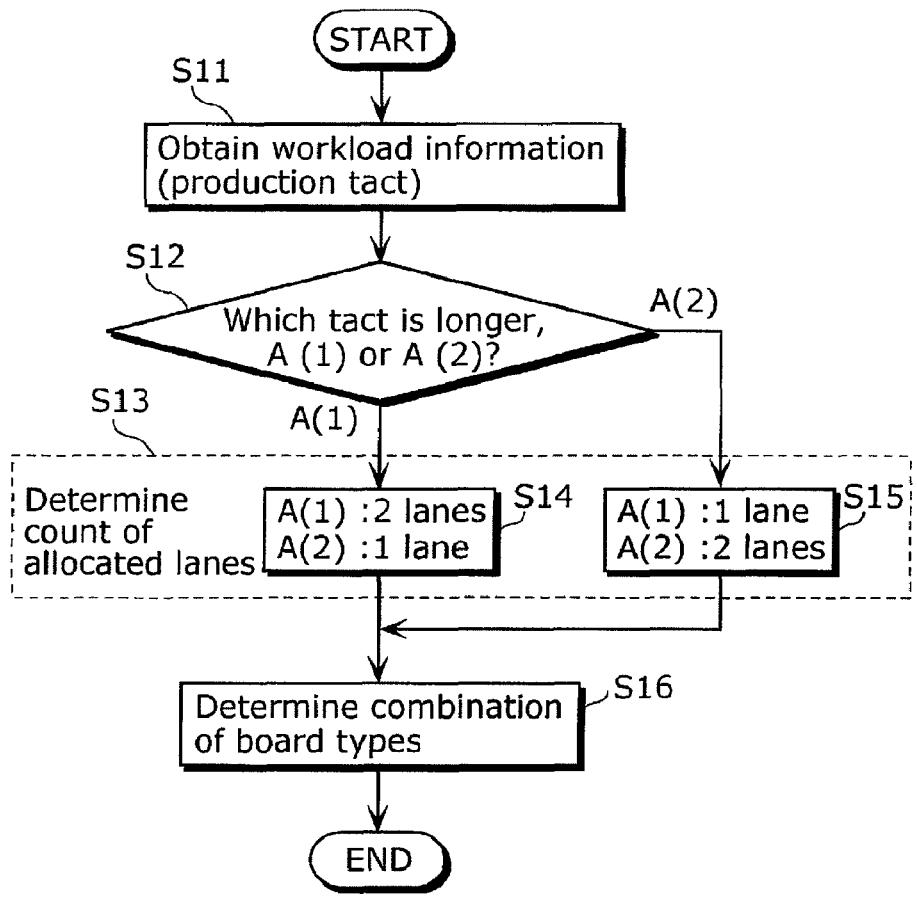
FIG. 31 is a flow chart showing the second example of the processing by the mounting condition determination apparatus according to the third embodiment.

FIG. 31 is a flow chart showing a second example of processing by the mounting condition determination apparatus 1120 according to the third embodiment.

More specifically, FIG. 31 shows the processing when the mounting condition determination apparatus 1120 determines the count of the transporting conveyers to be allocated, according to the production tact included in the workload information.

Furthermore, FIG. 31 assumes a case where components are mounted on the board types A(1) and A(2) using the production line 1010 as in FIG. 29.

Since the timing of carrying boards in and out of a lane depends on the timing of carrying boards in and out of other lanes in the case of the synchronous production, the production tact calculated for each board is of no use. Thus, the processing in FIG. 31 is only applied when the asynchronous production is performed in the production line 1010.

First, the obtaining unit 1122 of the mounting condition determination apparatus 1120 obtains workload information of the board types A(1) and A(2) from the workload information storage unit 1130 through the communicating unit 1121 (S11).

Thereby, the obtaining unit 1122 obtains information indicating the production tact per board of the board types A(1) and A(2).

The obtaining unit 1122 may obtain production tact for each board type, not from the workload information storage unit 1130 in which the production tact is stored in advance but through a simulation at the time of obtaining the production tact.

Furthermore, the simulation does not have to be performed by the mounting condition determination apparatus 1120. For example, the mounting condition determination apparatus 1120 may cause the component mounter 1100 or other external devices to perform the simulation so that the obtaining unit 1122 may obtain information indicating a production tact for each board type.

The comparing unit 1123 compares the production tact of the board type A(1) with the production tact of the board type A(2) that are obtained from the obtaining unit 1122 (S12).

The determining unit 1124 determines the count of transporting conveyers to be allocated to each board type, according to a result of the comparison by the comparing unit 1123 (S13).

More specifically, when the result of the comparison by the comparing unit 1123 shows that the production tact of the board type A(1) is longer than the production tact of the board type A(2) (A(1) in S12), the determining unit 1124 determines to allocate 2 transporting conveyers to the board type A(1) and 1 transporting conveyer to the board type A(2) (S14).

Furthermore, when the result of the comparison by the comparing unit 1123 shows that the production tact of the board type A(2) is longer than the production tact of the board type A(1) (A(2) in S12), the determining unit 1124 determines to allocate 1 transporting conveyer to the board type A(1) and 2 transporting conveyers to the board type A(2) (S15).

As illustrated in FIG. 26, the production tact of the board type A(1) is 28.1 seconds and the production tact of the board type A(2) is 32.5 seconds in the third embodiment. Accordingly, the determining unit 1124 determines to allocate 1 transporting conveyer to the board type A(1) and 2 transporting conveyers to the board type A(2).

Furthermore, the determining unit 1124 determines the combination of board types A(1) and A(2) to be allocated to each of the transporting conveyers (S16). In other words, the determining unit 1124 determines in which lane components are mounted on the boards of the board types A(1) and A(2).

Since the processing of determining the combination of the board types by the determining unit 1124 (S16) is the same as the processing of determining the board types by the determining unit 1124 in FIG. 29 (S6 in FIG. 29), the detailed description is omitted. For example, the determining unit 1124 associates the board type A(1) with the third conveyer 1103, and the board type A(2) with the first conveyer 1101 and the second conveyer 1102.

When such combination is determined, each board is transported by the associated transporting conveyer as in FIG. 30A and components are mounted on each of the boards.

In any case in FIGS. 29 and 31, the mounting condition determination apparatus 1120 notifies the component mounters 1200 and 1300 of the details of the determination through the communicating unit 1121 after the determining unit 1124 determines the association between the board types and transporting conveyers.

The component mounters 1200 and 1300 transport the boards of the board types A(1) and A(2) using the associated ones of the transporting conveyers and mounts components on the boards, according to the details determined by the mounting condition determination apparatus 1120.

As describe above, the mounting condition determination apparatus 1120 compares a board with other types of boards when components are mounted on boards of board types, and allocates the larger count of transporting conveyers to the boards having the larger count of mounting points or the longer production tact, in other words, the boards having a higher workload necessary for mounting components than other boards. Thereby, the production efficiency of mounting components on boards can be improved.

For example, since the board A is a double-sided board, the board A completes the component mounting by mounting components on both sides of the board A. In other words, component mounting on 500 boards A is completed by mounting components on front sides of the 500 boards A of the board type A(1) and on back sides of 500 boards A of the board type A(2).

Thus, in the case of producing boards based on the board A, as a difference between the count of boards of the board type A(1) and the count of boards of the board type A(2) on each of which components have been mounted per unit time is larger, an increasing rate of the count of boards having only one of the sides components being mounted as the intermediate inventory (incremented count of boards per unit time) becomes higher.

Assume a case where the asynchronous production is performed using the board type A. In this case, the mounting condition determination apparatus 1120 allocates 2 transporting conveyers to the board type A(2) having the workload higher than the workload of the board type A(1), and allocates 1 transporting conveyer to the board type A(1) from among the 3 transporting conveyers of the component mounter 1100.

Thereby, components are mounted on the boards of the board type A(2) using 2 lanes and components are mounted on the boards of the board type A(1) using 1 lane, out of the 3 lanes in the production line 1010.

Compared to a case, for example, where 1 transporting conveyer is allocated to the boards of the board type A(2) and 2 transporting conveyers are allocated to the boards of the board type A(1), a difference between the count of boards of the board type A(1) and the count of boards of the board type A(2) each on which components have been mounted per unit time can be reduced in the aforementioned case where allocating 2 transporting conveyers to the board type A(2) and 1 transporting conveyer to the board type A(1).

In other words, production efficiency of component mounting based on the board A can be improved with the increasing intermediate inventory rate being reduced.

Furthermore, the production efficiency can be improved using the mounting condition determination apparatus 1120 in the third embodiment.

For example, assume a case where components are mounted on a board B and a board C (refer to FIG. 26) in the production line 1010. Furthermore, assume a case where the determining unit 1124 determines the count of transporting conveyers according to the count of mounting points on the board B and board C.

In this case, the count of mounting points on the board B is 1208 and the count of mounting points on the board C is 920. Thus, the determining unit 1124 determines to allocate 2 transporting conveyers to the board B having the larger count of mounting points and 1 transporting conveyer to the board C.

Figure 32:
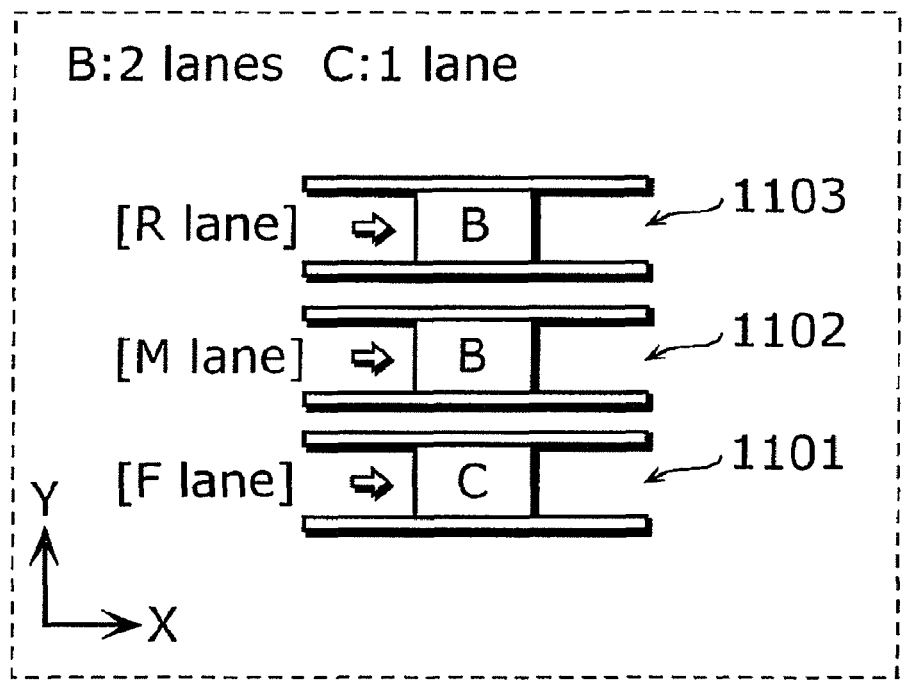
FIG. 32 illustrates another example of associating the boards with the transporting conveyers each having the allocated count determined by the mounting condition determination apparatus according to the third embodiment.

According to this determination, components are mounted on the board C in the F lane and on the boards B in the M and R lanes in the production line 1010 as illustrated in FIG. 32.

In this case, the total workload for mounting components on these 3 boards per unit period of time in the synchronous production from carrying-in, component mounting, to carrying-out of the 3 boards amounts to 3336 (1208×2+920).

On the other hand, assume a case, for example, where 1 transporting conveyer is allocated to the board B and 2 transporting conveyers are allocated to the board C, without performing the aforementioned determination. In other words, assume a case where components are mounted on the board B using 1 lane and components are mounted on the boards C using 2 lanes.

In this case, the total workload for mounting components on these 3 boards per unit period of time in the synchronous production amounts to 3048 (1208+920×2).

Thus, the count of boards on which components are mounted in the synchronous production per unit period of time becomes larger when component mounting is performed according to the determination by the mounting condition determination apparatus 1120.

Here, "unit period of time" in the synchronous production is a period of time from simultaneously charging boards into all of the transporting conveyers and mounting components on the boards by the transporting conveyers in parallel to completing the component mounting on all of the boards simultaneously charged.

Furthermore, components are mounted for the unit period of time with full use of the advantages of parallel mounting of components on boards, such as reduction of a period of time consumed for transporting boards.

In other words, according to the determination of the mounting condition determination apparatus 1120, the larger amount of work can be performed with full use of the advantages.

In other words, production efficiency can be improved by transporting boards of boards types by transporting conveyers to be allocated to each board type, according to the determination of the mounting condition determination apparatus 1120 even in the synchronous production.

Furthermore, since the associations between the board types and the transporting conveyers determined by the mounting condition determination apparatus 1120, in other words, the associations shown in FIGS. 30A to 30C and 32 are only examples, other associations may be used instead.

For example, the mounting condition determination apparatus 1120 may associate the board type A(1) with the second conveyer 1102 and the board type A(2) with the first conveyer 1101 and the third conveyer 1103 when the determining unit 1124 determines to allocate 1 transporting conveyer to the board type A(1) and 2 transporting conveyers to the board type A(2).

Furthermore, the association may be determined according to an instruction from other devices or a manager of the production line 1010.

In other words, as long as the combination of the board types and the count of transporting conveyers to be allocated that are determined by the mounting condition determination apparatus 1120 is maintained, other associations may be used. Furthermore, the associations may be determined according to a instruction from other devices.

Furthermore, the count of transporting conveyers included in the component mounter 1100 is 3 and the count of board type of boards on which components are mounted in parallel is 2 in the third embodiment.

However, the count of transporting conveyers included in the component mounter 1100 may be 4 or more and the count of board type of boards on which components are mounted in parallel may be 3 or more in the third embodiment.

In the following assumption, each of the component mounters 1200 and 1300 has the same count of transporting conveyers as that of the component mounter 1100.

For example, assume a case where the component mounter 1100 includes 4 transporting conveyers and components are mounted on the board types A(1) and A(2) using the 4 transporting conveyers.

In this case, for example, the determining unit 1124 determines to allocate 3 transporting conveyers to the board type A(2) and 1 transporting conveyer to the board type A(1) because the relationship between the mounting points on the boards of the board type A(2) and the mounting points on the boards of the board type A(1) is defined as the board type A(2)>the board type A(1).

Furthermore, assume a case, for example, where the component mounter 1100 includes 4 transporting conveyers and components are mounted in parallel on 3 types of the boards, the board types A(1), A(2), and B using the 4 transporting conveyers.

In this case, for example, the determining unit 1124 determines to allocate 2 transporting conveyers to the board type B and 1 transporting conveyer to the board types A(1) and A(2) because the count of the mounting points on the boards of the board type B is larger than the count of the mounting points on the boards of the board types A(1) and A(2).

In other words, as long as there is a difference between the counts of transporting conveyers to be allocated to each board type, the combination of board types of boards on which components are mounted in parallel and the transporting conveyers included in one component mounter may be any combination.

More specifically, assuming that the count of board types is N where N is an integer equal to or larger than 2, the count of transporting conveyers has only to be equal to or larger than (N+1).

For example, when the count of board types is N and the count of transporting conveyers is (N+1), the determining unit 1124 determines to allocate 2 transporting conveyers to a board type having the highest workload, and 1 transporting conveyer to other board types.

Thus, production efficiency can be improved by allocating the transporting conveyers in such a manner.

Furthermore, the determining unit 1124 determines the count of transporting conveyers allocated to the boards in proportion to an amount of the necessary workload on the boards.

For example, assume a case where the component mounter 1100 includes 5 transporting conveyers and components are mounted in parallel on the board types B and C using the 5 transporting conveyers. In this case, since the count of transporting conveyers is 5, the combination of the transporting conveyers can be 4 and 1, or 3 and 2.

Furthermore, the ratio between the count of mounting points on the board B to the count of mounting points on the board C is 1208:920 that is closer to 3:1 than to 4:1. Thus, 3 transporting conveyers are allocated to the board B and 2 transporting conveyers are allocated to the board C.

Accordingly, for example, a difference between the counts of boards to be produced in the asynchronous production per unit time for each board type can be reduced by allocating the transporting conveyers in a ratio closer to a ratio of the workload for each board type.

Furthermore, each of the component mounters 1200 and 1300 has the same functional configuration as that of the component mounter 1100 in the third embodiment. In other words, each of the component mounters 1200 and 1300 includes the mounting condition determination apparatus 1120.

However, at least one of the component mourners 1100 to 1300 has only to include the mounting condition determination apparatus 1120.

Furthermore, the mounting condition determination apparatus 1120 may be independent from the component mounters 1100 to 1300. In this case, each of the component mounters 1100 to 1300 has only to exchange information with the mounting condition determination apparatus 1120 via, for example, a LAN.

Furthermore, the count of mounting points and the production tact per board are used as workload information indicating a workload necessary for mounting components in the third embodiment.

However, other information may be used as the workload information. For example, there are cases where it takes a long time to mount components on boards depending on the size or the type of the components. Thus, the size or the type of the components to be mounted on boards are stored in the workload information storage unit 1130 as workload information. Furthermore, the comparing unit 1123 collects and compares information such as the size or the type of the components. Furthermore, the determining unit 1124 determines to allocate the larger count of transporting conveyers to boards that are likely to take a longer time to mount components thereon.

As described above, as long as the workload information indicates a workload necessary for mounting components, the workload information may be any information other than a count of mounting points and a production tact.

Furthermore, the count of transporting conveyers to be allocated may be determined by combining different types of workload information.

For example, in the case of the asynchronous production, when boards of two different board types have the same count of mounting points, the comparing unit 1123 compares the production tacts of the boards. As a result of the comparison, the determining unit 1124 allocates the larger count of transporting conveyers to the boards having the longer production tact.

In such a manner, the production efficiency of mounting components on 2 different types of boards can be improved.

As described above, a line tact ratio among the transportation lanes can approximate a ratio in which the throughput of the whole production line can be maximized by determining the count of transportation lanes to be allocated to each board type, and thus the throughput of the whole production line can be improved.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a method for determining a mounting condition for use in a production line including component mounters which are aligned parallel to each other and each of which includes transportation lanes through which boards are transported, and in particular is applicable to a method for determining a mounting condition that can improve the throughput of the whole production line to be maximized.

The invention claimed is:

1. A method for determining a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, said method comprising determining the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board, wherein said determining the mounting condition includes determining a configuration of the component mounter that intends to mount the components on the boards so that the line tact ratio approximates the predetermined ratio, and wherein said determining the configuration includes determining a count of component mounters including the component mounter for each of the transportation lanes so that the line tact ratio approximates the predetermined ratio.

2. The method for determining a mounting condition according to claim 1, further comprising obtaining a target tact for each of the transportation lanes, the target tact being a target value of each of the line tacts of the transportation lanes and being determined according to the predetermined ratio, wherein said determining the count of the component mounters includes determining for each of the transportation lanes the count of the component mounters so that each of the line tacts approximates a corresponding one of the target tacts obtained in said obtaining the target tact.

3. The method for determining a mounting condition according to claim 2, wherein said determining the count of the component mounters further includes determining the count of the component mounters for each of the transportation lanes by adding 1 to a predetermined initial count of the component mounters or subtracting 1 from the predetermined initial count of the component mounters.

4. The method for determining a mounting condition according to claim 2, further comprising:

calculating each of the line tacts according to the count of the component mounters determined in said determining the count of the component mounters; and determining a count of suction nozzles included in a mounting head of the component mounter by incrementing or decrementing a predetermined initial count of the suction nozzles so that each of the line tacts calculated in said calculating each of the line tacts approximates a corresponding one of the target tacts obtained in said obtaining the target tact.

5. A method for determining a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, said method comprising determining the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board, wherein the production line includes component mounters including the component mounter, wherein said determining the mounting condition includes determining a configuration of the component mounters that intend to mount the components on the boards so that each line tact ratio among transportation lanes included in each of the component mounters approximates the predetermined ratio, the transportation lanes being connected through the component mounters so as to transport an identical type of boards, wherein said method further comprises:

determining allocation of components to be mounted by each of the component mounters, for each of the transportation lanes under the configuration that is determined in said determining the configuration so that a mounting time of each of the component mounters approximates an identical value in each of the transportation lanes; and obtaining a target tact for each of the transportation lanes, the target tact being a target value of each of the line tacts of the transportation lanes and being determined according to the predetermined ratio, wherein said determining the mounting condition further includes determining a count of the component mounters for each of the transportation lanes so that each of the line tacts approximates a corresponding one of first target tacts that are the target tacts initially obtained in said obtaining the target tact, and said determining the allocation of the components includes:

calculating a mounting time necessary for mounting the predetermined components per board by each of the component mounters for each of the transportation lanes, the component mounters having the count determined in said determining the count and including a first component mounter and a second component mounter;

judging whether or not a difference between the calculated mounting time of the first component mounter and the calculated mounting time of the second component mounter is equal to or larger than a first threshold for each of the transportation lanes, each of the mounting times being calculated in said calculating the mounting time, and the calculated mounting time of the first component mounter being larger than the calculated mounting time of the second component mounter; and reallocating a part of the predetermined components from the first component mounter to the second component mounter for each of the transportation lanes as a condition for calculating each of the mounting times when the difference is judged to be equal to or larger than the first threshold in said judging.

6. The method for determining a mounting condition according to claim 5, wherein said obtaining the target tact includes:

calculating, for each of the transportation lanes, a changed line tact calculated when the part of the components are reallocated in said reallocating; and calculating a second target tact for each of the transportation lanes by: (i) setting one of the second target tacts of one of the transportation lanes having the changed line tacts, to a value of a corresponding one of the changed line tacts; and (ii) setting a ratio among the second target tacts to a ratio among the first target tacts, and said determining the mounting condition further includes:

judging whether or not the changed line tact is equal to or shorter than the second target tact for each of the transportation lanes; and re-determining, for each of the transportation lanes, a count of the component mounters to be changed from the count of the component mounters determined in said determining the count so that each of the line tacts is equal to or shorter than a corresponding one of the second target tacts, when each of the line tacts is judged not to be equal to or shorter than the corresponding one of the second target tacts in said judging.

7. A method for determining a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, said method comprising determining the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board, wherein the transportation lanes are equal to or larger than 3 in each of the component mounters, and said determining the mounting condition includes:

obtaining workload information per board type, the workload information indicating a workload necessary for mounting the components on the boards;

comparing the workload information between the board types, the workload information being obtained in said obtaining the workload information; and determining a count of the transportation lanes to be allocated to each board type according to a result of the comparison in said comparing the workload information so that a larger count of the transportation lanes can be allocated to a board type having a higher workload.

8. The method for determining a mounting condition according to claim 7, wherein the workload information includes information indicating a count of mounting points that is a count of the components to be mounted per board, for each of the board types, said comparing includes comparing the count of mounting points per board between the board types, and said determining the count of the transportation lanes includes determining the count of the transportation lanes to be allocated to each of the board types according to a result of the comparison in said comparing the count of mounting points so that the larger count of the transportation lanes can be allocated to a board type having a larger count of the mounting points that corresponds to the higher workload.

9. The method for determining a mounting condition according to claim 7, wherein the workload information includes information indicating a production tact that is a mounting time necessary for mounting the predetermined components per board, for each of the board types, said comparing includes comparing the production tact between the board types, and said determining the count of the transportation lanes includes determining the count of the transportation lanes to be allocated to each of the board types according to a result of the comparison in said comparing the production tact so that a larger count of the transportation lanes can be allocated to a board type having a longer production tact that corresponds to the higher workload.

10. The method for determining a mounting condition according to claim 7, further comprising determining a combination of board types to be allocated to each of the transportation lanes according to the count of the transportation lanes to be allocated so that: (i) a mounting time necessary for mounting the components on boards of board types each transported through the equal to or larger than 3 transportation lanes; or (ii) a total distance traveled by a mounting head that mounts the components on the boards of board types can be the shortest, the transportation lanes having the count determined in said determining the count.

11. A mounting condition determination apparatus that determines a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, said apparatus comprising:

a processor; and a lane-to-lane balance unit configured to determine the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board, wherein said lane-to-lane balance unit is configured to (i) determine a configuration of the component mounter that intends to mount the components on the boards so that the line tact ratio approximates the predetermined ratio, and (ii) determine a count of component mounters including the component mounter for each of the transportation lanes so that the line tact ratio approximates the predetermined ratio.

12. A component mounter that transports boards of different types through transportation lanes and mounts components on the boards in a production line, the transportation lanes associating with the boards, the production line including the component mounter including the transportation lanes aligned parallel to each other, said component mounter comprising:

said mounting condition determination apparatus according to claim 11, said mounting condition determination apparatus configured to determine a condition under which said component mounter mounts the components; and a component mounting unit that mounts the components under the condition determined by said mounting condition determination apparatus.

13. A non-transitory computer-readable recording medium having a program stored thereon which, when loaded into a computer, allows the computer to execute a method for determining a mounting condition of a component mounter for use in a production line, the component mounter: (i) transporting boards of different types through transportation lanes; and (ii) mounting components on the boards, the transportation lanes associating with the boards, and the production line including the component mounter including the transportation lanes aligned parallel to each other, the method including determining the mounting condition so that a line tact ratio being a ratio among line tacts of the transportation lanes approximates a predetermined ratio, each of the line tacts being a longest mounting time in each of the transportation lanes, and the mounting time indicating a period of time for mounting predetermined components per board, wherein said determining the mounting condition includes determining a configuration of the component mounter that intends to mount the components on the boards so that the line tact ratio approximates the predetermined ratio, and wherein said determining the configuration includes determining a count of component mounters including the component mounter for each of the transportation lanes so that the line tact ratio approximates the predetermined ratio.

* * * * *